United States Patent [19]
Matsudai et al.

[11] Patent Number: 5,796,125
[45] Date of Patent: Aug. 18, 1998

[54] HIGH BREAKDOWN VOLTAGE SEMICONDUCTOR DEVICE USING TRENCH GROOVES

[75] Inventors: Tomoko Matsudai; Mitsuhiko Kitagawa, both of Tokyo; Akio Nakagawa, Hiratsuka, all of Japan

[73] Assignee: Kabushiki Kaisha Toshiba, Kawasaki, Japan

[21] Appl. No.: 528,570

[22] Filed: Sep. 15, 1995

[30] Foreign Application Priority Data

Sep. 16, 1994 [JP] Japan .................. 6-221438
Sep. 30, 1994 [JP] Japan .................. 6-238108
Jun. 30, 1995 [JP] Japan .................. 7-165212

[51] Int. Cl.$^6$ .............. H01L 29/74; H01L 31/111; H01L 29/76; H01L 29/94
[52] U.S. Cl. .............. 257/141; 257/162; 257/343; 257/331
[58] Field of Search .............. 257/132, 133, 257/139, 140, 141, 147, 162, 342, 343, 347, 329, 330, 331, 332

[56] References Cited

U.S. PATENT DOCUMENTS

| | | | |
|---|---|---|---|
| 4,960,723 | 10/1990 | Davies | 257/329 |
| 5,034,785 | 7/1991 | Blanchard | 257/331 |
| 5,434,435 | 7/1995 | Baliga | 257/332 |
| 5,448,083 | 9/1995 | Kitagawa et al. | 257/139 |
| 5,554,872 | 9/1996 | Baba et al. | 257/343 |
| 5,557,125 | 9/1996 | Shibib | 257/329 |

FOREIGN PATENT DOCUMENTS

| | | | |
|---|---|---|---|
| 0 526 939 | 2/1993 | European Pat. Off. | 257/343 |
| 0 557 253 | 8/1993 | European Pat. Off. | 257/343 |
| 2 272 572 | 5/1994 | United Kingdom | 257/378 |

OTHER PUBLICATIONS

Proceedings of 1995 International Symposium on Power Semiconductor Devices and ICs, pp. 141–145, Tomoko Matsudai, et al., "A Trench–Gate Injection Enhanced Lateral IEGT on Soi".

Proceedings of the 5$^{th}$ International Symposium on Power Semiconductor Devices and Ics, pp. 240–245, P.V. Gilbert, et al., "A Fully Integrable Insulated Gate Bipolar Transistor with a Trench Gate Structure".

Improved Latch–Up Characteristics of the Ligbt with the P+ Cathode Well on the SOI Substrate, Byeong Hoon Lee, et al., International Conference on Solid State Devices and Materials, Yokohama, Aug. 1994, pp. 289–291.

A Trench–Gate Ligbt Structure and Two LMCT Structures in SOI Substrates, D.R. Disney, et al., International Symposium on Power Semiconductor Devices & IC's, Switzerland, May 31—Jun. 2, 1994, pp. 405–410.

*Primary Examiner*—Steven H. Loke
*Attorney, Agent, or Firm*—Oblon, Spivak, McClelland, Maier & Neustadt, P.C.

[57] ABSTRACT

A high breakdown voltage semiconductor device. The device includes a semiconductor substrate, an insulating film formed on the semiconductor substrate, an active region formed on the insulating film, drain and base regions formed in a surface portion of the active region, and a source region formed in a surface portion of the base region. First and second gate insulating films are formed on inner surfaces of first and second grooves penetrating the base region so as to come in contact with the source region and reaching the active region, with first and second electrodes being buried in the first and second grooves. Two or more channel regions are formed in a MOS structure constructed by the gate insulating film, the gate electrode, the source region, the base region and the active region.

25 Claims, 40 Drawing Sheets

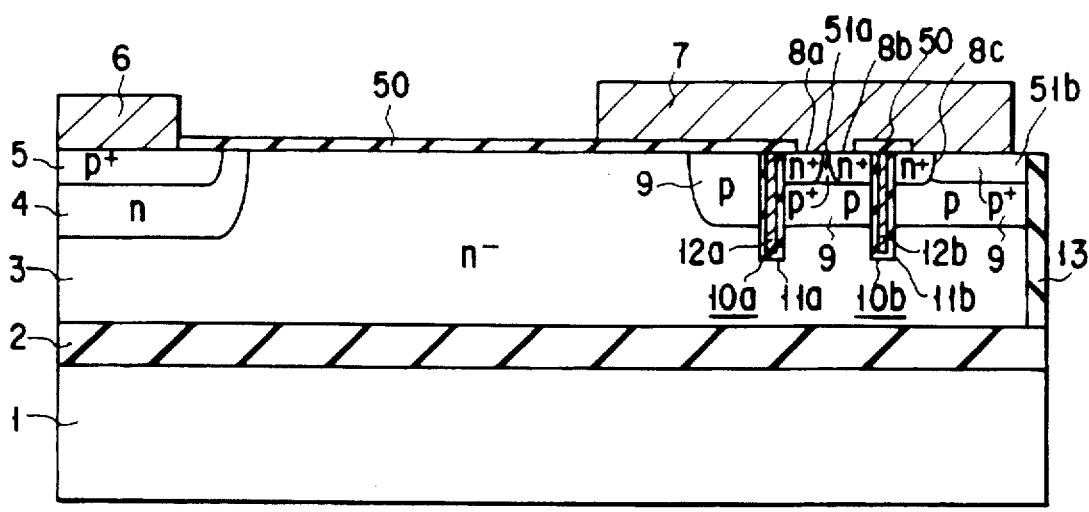
F I G. 4
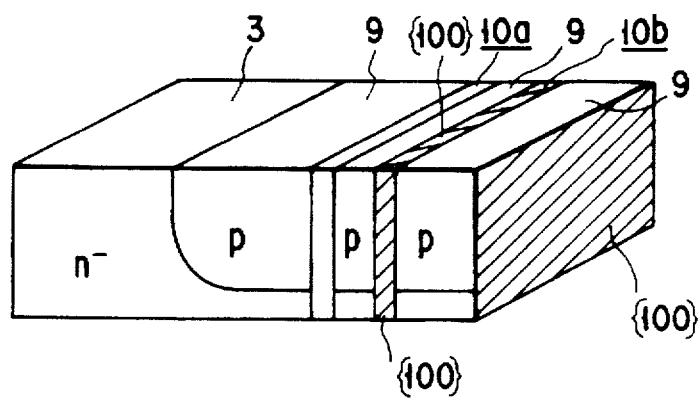
F I G. 5A
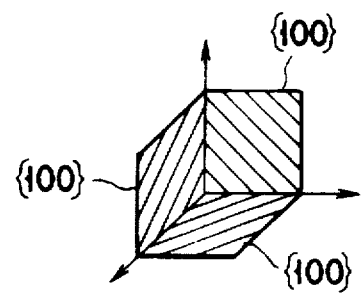
F I G. 5B

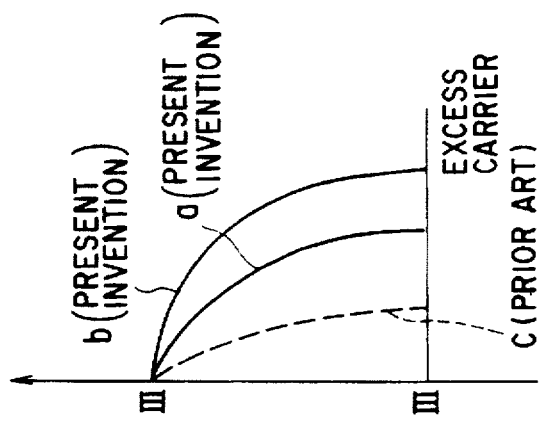
FIG. 7B
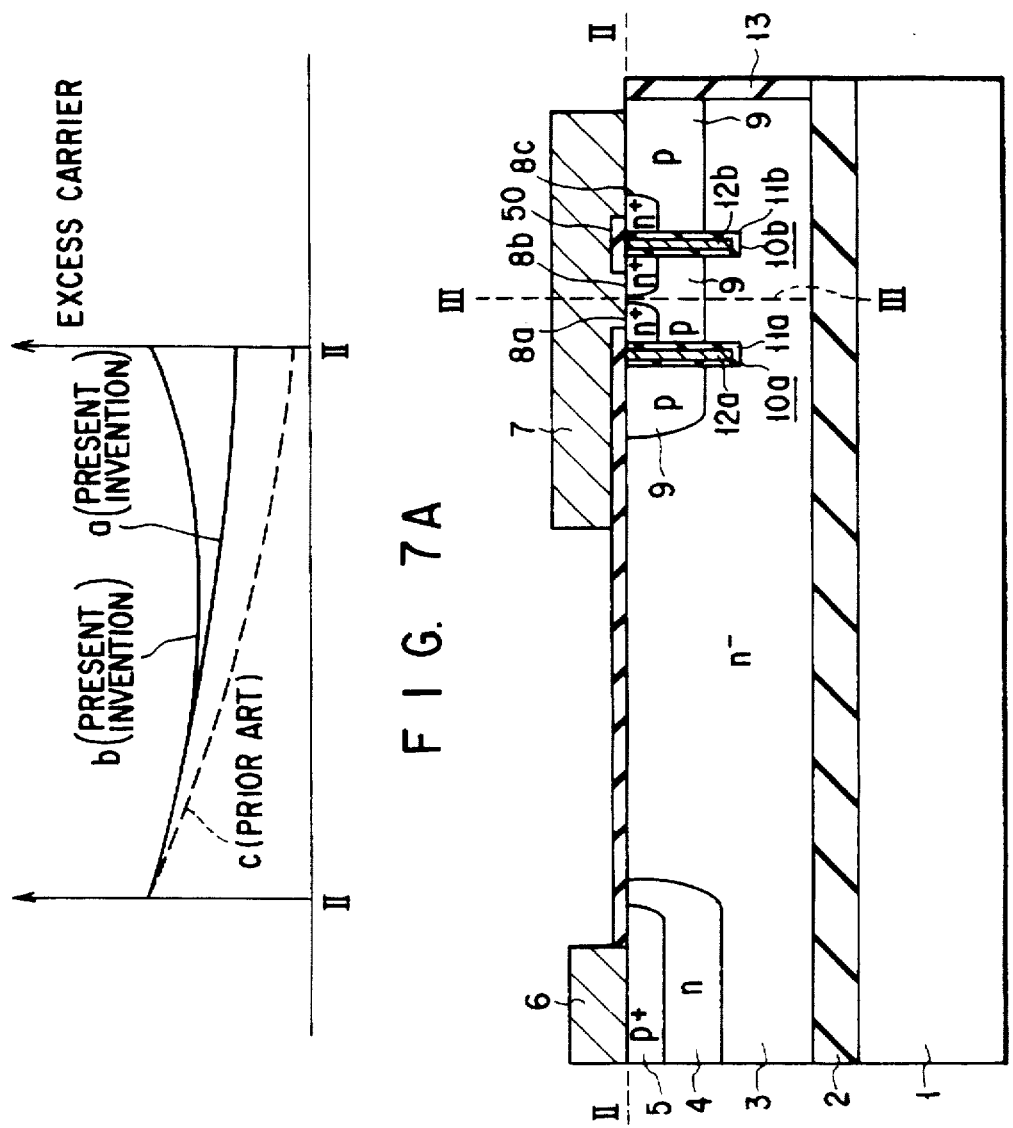
FIG. 7A
FIG. 7C

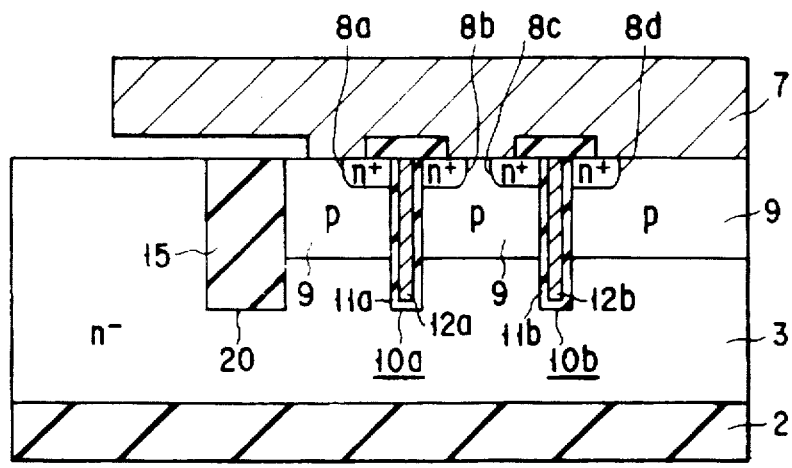
F I G. 21
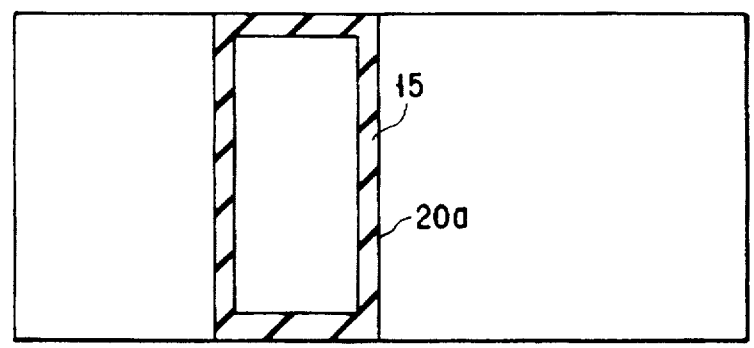
F I G. 22
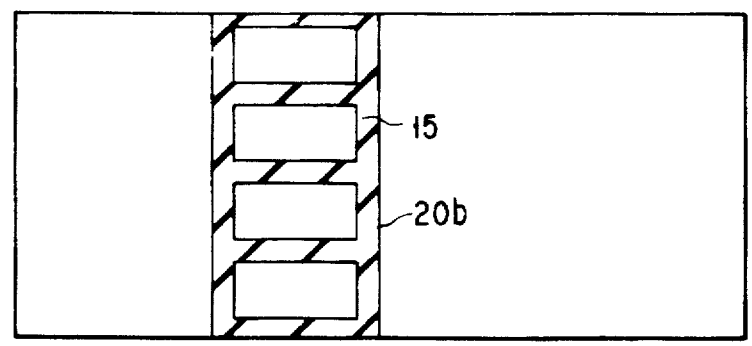
F I G. 23
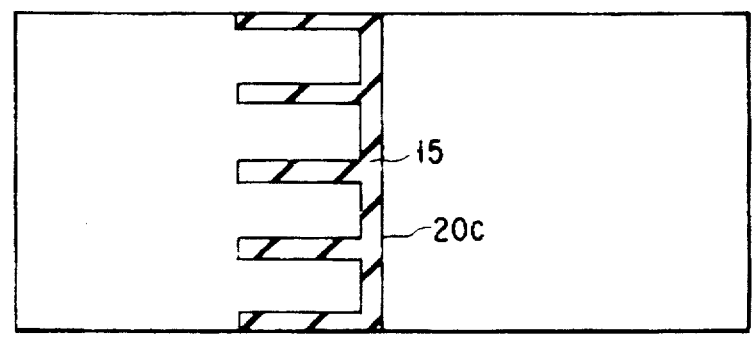
F I G. 24

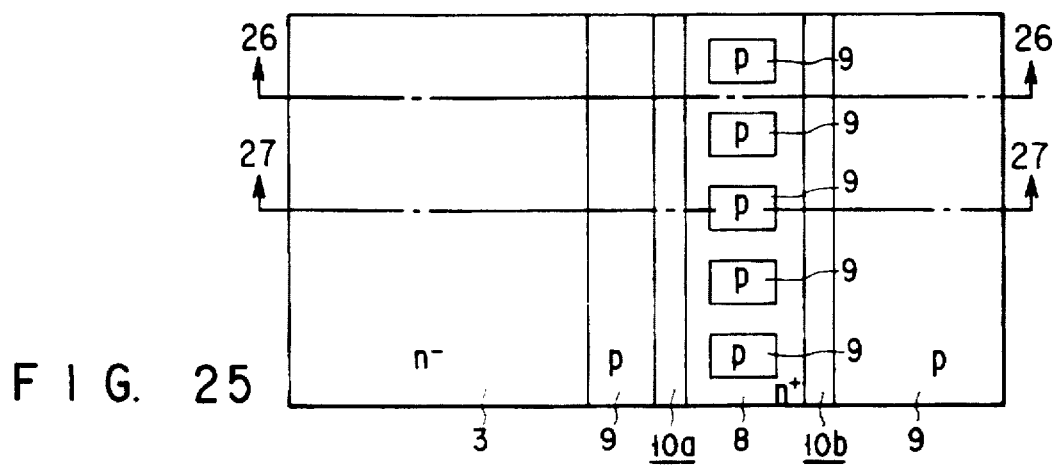
F I G. 25
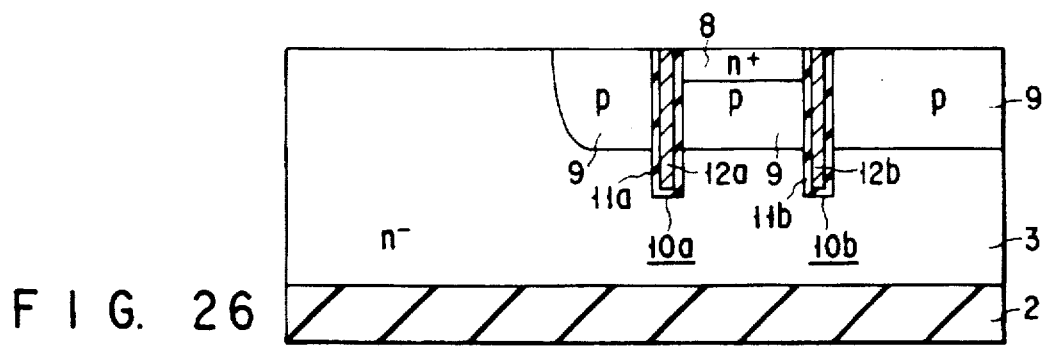
F I G. 26
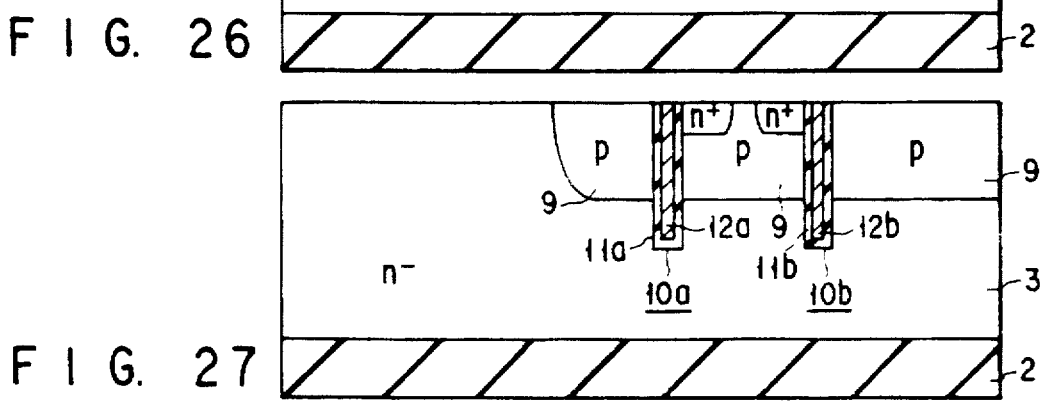
F I G. 27
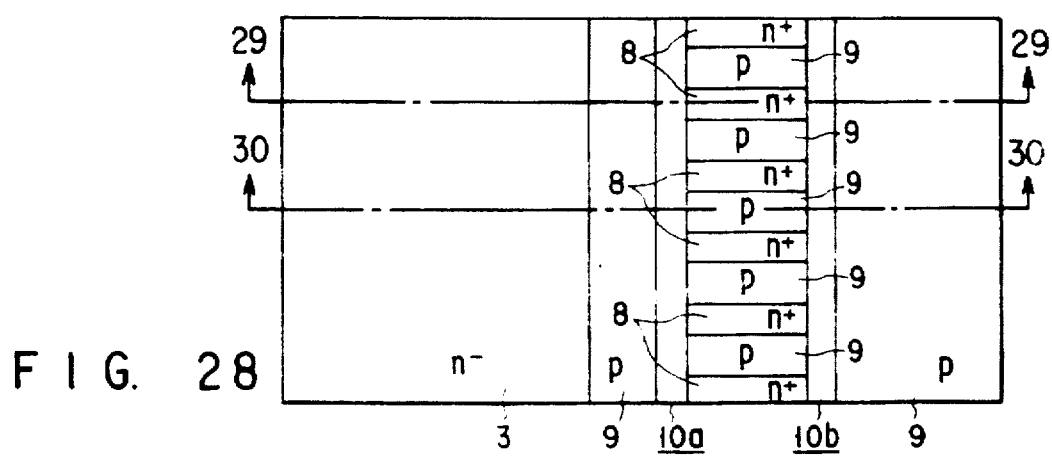
F I G. 28

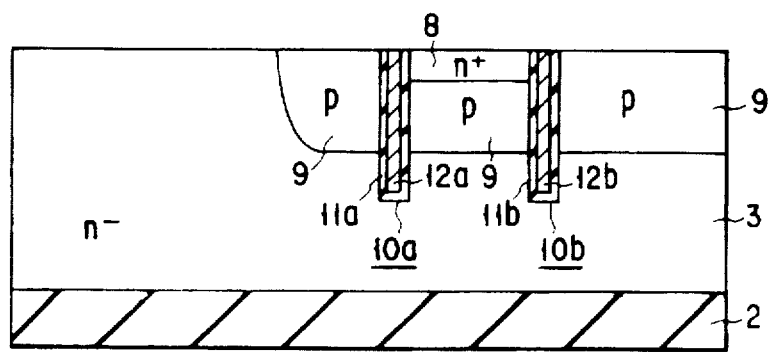
F I G. 29
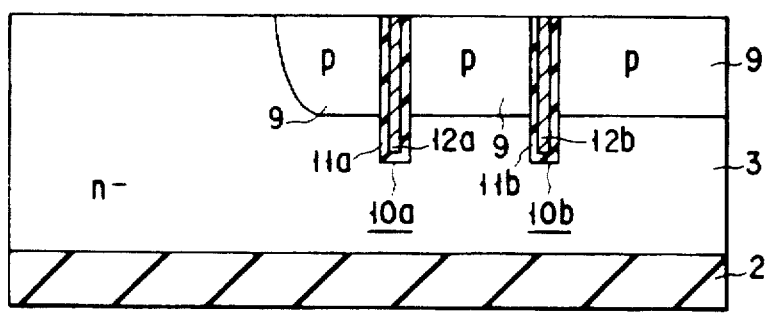
F I G. 30
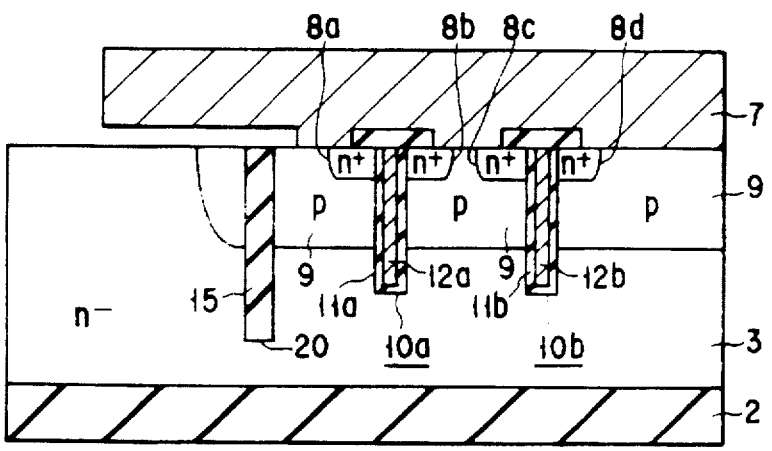
F I G. 31
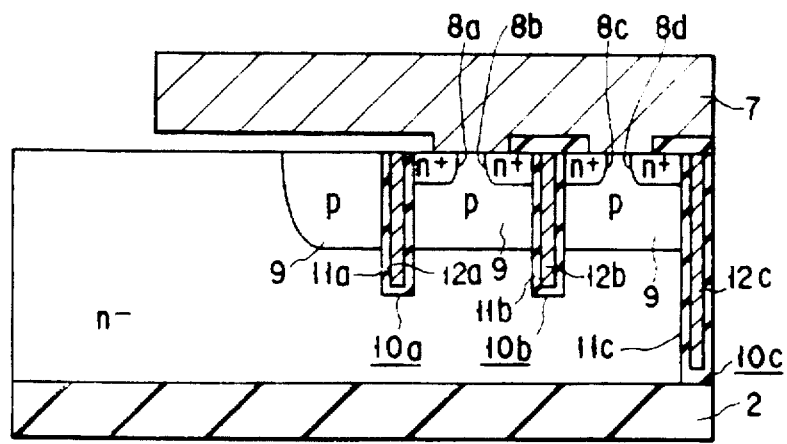
F I G. 32

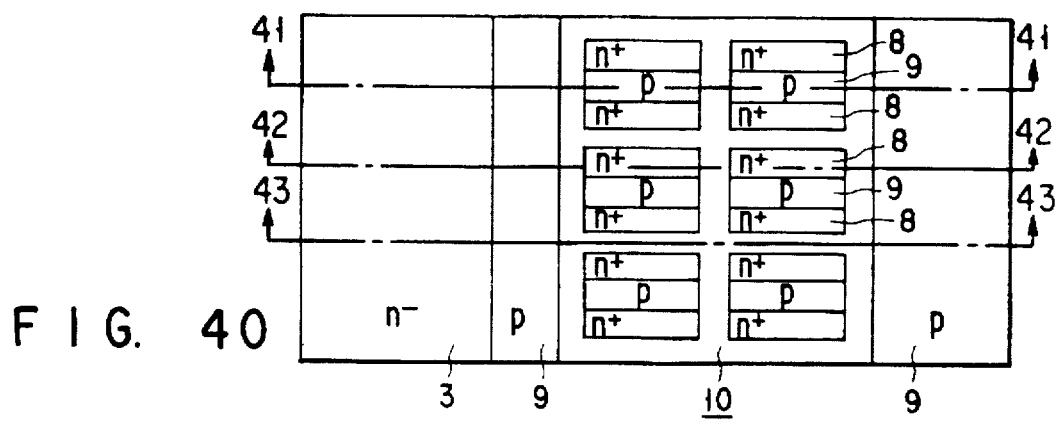
F I G. 40
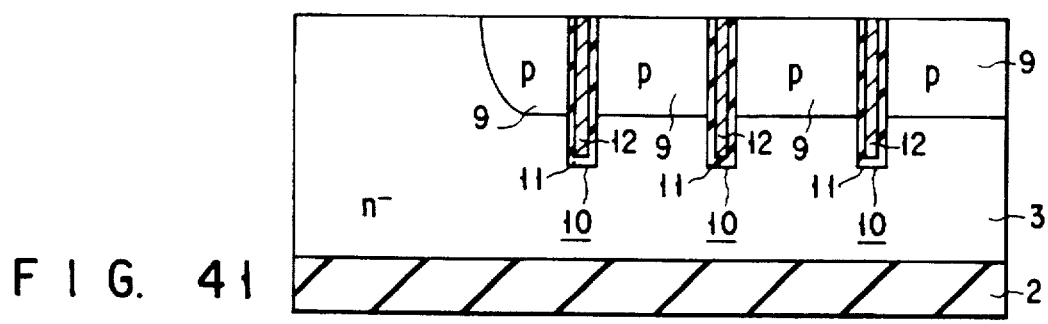
F I G. 41
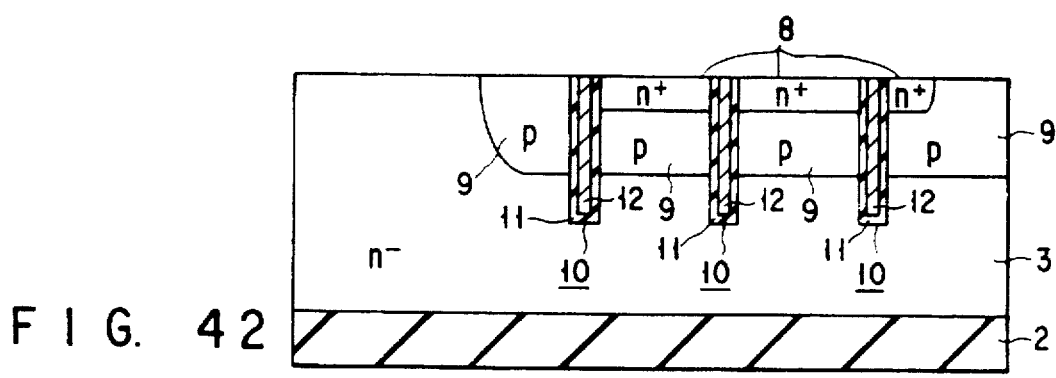
F I G. 42
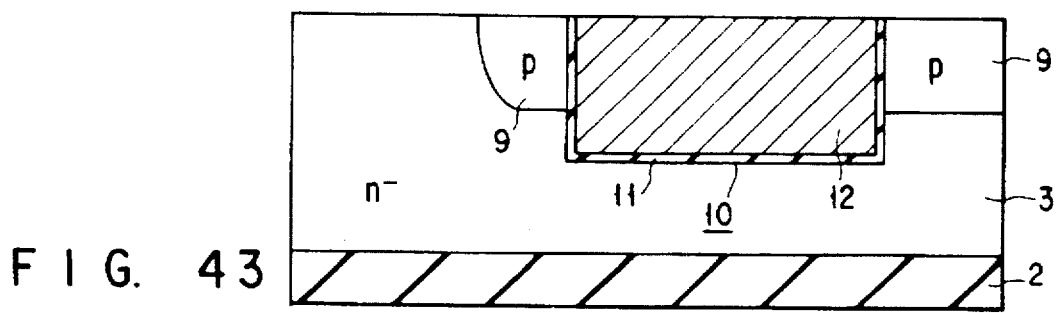
F I G. 43

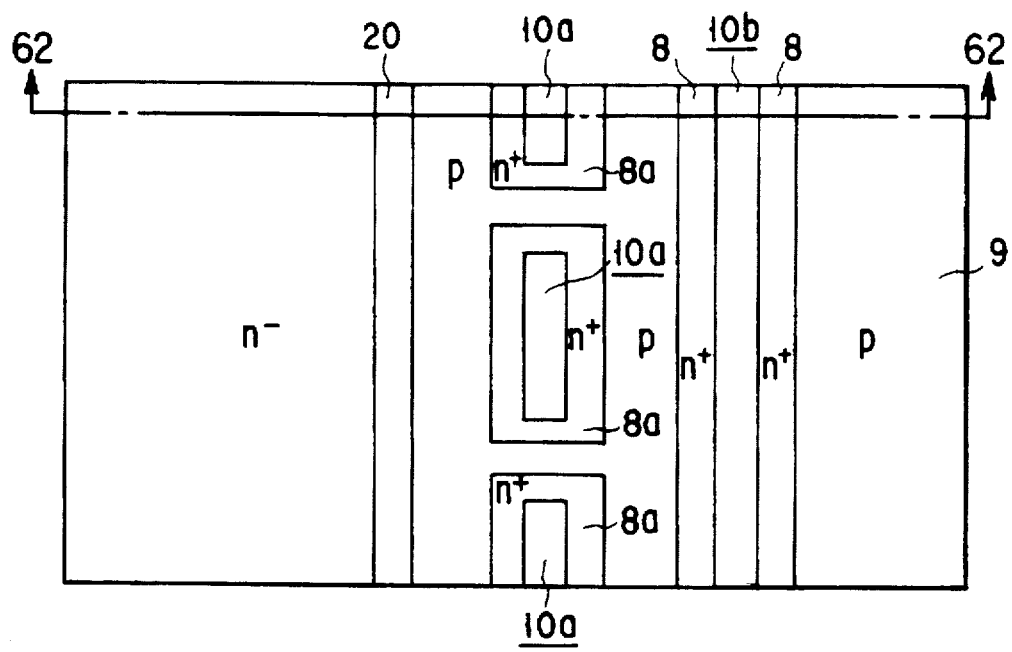
F I G. 61
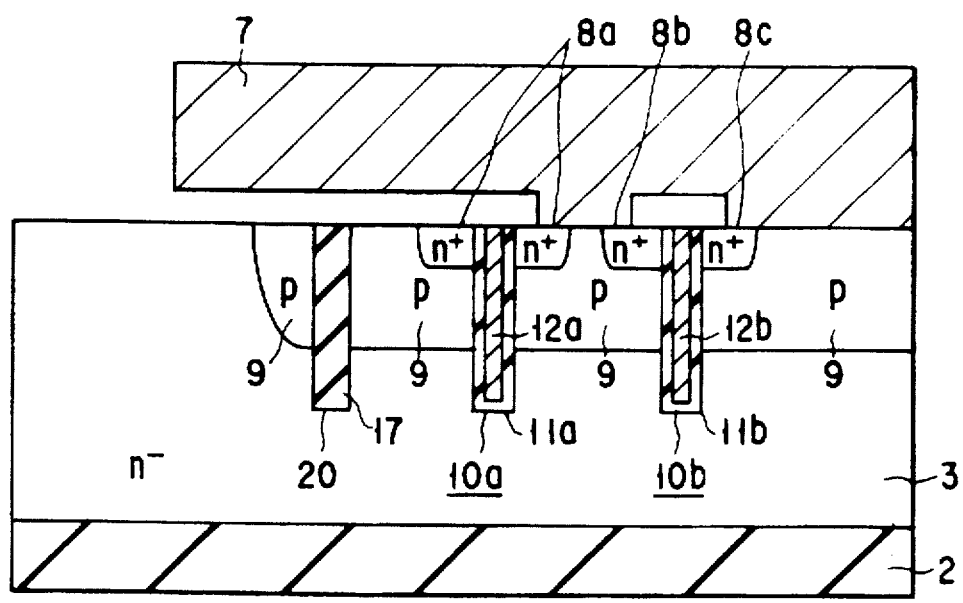
F I G. 62

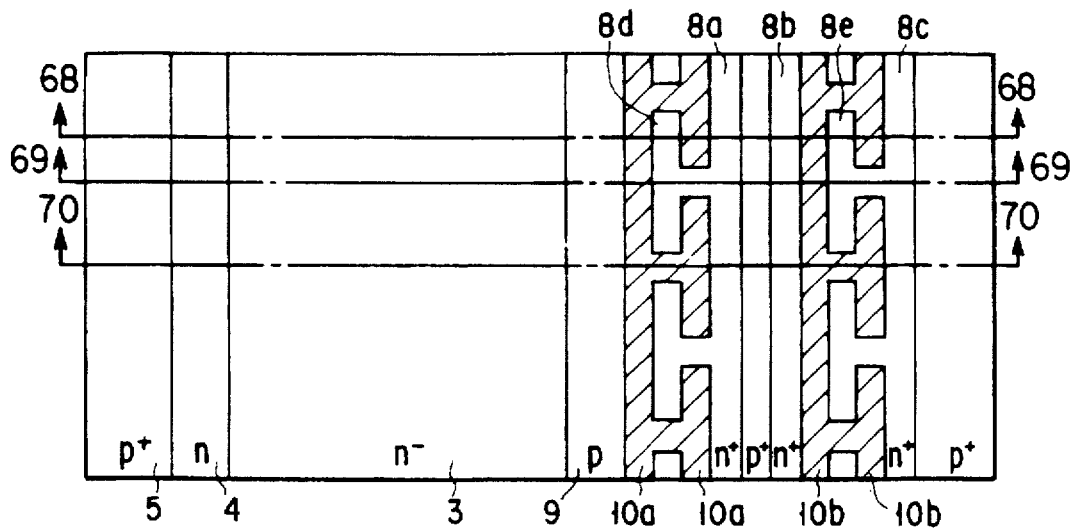
F I G. 67
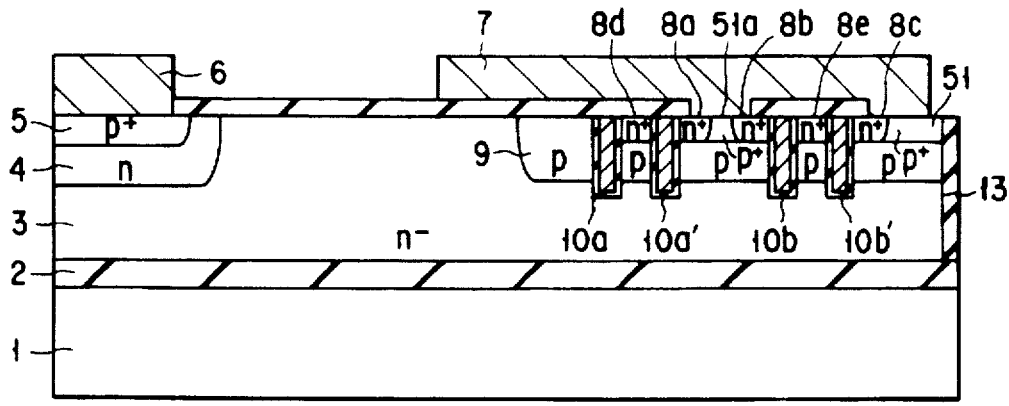
F I G. 68
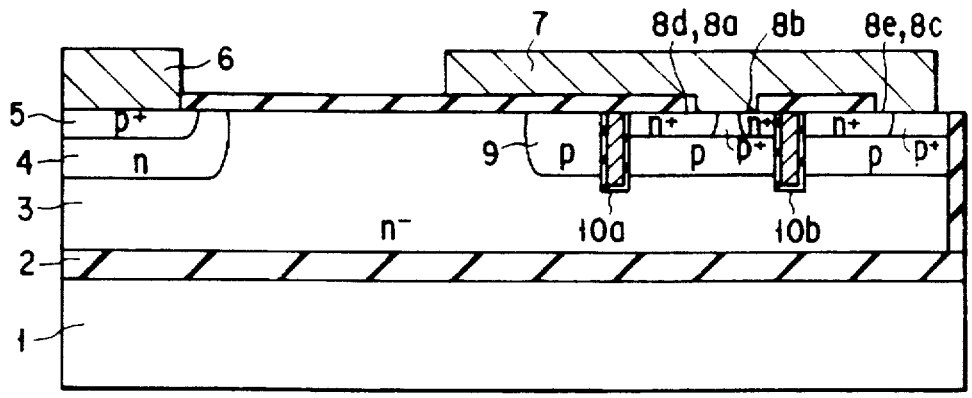
F I G. 69

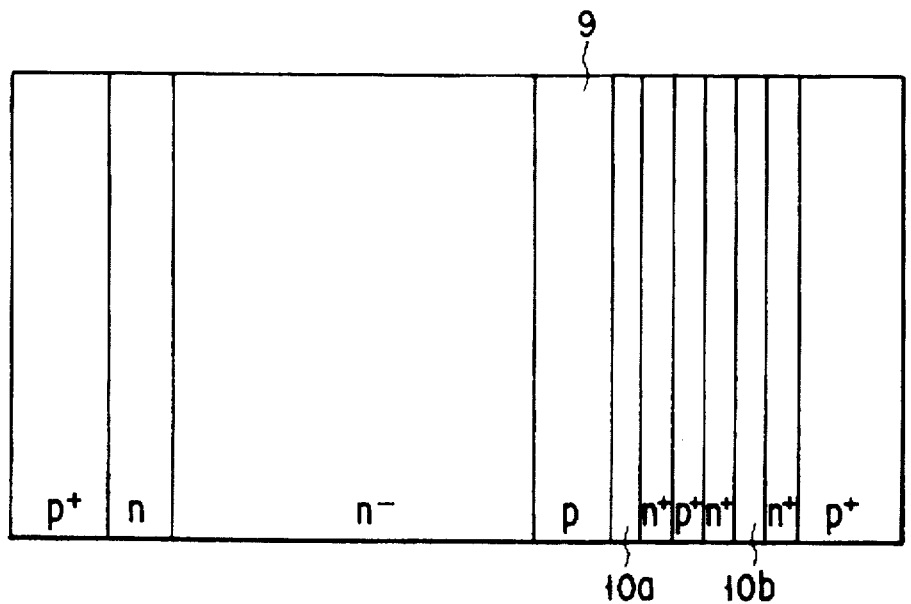
F I G. 76
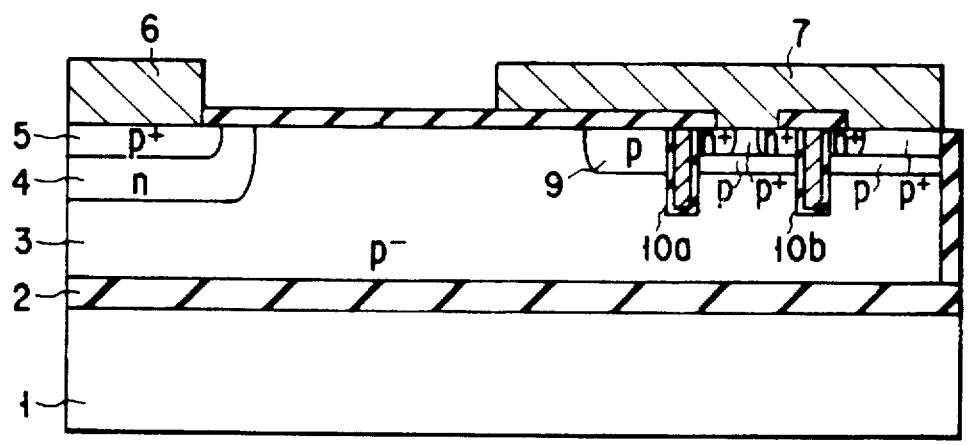
F I G. 77

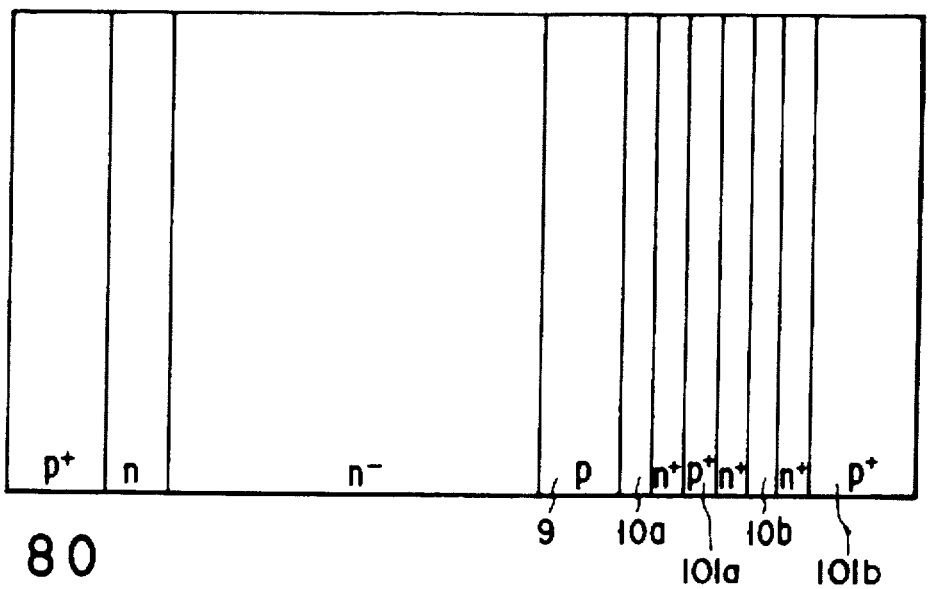
F I G. 80
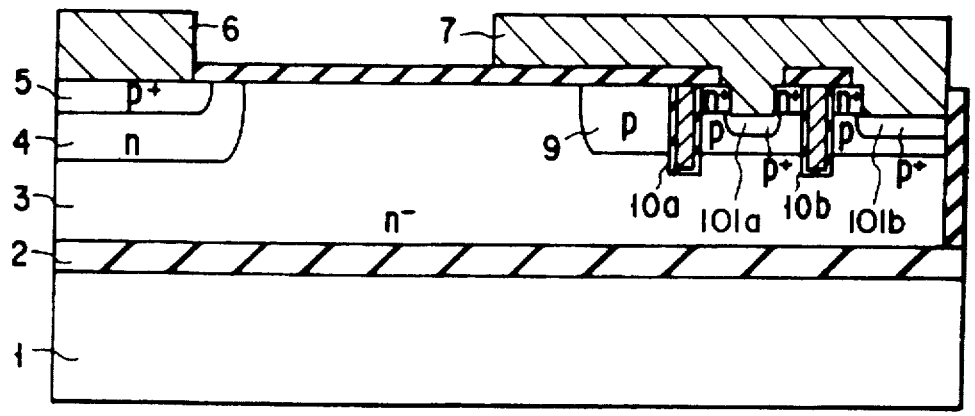
F I G. 81
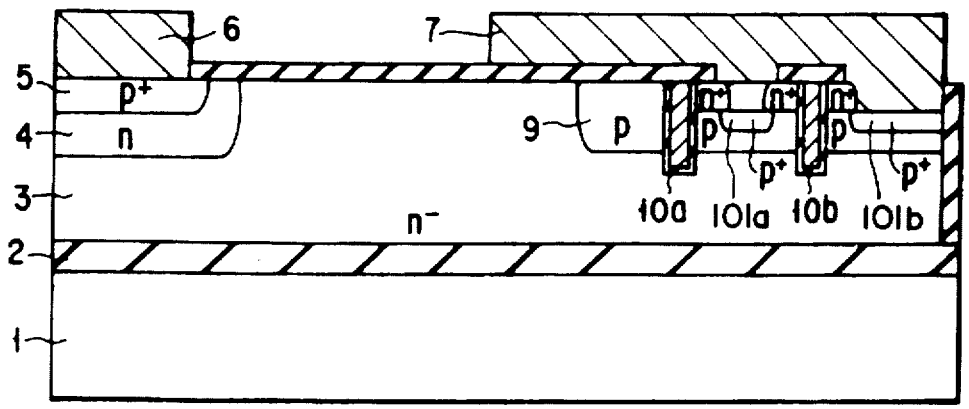
F I G. 82

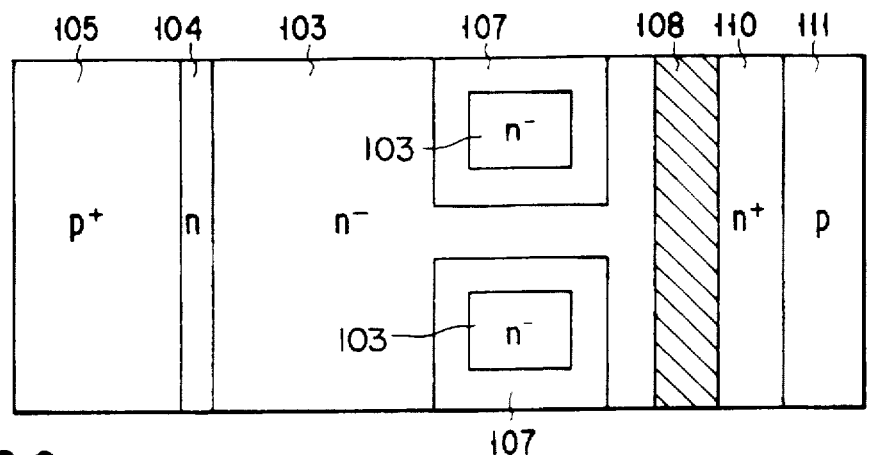
F I G. 86
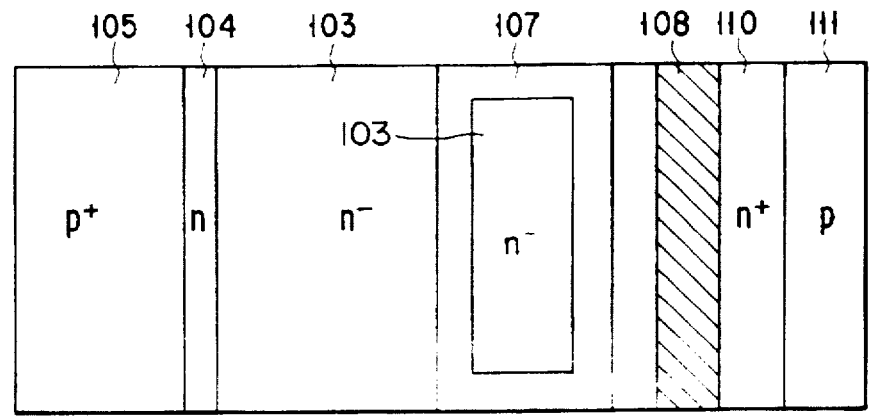
F I G. 87
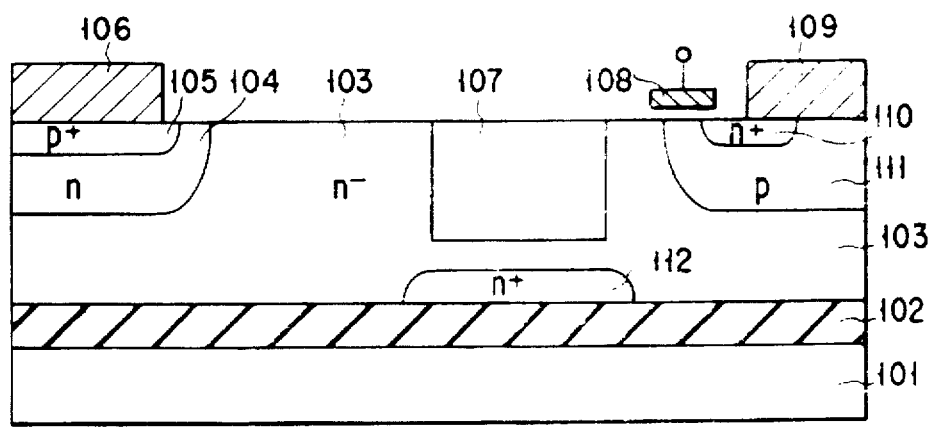
F I G. 88

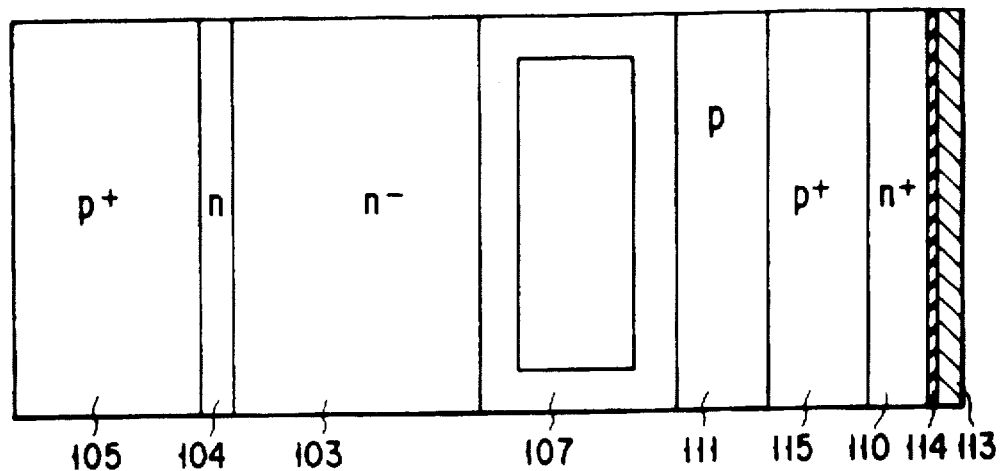
F I G. 95
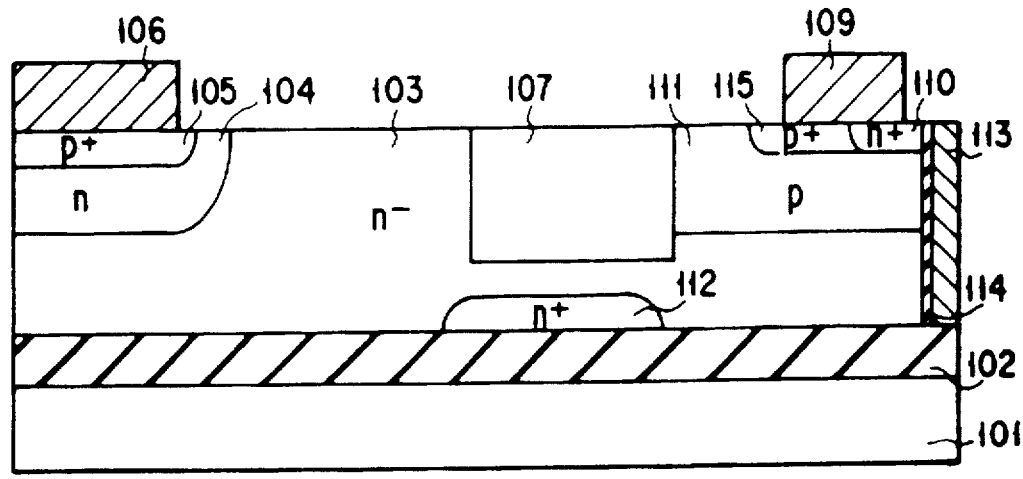
F I G. 96
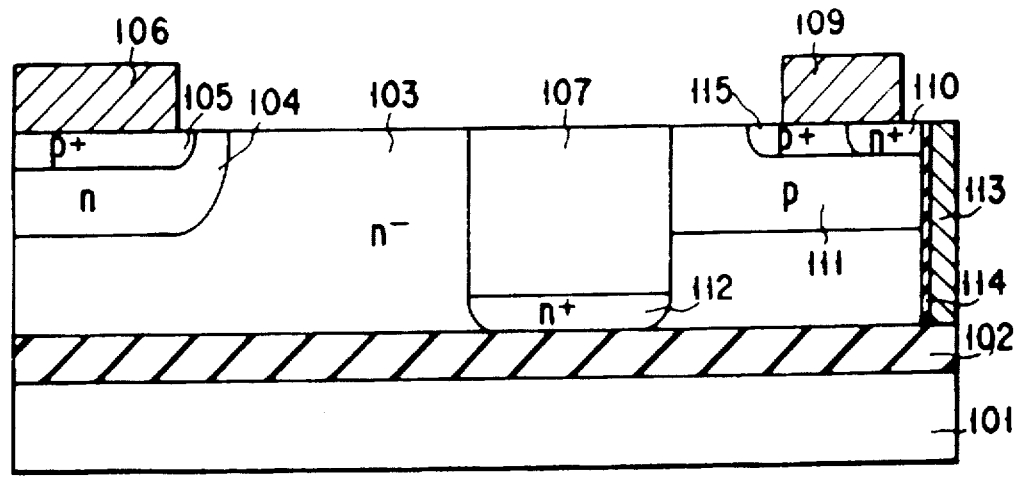
F I G. 97

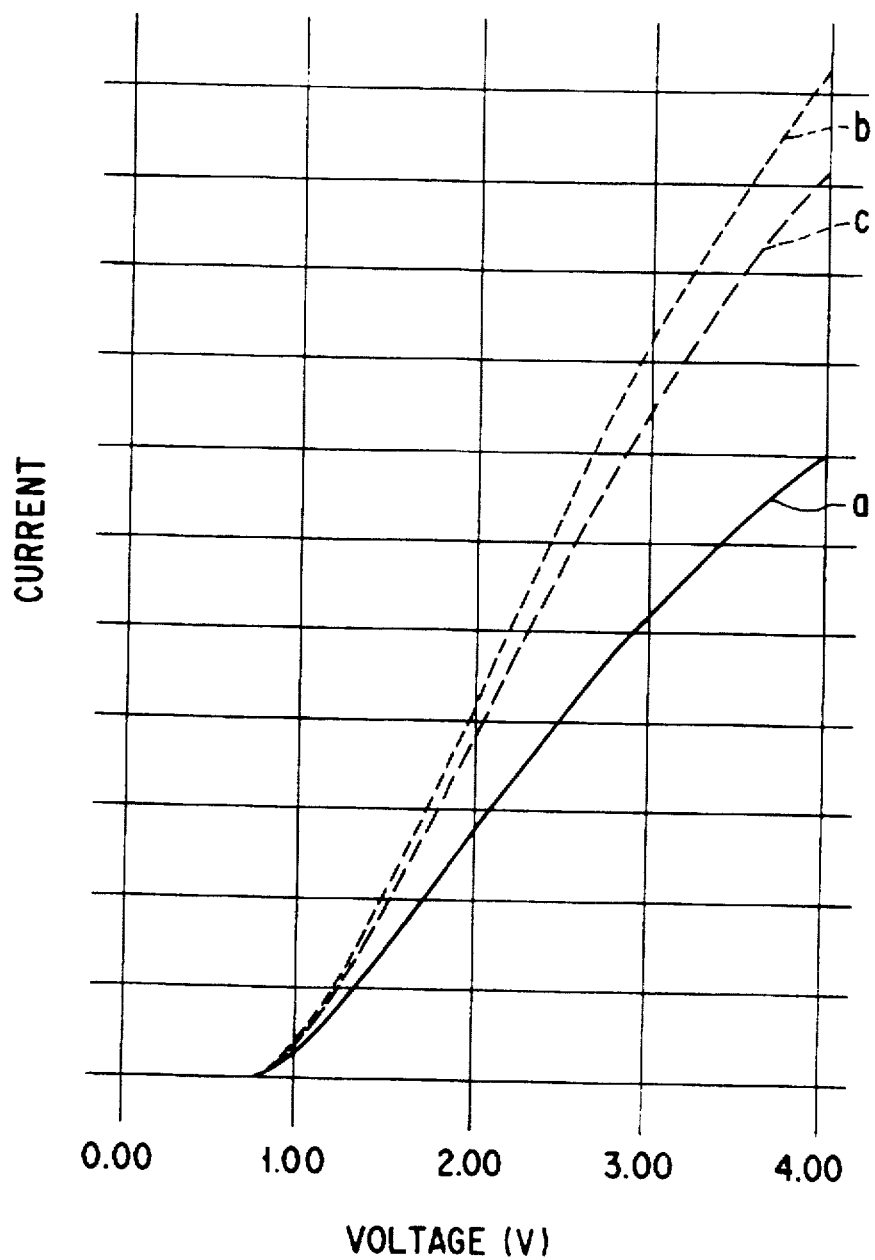
F I G. 101

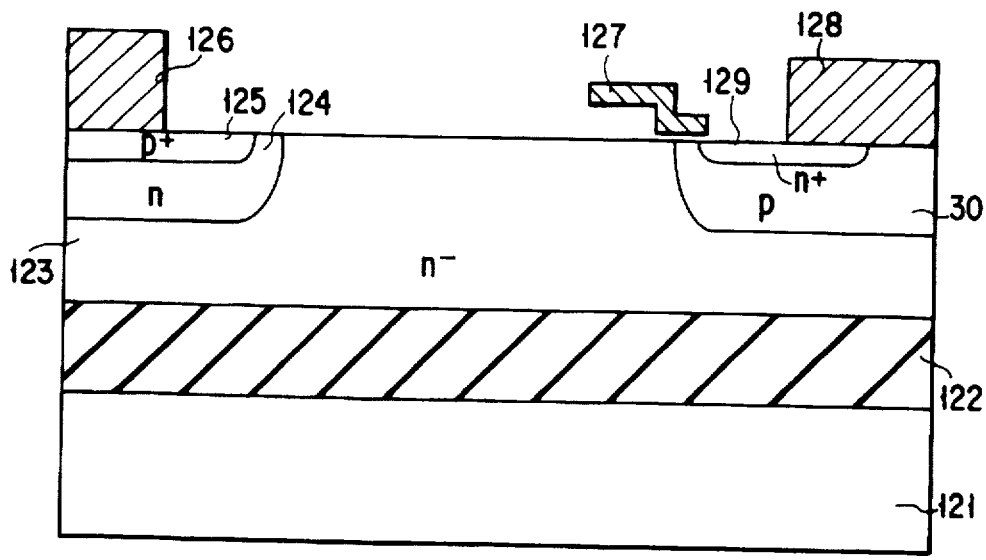
F I G. 1 0 5
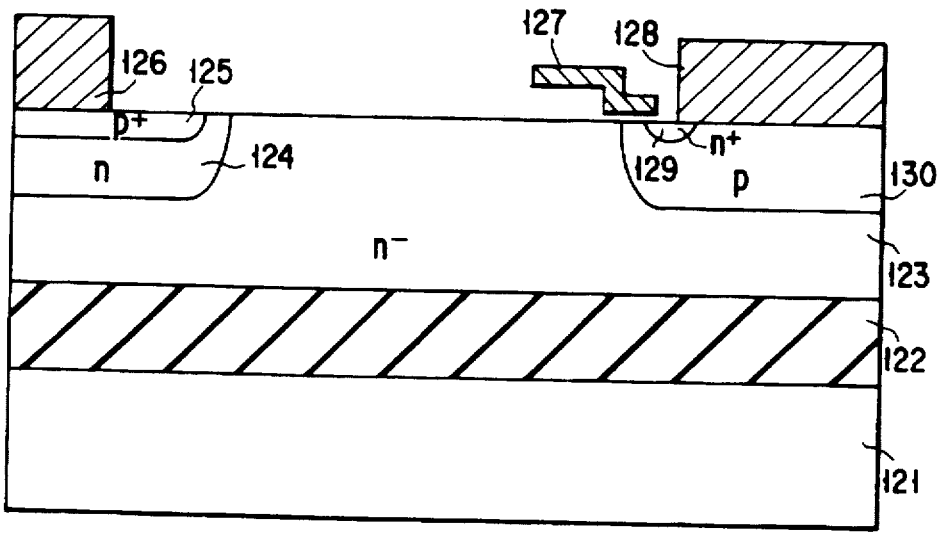
F I G. 1 0 6
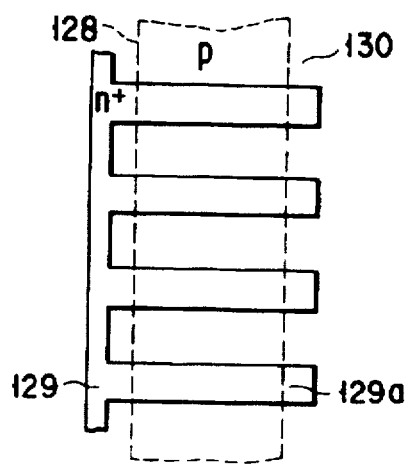
F I G. 1 0 7

HIGH BREAKDOWN VOLTAGE SEMICONDUCTOR DEVICE USING TRENCH GROOVES

BACKGROUND OF THE INVENTION

1. Field of the Invention

The present invention relates to a high breakdown voltage semiconductor device with a MOS structure, such as a lateral-type IGBT or a lateral-type MOSFET.

2. Description of the Related Art

An insulated gate bipolar transistor (IGBT) is known as one of high breakdown voltage semiconductor devices with MOS structures. The IGBT is a newly developed high breakdown voltage semiconductor device having high-speed switching characteristics of a power MOSFET and high-output characteristics of a bipolar transistor. Recently, the IGBT has widely been used in the field of power electronics, for example, in inverters and switching power supplies.

FIG. 1 is a cross-sectional view showing the device structure of a conventional lateral-type IGBT. In FIG. 1, reference numeral 81 denotes a silicon substrate. A silicon oxide film 82 is formed on the silicon substrate 81, and an n-type silicon active layer 83 with a low impurity concentration (high resistance) is provided on the silicon oxide film 82. The silicon substrate 81, silicon oxide film 82 and n-type silicon active layer 83 constitute an SOI substrate. An n-type silicon layer 90 with a high impurity concentration (low resistance) is formed in a bottom portion of the n-type silicon active layer 83.

A p-type base layer 89 is selectively formed in a surface portion of the n-type silicon active layer 83. An n-type source layer 88 with a high impurity concentration is selectively formed in a surface portion of the p-type base layer 89.

A gate insulating film (not shown) having a thickness of about 60 nm is formed on a portion of the p-type base layer 89, which is sandwiched between the n-type source layer 88 and the n-type silicon active layer 83. A gate electrode 91 is provided on this gate insulating film. A source electrode 87 is provided to be in contact with the n-type source layer 88 and p-type base layer 89.

An n-type buffer layer 84 is selectively formed in a surface portion of the n-type silicon active layer 83 at a predetermined distance from the p-type base layer 89. A p-type drain layer 85 with a high impurity concentration, which is provided with a drain electrode 86, is formed in a surface portion of the n-type buffer layer 84.

The lateral-type IGBT having the above structure operates as follows.

When the IGBT is turned on, a voltage which is positive with respect to the source electrode 87 is applied to the gate electrode 91. If the positive voltage is applied to the gate electrode 91, a surface channel region of the p-type base layer 89 below the gate electrode 91 is rendered conductive, and electrons are injected from the n-type source layer 88 into the n-type silicon active layer 83. In addition, holes are injected from the p-type drain layer 85 into the n-type silicon active layer 83. As a result, conductivity modulation occurs in the n-type silicon active layer 83, and a main current begins to flow between the drain and source.

On the other hand, when the IGBT is turned off, a voltage which is negative with respect to the source electrode 87 is applied to the gate electrode 91. If the negative voltage is applied to the gate electrode 91, a surface channel region of the p-type base layer 89 below the gate electrode 91 is rendered non-conductive, and the injection of electrons from the, n-type source layer 88 into the n-type silicon active layer 83 is stopped. As a result, conductivity modulation ceases to occur in the n-type silicon active layer 83, and a main current stops to flow between the drain and source.

In the meantime, this type of lateral type IGBT has the following problem. When the IGBT is turned on, a positive voltage is applied to the gate electrode 91 and the surface channel region of the p-type base layer 89 is rendered conductive. A voltage drop occurring in this channel region is large and a turn-on voltage increases.

FIG. 2 is a cross-sectional view showing the device structure of another conventional lateral-type IGBT. A first difference between this lateral-type IGBT and the IGBT shown in FIG. 1 is that a trench gate structure is adopted. Specifically, a gate electrode 97 is buried in a trench groove reaching the silicon oxide film 82, with a gate insulating film 93 interposed between the side wall of the trench groove and the outer periphery of the gate electrode 97.

A second difference between the IGBT shown in FIG. 2 and that shown in FIG. 1 is that a p-type diffusion layer 94 with a high impurity concentration is selectively formed in a surface portion of the p-type base layer 89, which portion is located on the p-type drain layer (85) side with respect to the n-type source layer 88.

According to this lateral-type IGBT, holes within the device flow into the source electrode 87 via the p-type diffusion layer 94. There is an advantage, therefore, that a greater anti-latch-up amount than in the lateral-type IGBT shown in FIG. 1 is obtained.

Even in the trench gate structure, however, the area of the channel region (channel density) is the same as that of the lateral-type IGBT shown in FIG. 1. Thus, the problem of an increase in turn-on voltage has not been solved.

As has been described above, in the conventional lateral-type IGBTs, the turn-on voltage increases due to a voltage drop in the channel region.

SUMMARY OF THE INVENTION

An object of the present invention is to provide a high breakdown voltage semiconductor device with excellent turn-on characteristics.

Another object of the invention is to provide a high breakdown voltage semiconductor device with a low turn-on voltage and a high anti-latch-up amount.

According to the present invention, there is provided a high breakdown voltage semiconductor device comprising:

a semiconductor substrate;

an insulating film formed on the semiconductor substrate;

a first conductivity type active region formed on the insulating film;

a drain region formed in a surface portion of the active region;

a second conductivity type base region formed in a surface portion of the active region at a distance from the drain region;

a first conductivity type source region formed in a surface portion of the base region;

a first gate insulating film formed on an inner surface of a first groove penetrating the base region so as to come in contact with the source region and reaching the active region;

a first gate electrode buried in the first groove, on the inner surface of which the first gate insulating film is formed;

a second gate insulating film formed on an inner surface of a second groove penetrating the base region so as to come in contact with the source region in a position located apart from the first groove and reaching the active region;

a second gate electrode buried in the second groove, on the inner surface of which the second gate insulating film is formed;

a source electrode put in electrical contact with the source region and the base region; and a drain electrode put in electrical contact with the drain region, wherein two or more channel regions are formed in a MOS structure constructed by the gate insulating film, the gate electrode, the source region, the base region and the active region.

According to this invention, there is also provided a semiconductor device comprising:

a semiconductor substrate;

an insulating film formed on the semiconductor substrate;

a first conductivity type active region formed on the insulating film;

a second conductivity type drain region formed in a surface portion of the active region;

a second conductivity type base region formed in a surface portion of the active region at a distance from the drain region;

a first conductivity type source region formed in a surface portion of the base region;

a gate insulating film formed on the base region between the source region and the active region;

a gate electrode formed on the gate insulating film;

a first carrier blocking region formed by burying one of an insulator and a semiconductor in a groove formed in the active region between the drain region and the base region; and a second conductivity type bypass region, formed in the active region below the first carrier blocking region, for passing second carriers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a cross-sectional view of the lateral-type IGBT, taken along line 4—4 in FIG. 3;

FIGS. 5A and 5B are cross-sectional views for describing the planar directions of a trench groove;

FIG. 6 illustrates the flow of electric current at the time when the lateral-type IGBT according to the first embodiment is turned on;

FIGS. 7A to 7C illustrate differences in carrier concentration profiles in the turn-on state between the lateral-type IGBT of the present invention and the conventional lateral-type IGBT;

FIG. 21 is a cross-sectional view of the lateral-type IGBT, taken along line 21—21 in FIG. 20;

FIG. 22 shows a planar pattern of a dummy trench gate groove;

FIG. 23 shows a planar pattern of another dummy trench gate groove;

FIG. 24 shows a planar pattern of still another dummy trench gate groove;

FIG. 25 is a plan view of a lateral-type IGBT according to a 10th embodiment of the present invention;

FIG. 26 is a cross-sectional view of the lateral-type IGBT, taken along line 26—26 in FIG. 25;

FIG. 27 is a cross-sectional view of the lateral-type IGBT, taken along line 27—27 in FIG. 25;

FIG. 28 is a plan view of a lateral-type IGBT according to an eleventh embodiment of the present invention;

FIG. 29 is a cross-sectional view of the lateral-type IGBT, taken along line 29—29 in FIG. 28;

FIG. 30 is a cross-sectional view of the lateral-type IGBT, taken along line 30—30 in FIG. 28;

FIG. 31 is a cross-sectional view showing a main part (a source-side device structure) of the device structure of a lateral-type IGBT according to a twelfth embodiment of the present invention;

FIG. 32 is a cross-sectional view showing a main part (a source-side device structure) of the device structure of a lateral-type IGBT according to a 13th embodiment of the present invention;

FIG. 40 is a plan view showing a main part (a source-side device structure) of the device structure of a lateral-type IGBT according to a 16th embodiment of the present invention;

FIG. 41 is a cross-sectional view of the lateral-type IGBT, taken along line 41—41 in FIG. 40;

FIG. 42 is a cross-sectional view of the lateral-type IGBT, taken along line 42—42 in FIG. 40;

FIG. 43 is a cross-sectional view of the lateral-type IGBT, taken along line 43—43 in FIG. 40;

FIG. 61 is a plan view showing the device structure of a lateral-type IGBT according to a 29th embodiment of the present invention;

FIG. 62 is a cross-sectional view of the lateral-type IGBT, taken along line 62—62 in FIG. 61;

FIG. 67 is a plan view showing a lateral-type IGBT according to a 31st embodiment of the present invention;

FIG. 68 is a cross-sectional view of the lateral-type IGBT, taken along line 68—68 in FIG. 67;

FIG. 69 is a cross-sectional view of the lateral-type IGBT, taken along line 69—69 in FIG. 67;

FIG. 76 is a plan view showing a lateral-type IGBT according to a 34th embodiment of the present invention;

FIG. 77 is a cross-sectional view of the lateral-type IGBT shown in FIG. 76;

FIG. 80 is a plan view showing a lateral-type IGBT according to a 35th embodiment of the present invention;

FIG. 81 is a cross-sectional view of the lateral-type IGBT shown in FIG. 80;

FIG. 82 is a cross-sectional view showing a modification of the lateral-type IGBT shown in FIG. 81;

FIG. 86 is a plan view showing another trench groove pattern;

FIG. 87 is a plan view showing still another trench groove pattern;

FIG. 88 is a cross-sectional view showing the device structure of a lateral-type IGBT according to a 37th embodiment of the present invention;

FIG. 95 is a plan view showing still another trench groove pattern;

FIG. 96 is a cross-sectional view showing the device structure of a lateral-type IGBT according to a 42nd embodiment of the present invention;

FIG. 97 is a cross-sectional view showing the device structure of a lateral-type IGBT according to a 43rd embodiment of the present invention;

FIG. 101 is a graph showing the channel length dependency of the current/voltage characteristics of the IGBT;

FIG. 105 is a cross-sectional view showing the device structure of a lateral-type IGBT according to a 47th embodiment of the present invention;

FIG. 106 is a cross-sectional view showing the device structure of a lateral-type IGBT according to a 48th embodiment of the present invention;

FIG. 107 is a plan view showing a main part of a lateral-type IGBT according to a 49th embodiment of the present invention;

DETAILED DESCRIPTION OF THE PREFERRED EMBODIMENTS

In a first mode of the present invention, a plurality of grooves are formed so as to penetrate a base region, come in contact with a source region, and reach an active region. Gate insulating films are formed on the inner surfaces of these grooves, and gate electrodes are buried in the grooves. Thus, a plurality of MOS structures are formed. By these MOS structures, two or more channel regions are formed within one device. Accordingly, the channel density increases and the resistance of the entire channel regions decreases.

Since the grooves in the MOS structures reach the first conductivity type active layer through the second conductivity type base layer, the flow of carriers is prevented in the region of the active layer near the bottoms of the grooves.

Thus, at the time of turn-on and in the turn-on state, carriers of the same polarity as major carriers in the first conductivity type source layer are effectively accumulated in the region of the active layer near the bottoms of the grooves in the case of a power MOSFET, and carriers of the same and opposite polarities are effectively accumulated in that region in the case of an IGBT.

Thereby, the resistance of the active layer decreases, and a sufficient amount of carriers are supplied to the source layer and the region near the source layer. Accordingly, channels are easily formed.

By the total effects of the above features, better turn-on characteristics (e.g. turn-on voltage) are obtained than in the prior art.

In a second mode of the present invention, a groove is formed in the active region between the drain region and the base region and an insulator or a semiconductor is buried in the groove to form a first carrier blocking region. A first conductivity type bypass region for passing second carriers is formed in the active region below the first carrier blocking region.

By virtue of the presence of the carrier blocking region, a first carrier current of the same polarity as the second conductivity type drain layer, which flows into the source electrode, can be reduced. Although a second carrier current of the polarity opposite to that of the second conductivity type drain layer is influenced by the carrier blocking region, the second carrier current can flow within the device through the bypass region. Thus, a decrease in the second carrier current due to the groove can be reduced.

Accordingly, the ratio of the second carrier current to the total current increases and the source-side second carrier current can be more accumulated. Therefore, the turn-on voltage of the device decreases.

Various embodiments of the present invention will now be described with reference to the accompanying drawings.

(First Embodiment)

Figure 3:
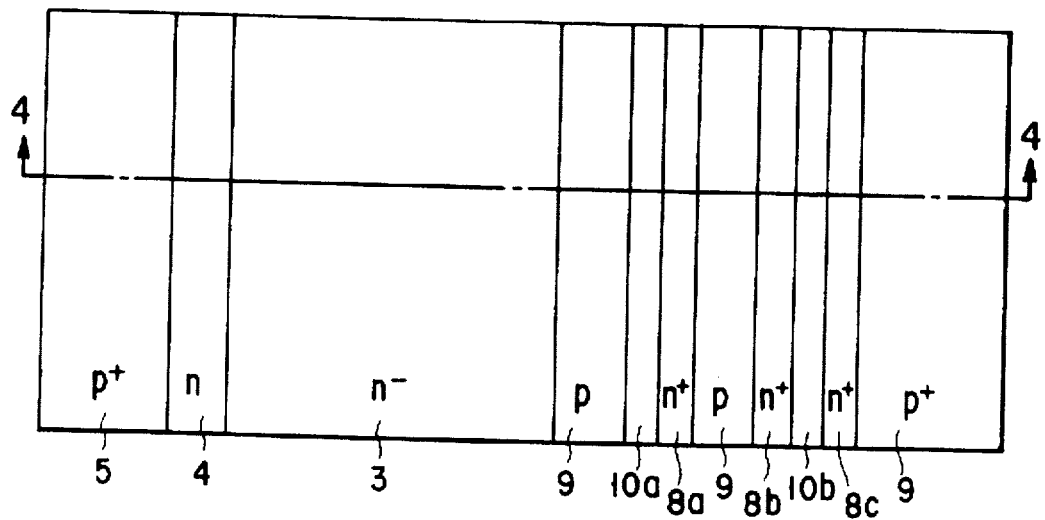
FIG. 3 is a plan view of a lateral-type IGBT according to a first embodiment of the present invention.

FIG. 3 is a plan view of a lateral-type IGBT according to a first embodiment of the present invention, and FIG. 4 is a cross-sectional view of the lateral-type IGBT, taken along line 4—4 in FIG. 3.

In FIGS. 3 and 4, reference numeral 1 denotes a silicon substrate. An n-type silicon active layer 3 with a low impurity concentration is provided on the silicon substrate 1 with a silicon oxide film 2 interposed. The silicon substrate 1, silicon oxide film 2 and n-type silicon active layer 3 constitute an SOI substrate. Reference numeral 13 denotes a device isolation insulating film.

The SOI substrate in the present invention has a broad sense and it refers to a substrate of a semiconductor layer/ insulating layer lamination structure, including a silicon layer/insulating layer lamination structure.

The silicon oxide film 2 should desirably have a thickness of about 1 to 5 μm. If the thickness is less than 1 μm, the breakdown voltage thereof decreases. If the thickness is greater than 5 μm, the wafer may warp or the formation of the oxide film may become time-consuming. In addition, the thickness of the n-type silicon active layer 3 should preferably be 20 μm or less. This thickness should more preferably be 10 μm or less, in consideration of easier device isolation. In consideration of a higher breakdown voltage, the total amount of impurities in the n-type silicon active layer 3 should preferably be $1.0 \times 10^{10}$ to $3.0 \times 10^{12}$ cm$^{-2}$, and more preferably be 0.5 to $1.8 \times 10^{12}$ cm$^{-2}$.

An n-type buffer layer 4 is selectively formed in a surface portion of the n-type silicon active layer 3, and a p-type drain layer 5 with a high impurity concentration is selectively formed in a surface portion of the n-type buffer layer 4. A drain electrode 6 is provided on the p-type drain layer 5.

A p-type base layer 9 is selectively formed in a surface of the n-type silicon active layer 3, which portion is located apart from the p-type drain layer at a predetermined distance. Two trench grooves 10a and 10b, which penetrate the p-type base layer 9 and reach the n-type silicon active layer 3, are formed in a region of the p-type base layer 9. Gate oxide films 11a and 11b each having a thickness of about 20 to 100 nm, are formed on inner surfaces of the trench grooves 10a and 10b. In addition, trench gate electrodes 12a and 12b of, e.g. polysilicon are buried in the trench grooves 10a and 10b.

N-type source layers 8a, 8b and 8c with a high impurity concentration are selectively formed on upper side walls of the trench grooves 10a and 10b. A source electrode 7 is provided on the n-type source layers 8 and the p-type base layer 9 in a region where the n-type source layers are formed. The source electrode 7 extends to that portion of the n-type silicon active layer 3 via an insulating film 50, in which the p-type base layer 9 is not formed. Thereby, the source electrode 7 can be provided with a field plate function and the breakdown voltage can be improved. Furthermore, p-type contact layers 51a and 51b with a high impurity concentration are selectively formed in a contact region between the source electrode 7 and p-type base layer 9.

N-type MOS transistors are constituted by the n-type source layers 8a, 8b and 8c, p-type base layer 9, n-type silicon active layer 3, gate oxide films 11 and trench gate electrodes 12a and 12b.

With respect to the trench groove 10a situated on the drain side, the n-type source layer 8a is formed on only that upper side wall which is opposite to the drain side. On the other hand, with respect to the trench groove 10b situated far from the drain side, the n-type source layers 8b and 8c are formed on both upper side walls.

As is shown in FIG. 3, the planar pattern of the trench grooves 10a and 10b is a pattern of stripes substantially parallel to the longitudinal direction of the p-type drain layer 5. Accordingly, the longitudinal direction of the trench grooves 10a and 10b is substantially parallel to that of the p-type drain layer 5. In other words, the trench grooves 10a and 10b are formed along the p-type drain layer 5. Again, in other words, the trench grooves 10a and 10b are formed substantially in parallel to that surface of the p-type base layer 9, which faces the p-type drain layer 5.

In the lateral-type IGBT having the above structure, when a voltage which is positive with respect to the source voltage is applied to the trench gate electrodes 12a and 12b, a channel region (p-type base layer 9) in the vicinity of the trench grooves 10a and 10b is rendered conductive.

As a result, electrons are injected from the n-type source layers 8a, 8b and 8c into the n-type silicon active layer 3, and holes are injected from the p-type drain layer 5 into the n-type silicon active layer 3. Thus, conductivity modulation occurs in the n-type silicon active layer 3 and the device is turned on by the IGBT operation.

In this case, in the present embodiment, three n-channel type MOS transistors are formed. Thus, when the device is turned on and rendered conductive, three parallel channel regions (one channel region in the prior art) are formed within a single device. Therefore, the channel density increases, as compared to the prior art, and the turn-on voltage decreases (the first point).

As has been described above, the longitudinal direction of the trench grooves 10a and 10b is substantially parallel to that of the p-type drain layer 5. Thus, the channel width of the three parallel channel regions of the n-channel type MOS transistor is longer than in the prior art.

The flow of carriers in the n-type silicon active layer 3 under the trench grooves 10a and 10b is prevented by the trench grooves 10a and 10b. Accordingly, when the device is turned on and rendered conductive, the electrons injected from the n-type source layers 8a, 8b and 8c into the p-type base layer 9 and the holes (drain current) flowing from the drain side to the source side are effectively accumulated in the n-type base layer 3 (silicon active layer) with a low impurity concentration below the trench grooves 10a and 10b.

As a result, the resistance of the n-type silicon active layer 3 decreases and a sufficient amount of carriers are supplied to the source regions and thereabouts of the three n-channel type MOS transistors. Thus, the three parallel channel regions can be easily activated at the same time (the second point).

As will be described later, a greater current can be let to flow by optimizing the dimensions (geometrical shape) of the trench groove 10a, 10b.

Furthermore, the orientations of the four side surfaces of the trench groove 10a, 10b are substantially {100}, as shown in FIG. 5A. Specifically, the trench groove 10 is substantially parallel to any one of the three {100} planes, shown in FIG. 5B. When the face orientation {100} is chosen, the roughness of the silicon crystalline lattice decreases and the effective mass of electrons also decreases. Accordingly, the mobility in the channel region increases, the current density increases and the turn-on resistance decreases (the third point).

Figure 6:
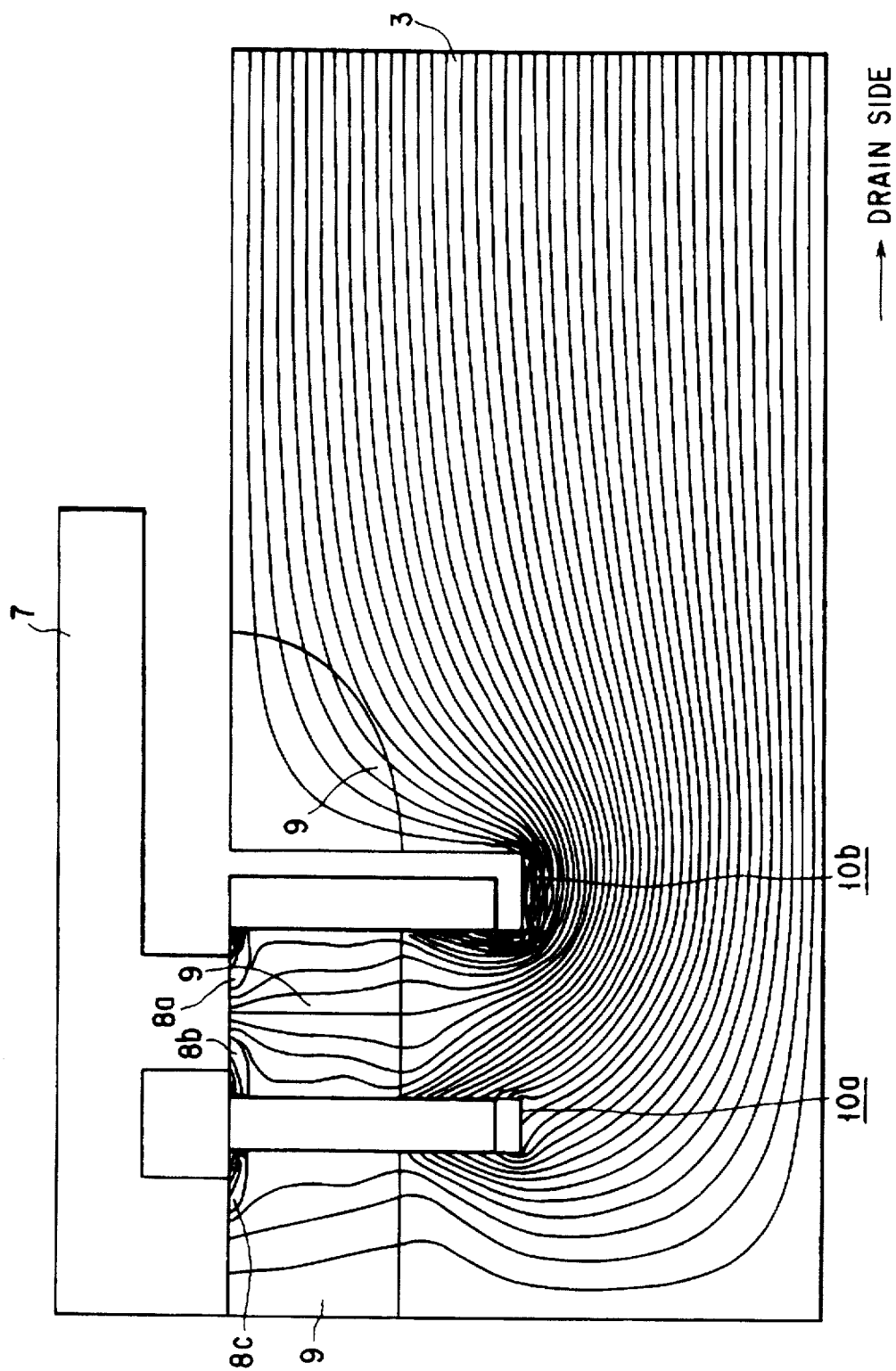

FIG. 6 illustrates the flow of current at the time of turn-on of the lateral-type IGBT according to the present embodiment. The ratio of electrons passing through the three channel regions decreases gradually away from the drain region, but all channel regions function (i.e. in the conductive state). From this, it is understood that the carriers are effectively accumulated below the n-type source layers 8a, 8b and 8c and all channel regions are thus rendered conductive.

FIGS. 7A to 7C show carrier concentration profiles within the device of this embodiment and the conventional device in the turn-on stage. FIG. 7A schematically shows a carrier concentration profile in a cross section taken along line II—II in FIG. 7C. FIG. 7B schematically shows a carrier concentration profile in a cross section taken along line III—III in FIG. 7C (i.e. in the depth direction). It is understood from FIGS. 7A to 7C that carriers are accumulated in the vicinity of the source regions of the three n-type MOS transistors more effectively than in the conventional IGBT shown in FIG. 1. In the cross-sectional view of FIG. 7C, the p-type contact layer is omitted.

In FIGS. 7A and 7B, a solid line a (the present invention) indicates a case where device parameters (e.g. the concentration profile of each diffusion layer, the depth of trench groove 10, and the width of trench groove 10) are voluntarily determined, and a solid line b indicates a case where the device parameters are optimally determined. It is understood from FIG. 7B that by optimizing the device parameters the carriers can be effectively accumulated near the source regions without causing a gradual decrease of excess carriers towards the source side.

Figure 8:
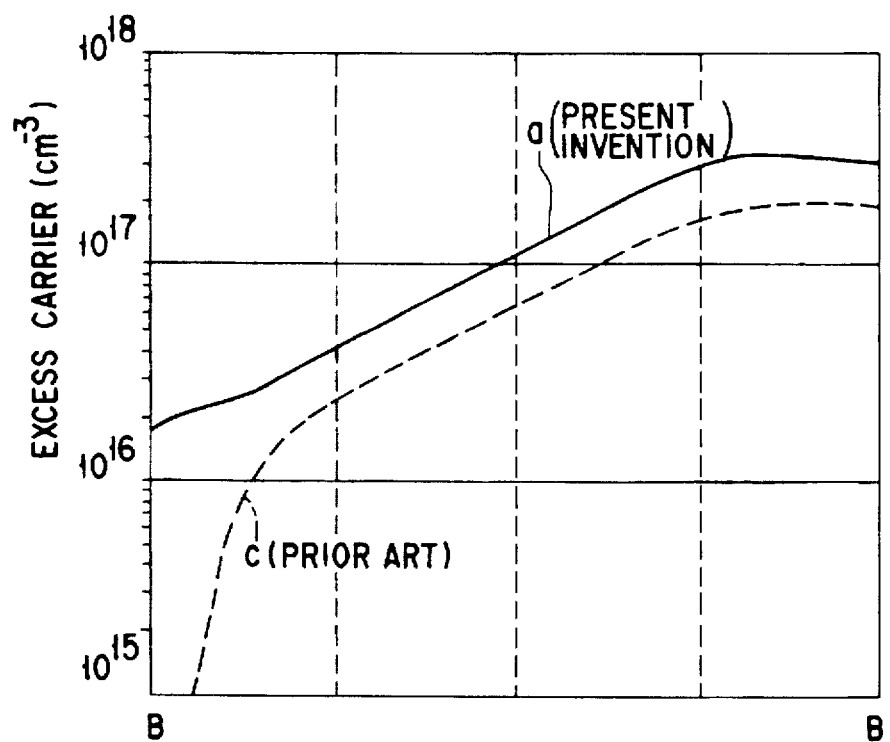
FIG. 8 is an actual measurement graph associated with FIG. 7B.

FIG. 8 shows actually measured profiles associated with FIG. 7A. The right and left in FIG. 8 are reverse to those of FIG. 7A, and FIG. 8 omits the case where the device parameters are optimized.

It is understood from FIG. 8 that the amount of excess carriers on the source side is $10^{16}$ cm$^{-3}$ or more even when the device parameters are voluntarily determined. By contrast, in the prior art, the amount of excess carriers on the source side decreases to $10^{15}$ cm$^{-3}$ or less.

In this embodiment the turn-on voltage is sufficiently lower than that in the prior art, and the conductive state of the channel regions is maintained at a lower turn-on voltage than in the prior art.

As has been described above, according to this embodiment, the turn-on resistance can be much lowered than in the prior art.

The desirable dimensions (geometrical shape) of the trench grooves 10a and 10b will now be described.

Figure 9:
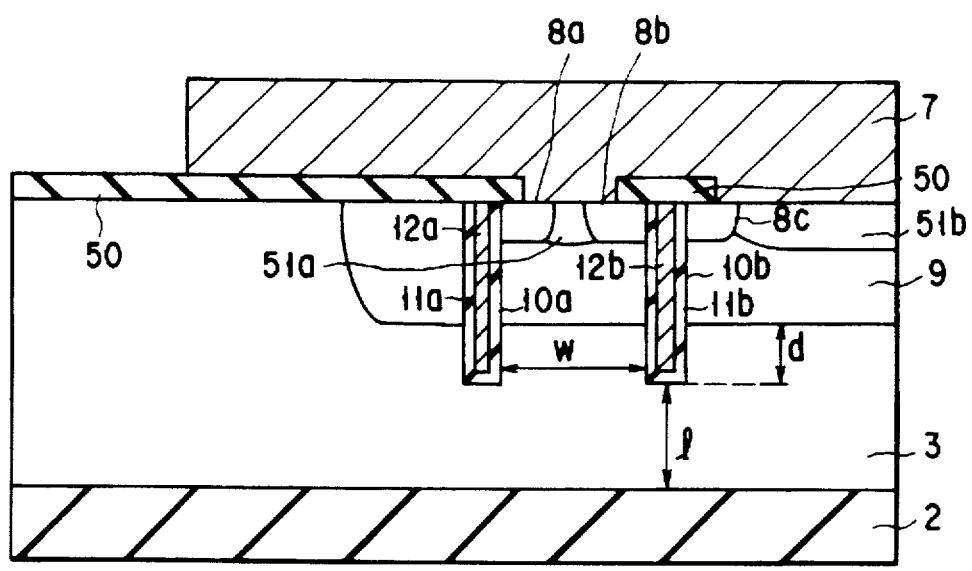
FIG. 9 is a view for explaining a preferable geometrical shape and preferable dimensions of the trench groove.

Suppose, as shown in FIG. 9, that the distance between the bottom (distal end) of the trench groove 10a, 10b and the bottom of the n-type silicon active layer 3 is l, the distance between the trench grooves is w, and the depth of that portion of trench groove 10a, 10b, which projects from the p-type base layer 9, is d. If the unit length (one cm) is set in the width direction (the direction perpendicular to the plane shown in FIG. 9) of the device, a hole current Jp flowing in the trench gate region is expressed by $$Jp=2\cdot\mu\cdot k\cdot T(n/l)w$$

where n=the carrier concentration (cm$^{-3}$) of the n-type silicon active layer 3, μ=the mobility, k=Boltzmann's constant, and T=the temperature.

The value of the hole current Jp corresponds to 30% of the total current J, and Jp=0.3 J.

The resistivity in the lateral direction under the trench gate is proportional to d·n, which is given by $$d\cdot n=(0.3J\cdot l\cdot d)/(2\mu\cdot k\cdot T\cdot w) \quad (1)$$

If μ=500 and k·T=4.14×10$^{21}$ is substituted in equation (1), $$d\cdot n=1.45\times10^{17}(l\times d/w) \quad (2)$$

When the thickness of the n-type silicon active layer 3 is about 10 μm, it is desirable that in equation (2), d>5 [μm] and n>1×10$^{15}$ [cm$^{-3}$]. Thus, if these values are substituted in equation (2), $$d\cdot n=1.45\times10^{17}(l\times d/w)>(5\times10^{-4}[cm])\cdot(1\times10^{15}[cm^{-3}])$$

Thus, the conditional formula, (l×d/w)>3.45×10$^{-6}$[cm], is obtained. When this condition is satisfied, a current greater than in the conventional lateral-type IGBT is obtained at all times.

More preferably, d=5 μm and n=1×10$^{16}$ [cm$^{-3}$], and if this value is substituted in formula (2), the conditional formula, (l×d/w)>3.45×10$^{-5}$[cm], is obtained. If this condition is satisfied, a still greater current is obtained.

If the above results are summarized, a current greater than in the conventional lateral-type IGBT is obtained at all times by setting the parameters l, d and w in the range of (l×d/w)>3.45×10$^{-6}$[cm], and preferably (l×d/w)>3.45×10$^{-5}$[cm].

Figure 1:
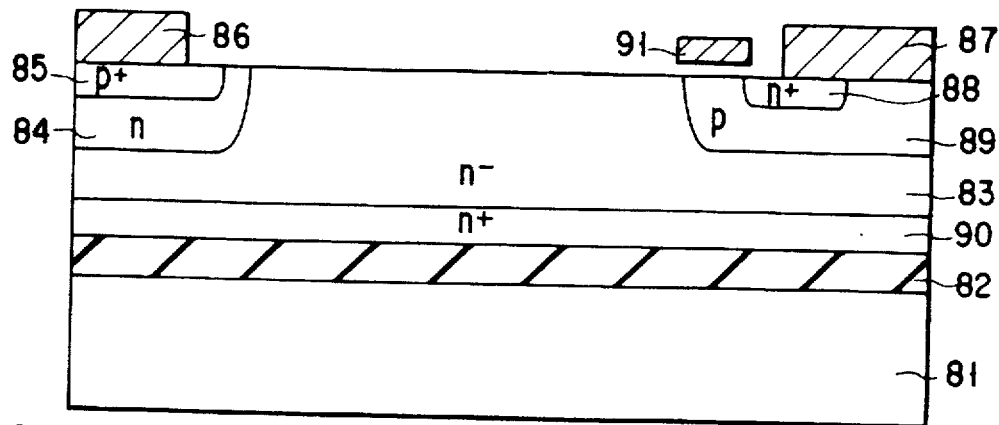
FIG. 1 is a cross-sectional view showing the device structure of a conventional lateral-type IGBT.
Figure 2:
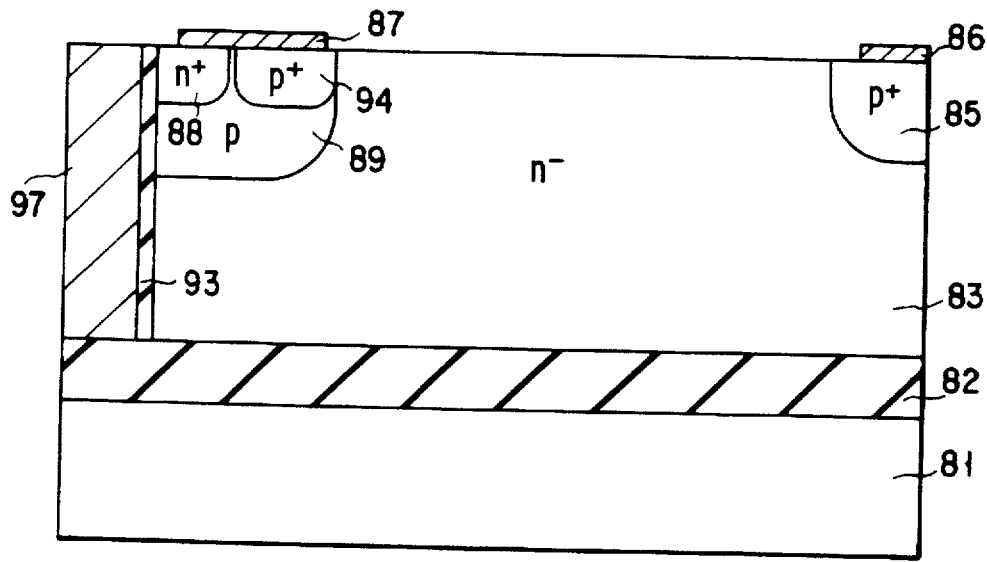
FIG. 2 is a cross-sectional view showing the device structure of another conventional lateral-type IGBT.
Figure 10:
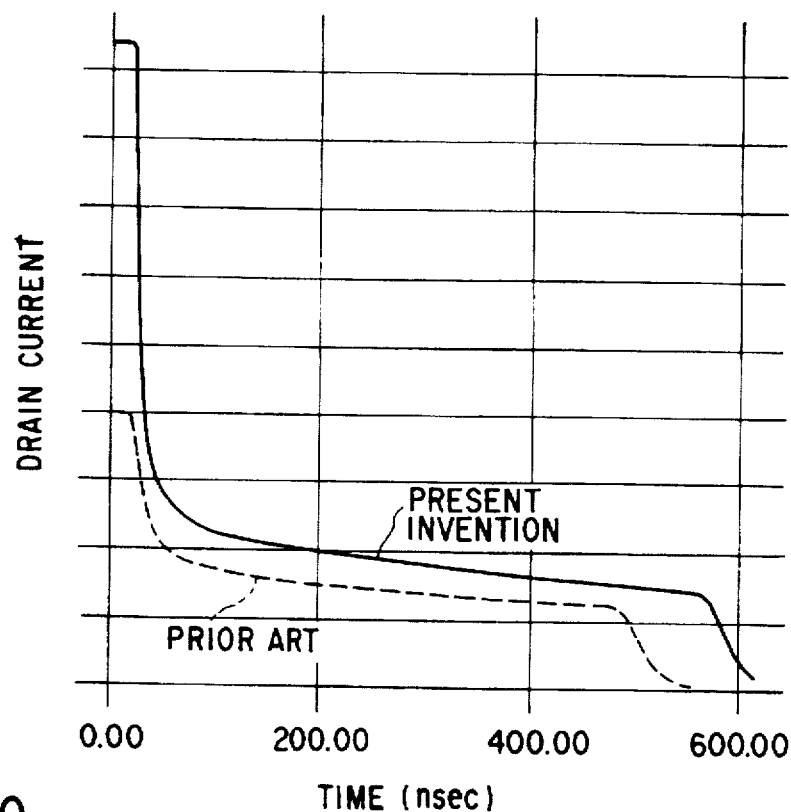
FIG. 10 shows turn-off waveforms in the lateral-type IGBT of the present invention and the conventional lateral-type IGBT.

FIG. 10 shows turn-off waveforms in the lateral-type IGBT of the present invention and the conventional lateral-type IGBT shown in FIG. 1. In both cases of the IGBT of this embodiment and the conventional IGBT, the turn-off is started with the same drain voltage and same gate voltage at the beginning. Since the drain current is higher in the present embodiment, a fall time, i.e. a time period during which the drain current value falls from 90% to 10% when the drain current value at the time of the beginning of turn-off is set at 100%, is longer but is substantially equal to that of the conventional IGBT.

Figure 11:
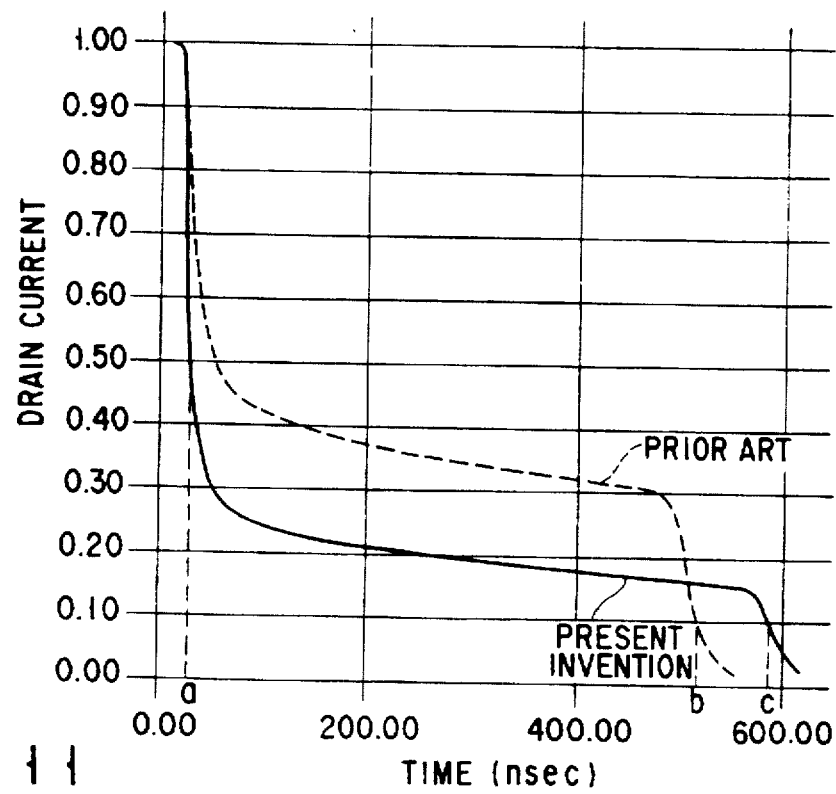
FIG. 11 shows waveforms obtained by replotting the waveforms shown in FIG. 10, with the drain current value at the time of the beginning of turn-off set at 1.
Figure 12:
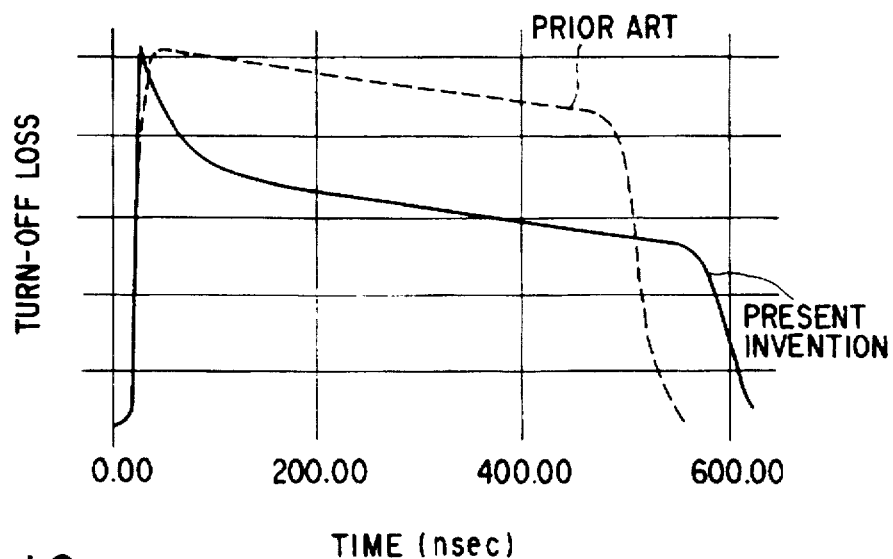
FIG. 12 shows the turn-off losses of the lateral-type IGBT of the present invention and the conventional lateral-type IGBT.

FIG. 11 shows waveforms obtained by replotting the waveforms shown in FIG. 10, with the drain current value at the time of the beginning of turn-off set at 1. FIG. 12 is a graph showing turn-off losses. It is understood from FIGS. 11 and 12 that the area of the portion corresponding to the fall time is less in the present invention and accordingly the turn-off loss is less. Thus, the IGBT of this embodiment can perform a switching operation at a speed substantially equal to that in the conventional IGBT and with a less turn-off loss.

(Second Embodiment)

Figure 13:
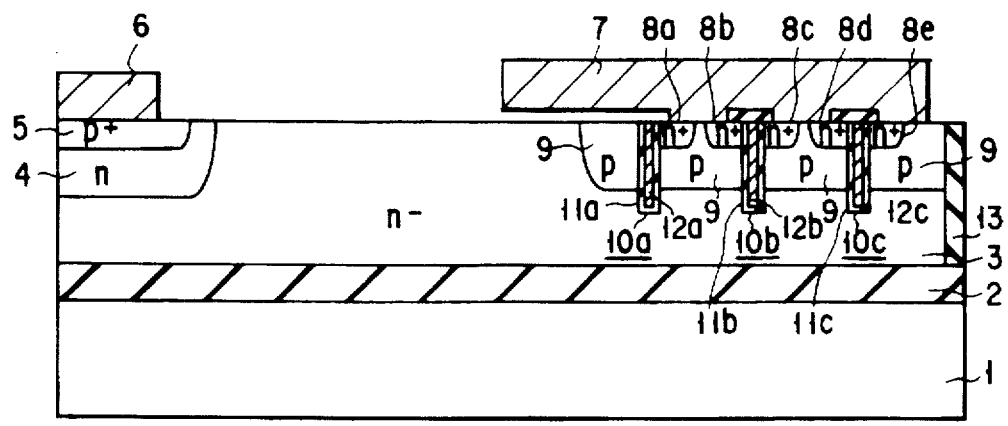
FIG. 13 is a cross-sectional view showing the device structure of a lateral-type IGBT according to a second embodiment of the present invention.

FIG. 13 is a cross-sectional view showing the device structure of a lateral-type IGBT according to a second embodiment of the present invention. In FIG. 13 and the following drawings, the same reference numerals (including those with different small characters) denote the same or similar elements or portions, and a detailed description thereof is omitted. In FIG. 13 and the following drawings, the insulating film 50 and p-type contact layer 51 are not shown.

The lateral-type IGBT of the second embodiment differs from that of the first embodiment in that the number of trench grooves is increased to three, i.e. 10a, 10b and 10c. According to this embodiment, the number of channel regions is increased to five, and the channel density per unit area is increased. Furthermore, the turn-on voltage can be decreased. It should be noted that the number of trench grooves may be four or more.

(Third Embodiment)

Figure 14:
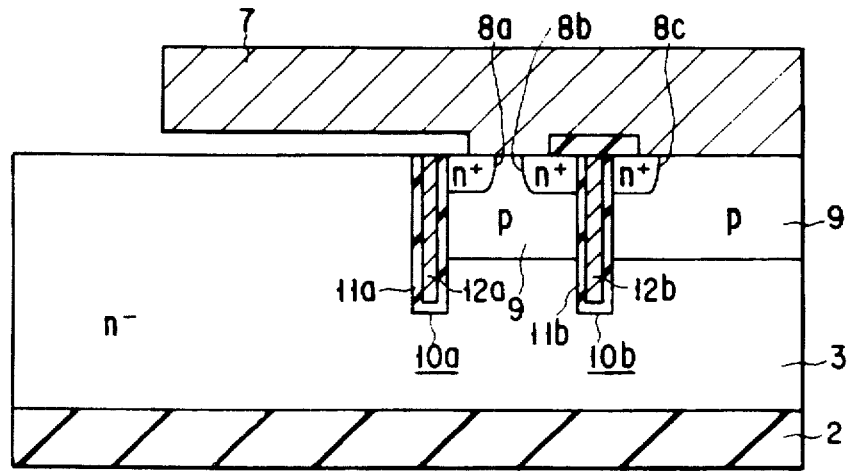
FIG. 14 is a cross-sectional view showing a main part (a source-side device structure) of the device structure of a lateral-type IGBT according to a third embodiment of the present invention.

FIG. 14 is a cross-sectional view showing a main part (a source-side device structure) of the device structure of a lateral-type IGBT according to a third embodiment of the present invention.

The lateral-type IGBT according to this embodiment differs from that of the first embodiment in that the floating-state p-type base layer 9, which is closest to the drain, of the p-type base layers 9 isolated by the trench grooves 10a and 10b, is removed.

With this structure, too, the same channel density as in the first embodiment is obtained. Therefore, the same advantage as in the first embodiment can be obtained.

(Fourth Embodiment)

Figure 15:
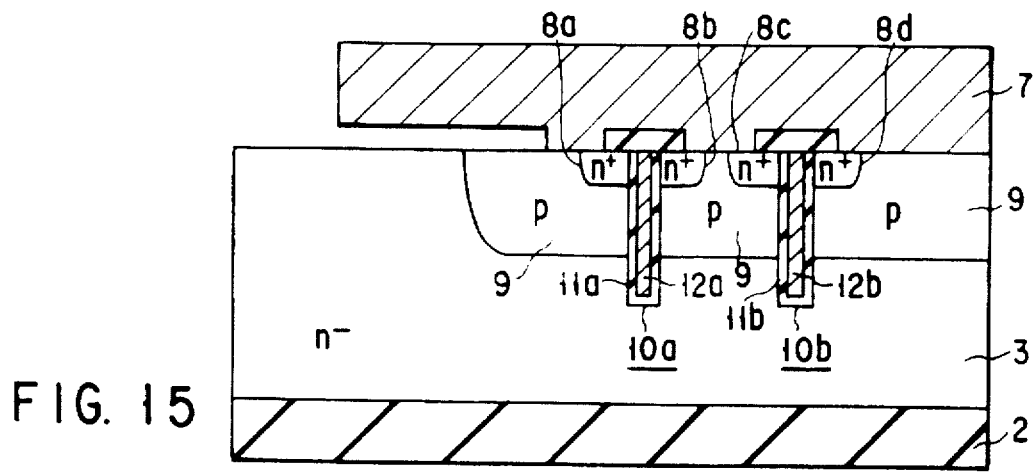
FIG. 15 is a cross-sectional view showing a main part (a source-side device structure) of the device structure of a lateral-type IGBT according to a fourth embodiment of the present invention.

FIG. 15 is a cross-sectional view showing a main part (a source-side device structure) of the device structure of a lateral-type IGBT according to a fourth embodiment of the present invention.

The lateral-type IGBT according to this embodiment differs from that of the first embodiment in that two pairs of n-type source layers 8a, 8b, 8c and 8d are formed on the upper side walls of the respective trench grooves 10a and 10b.

According to this embodiment, four channel regions are formed at the time of turn-on and in the turn-on state. Thus, a higher channel density is obtained than in the first embodiment. Furthermore, the turn-on voltage can be decreased.

The p-type base layer 9, which is closest to the drain, is put in contact with the source electrode 7. Thus, the anti-latch-up amount is increased and the turn-off speed can be improved.

(Fifth Embodiment)

Figure 16:
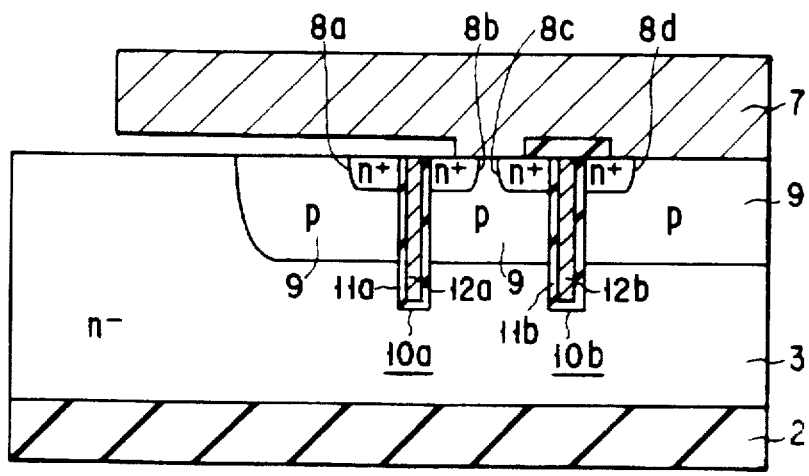
FIG. 16 is a cross-sectional view showing a main part (a source-side device structure) of the device structure of a lateral-type IGBT according to a fifth embodiment of the present invention.

FIG. 16 is a cross-sectional view showing a main part (a source-side device structure) of the device structure of a lateral-type IGBT according to a fifth embodiment of the present invention.

The lateral-type IGBT according to this embodiment differs from that of the fourth embodiment in that the source electrode 7 is out of contact with the p-type base layer 9, which is closest to the drain, and the n-type source layers 8a and 8b.

According to this embodiment, since the source electrode 7 is not in contact with the p-type base layer 9, it is possible at the time of turn-on to prevent holes from leaking out of the p-type source layer 9 which is closest to the drain. Therefore, the turn-off characteristics are improved.

(Sixth Embodiment)

Figure 17:
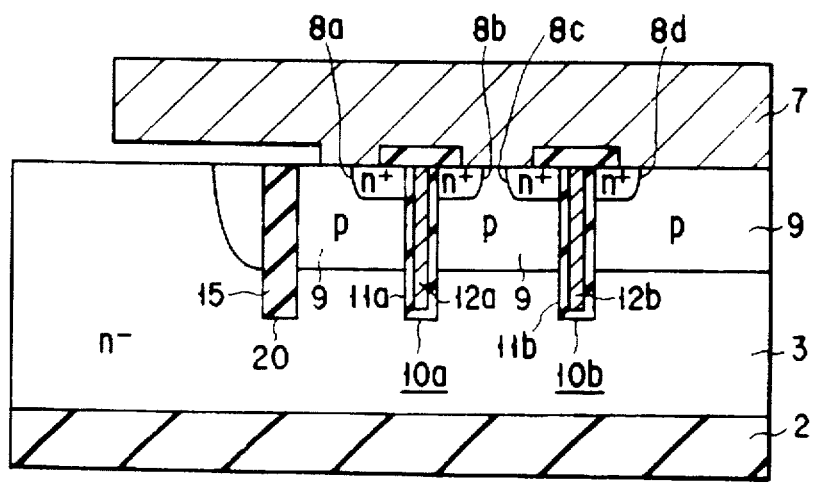
FIG. 17 is a cross-sectional view showing a main part (a source-side device structure) of the device structure of a lateral-type IGBT according to a sixth embodiment of the present invention.

FIG. 17 is a cross-sectional view showing a main part (a source-side device structure) of the device structure of a lateral-type IGBT according to a sixth embodiment of the present invention.

The lateral-type IGBT according to this embodiment differs from that of the fourth embodiment in that a trench groove 20 (dummy trench groove) filled with an oxide film 15 is provided in addition to the trench grooves 10a and 10b (trench gate grooves) constituting the gate portion of the n-type MOS transistor. The dummy trench groove 20 is located closer to the drain than the trench gate grooves 10a and 10b.

According to this embodiment, the dummy trench groove 20 can prevent holes from leaking out of the contact portion between the p-type base layer 9, which is closest to the drain, and the source electrode 7 at the time of turn-off. Thus, the accumulation of carriers (electrons) is more facilitated than in the fourth embodiment, and the turn-on characteristics are improved.

The aforementioned range of $1 \cdot d/w > 3.45 \times 10^{-5} |cm|$ is also applicable to the dummy trench groove and trench gate groove.

(Seventh Embodiment)

Figure 18:
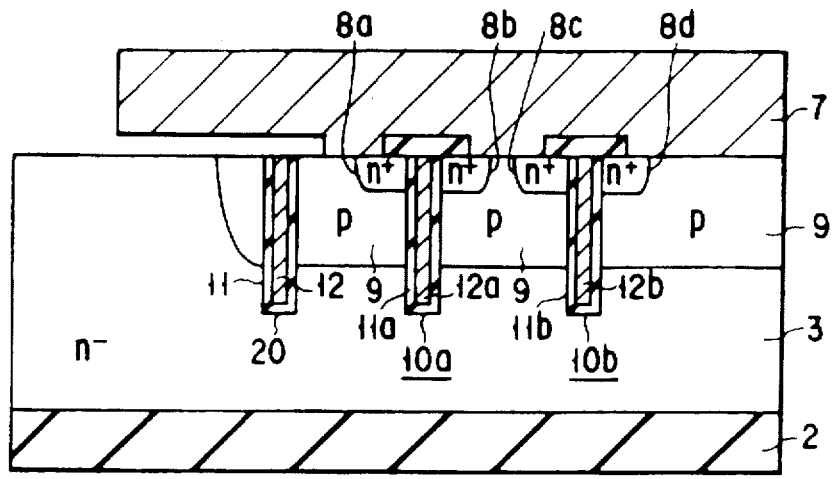
FIG. 18 is a cross-sectional view showing a main part (a source-side device structure) of the device structure of a lateral-type IGBT according to a seventh embodiment of the present invention.

FIG. 18 is a cross-sectional view showing a main part (a source-side device structure) of the device structure of a lateral-type IGBT according to a seventh embodiment of the present invention.

The lateral-type IGBT according to this embodiment differs from that of the sixth embodiment in that the dummy trench groove 20 has the same structure as that of each of the trench gate grooves 10a and 10b and a trench gate electrode 12 provided in the dummy trench groove 20 is set in the floating state.

According to this embodiment, the dummy trench groove 20 and trench gate grooves 10a and 10b can be formed in the same step. Therefore, the manufacturing process is simplified, as compared to the sixth embodiment.

(Eighth Embodiment)

Figure 19:
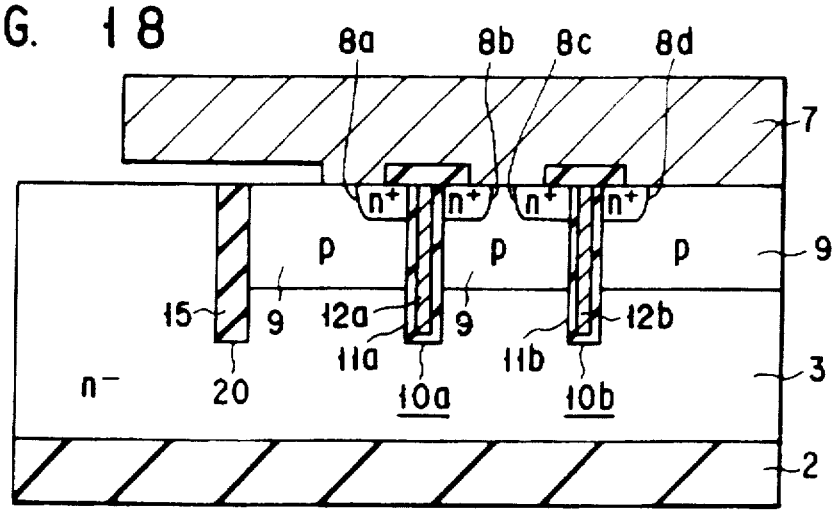
FIG. 19 is a cross-sectional view showing a main part (a source-side device structure) of the device structure of a lateral-type IGBT according to an eighth embodiment of the present invention.

FIG. 19 is a cross-sectional view showing a main part (a source-side device structure) of the device structure of a lateral-type IGBT according to an eighth embodiment of the present invention.

The lateral-type IGBT according to this embodiment differs from that of the sixth embodiment in that the dummy trench groove 20 is formed at an end portion of the p-type base layer 9. In this embodiment, too, the same advantage as in the sixth embodiment can be obtained.

(Ninth Embodiment)

Figure 20:
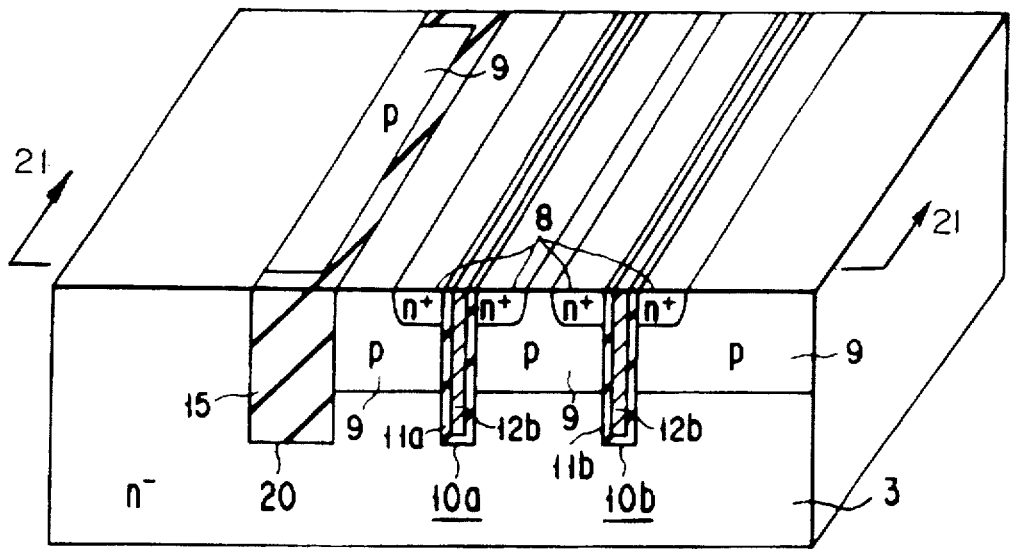
FIG. 20 is a cross-sectional perspective view showing a main part (a source-side device structure) of the device structure of a lateral-type IGBT according to a ninth embodiment of the present invention.

FIG. 20 is a cross-sectional perspective view showing a main part (a source-side device structure) of the device structure of a lateral-type IGBT according to a ninth embodiment of the present invention. FIG. 21 is a cross-sectional view of the lateral-type IGBT, taken along line 21—21 in FIG. 20.

In this embodiment, the dummy trench groove 20 provided in the eighth embodiment is modified to have a planar pattern as shown in FIG. 20.

According to this embodiment, even if the distance between the dummy trench groove 20 and trench gate groove 10 is reduced, the p-type base layer 9, which is is closest to the drain, can be set in the floating state.

FIGS. 22 to 24 show planar patterns of the dummy trench grooves with which the same advantage as in the ninth embodiment can be obtained.

FIG. 22 shows a dummy trench groove 20a with a rectangular planar pattern. FIG. 23 shows a dummy trench groove 20b with a planar pattern consisting of a plurality of rectangles. FIG. 24 shows a dummy trench groove 20c with a comb-shaped planar pattern.

(Tenth Embodiment)

FIG. 25 is a plan view of a lateral-type IGBT according to a 10th embodiment of the present invention, wherein the pattern between the trench grooves in the first embodiment is modified. FIG. 26 is a cross-sectional view of the lateral-type IGBT, taken along line 26—26 in FIG. 25. FIG. 27 is a cross-sectional view of the lateral-type IGBT, taken along line 27—27 in FIG. 25.

In this embodiment, the n-type source layer 8 is formed between the trench gate grooves 10a and 10b so as to surround a plurality of p-type base layers 9.

In this embodiment, too, since a plurality of channel regions are formed within the device, the same advantage as in the first embodiment can be obtained.

If the number of trench gate grooves 10a and 10b increases, this planar pattern is repeated.

FIGS. 25 to 27 show, in particular, the region sandwiched between the trench grooves, and do not show an embodiment in which two channels are formed by two trench gates.

(Eleventh Embodiment)

FIG. 28 is a plan view of a lateral-type IGBT according to an eleventh embodiment of the present invention. FIG. 29 is a cross-sectional view of the lateral-type IGBT, taken along line 29—29 in FIG. 28. FIG. 30 is a cross-sectional view of the lateral-type IGBT, taken along line 30—30 in FIG. 28.

In this embodiment, p-type base layers 9 and n-type source layers 8 are alternately formed so as to be substantially perpendicular to the trench gate grooves 10.

In the case of this embodiment, unlike the embodiment shown in FIG. 25, a channel cannot be formed in a region where the n-type source layer 8 is not provided on the side walls of the trench gate grooves 10. Instead, the distance between the trench gate grooves can be reduced and therefore the channel density can be increased and the same advantage as in the preceding embodiments can be obtained.

(Twelfth Embodiment)

FIG. 31 is a cross-sectional view showing a main part (a source-side device structure) of the device structure of a lateral-type IGBT according to a twelfth embodiment of the present invention.

The lateral-type IGBT according to this embodiment differs from that of the sixth embodiment in that the dummy trench groove 20 is formed so as to be deeper than the trench gate grooves 10a and 10b.

According to this embodiment, it is possible to more effectively prevent holes from leaking out of the contact portion between the p-type base layer 9, which is closest to the drain, and the source electrode 7. In addition, the turn-on characteristics can be improved.

(13th Embodiment)

FIG. 32 is a cross-sectional view showing a main part (a source-side device structure) of the device structure of a lateral-type IGBT according to a 13th embodiment of the present invention.

In this embodiment, the trench gate groove 10c, which is farthest from the drain, is formed so as to reach the bottom of the n-type silicon active layer 2. In other words, the trench gate groove 10c is deeper than the other trench gate grooves 10a and 10b.

(14th Embodiment)

Figure 33:
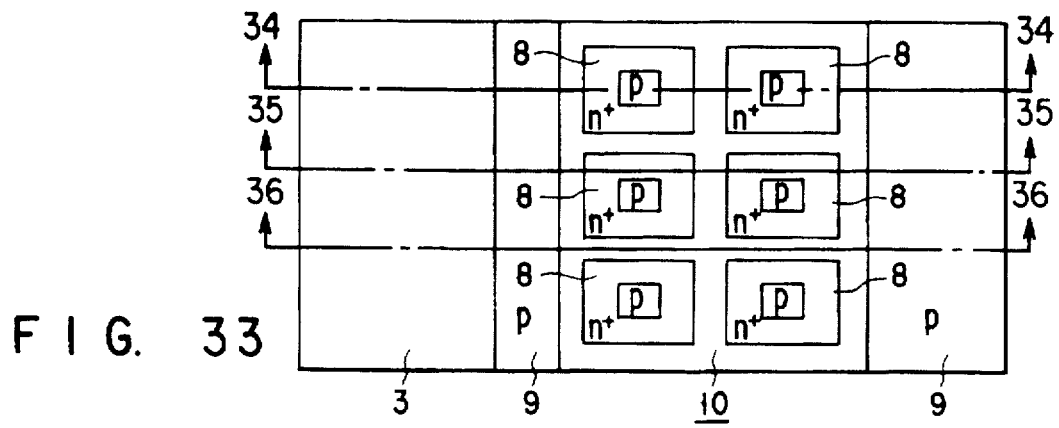
FIG. 33 is a plan view showing a main part (a source-side device structure) of the device structure of a lateral-type IGBT according to a 14th embodiment of the present invention.
Figure 34:
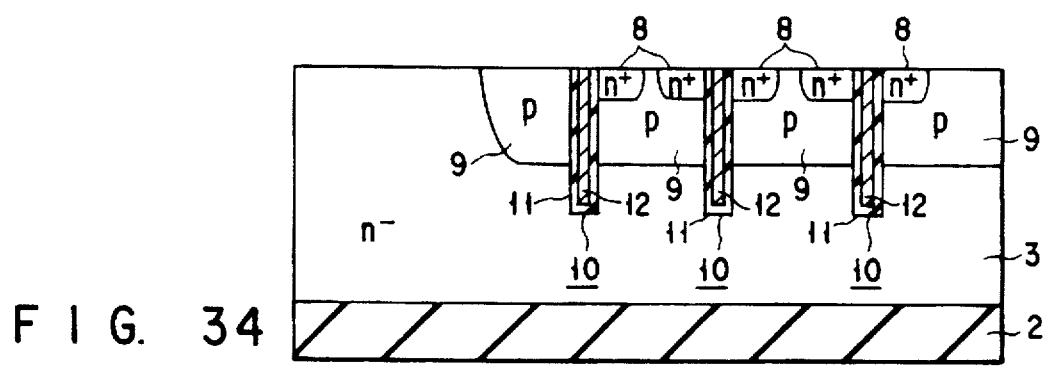
FIG. 34 is a cross-sectional view of the lateral-type IGBT, taken along line 34—34 in FIG. 33.
Figure 35:
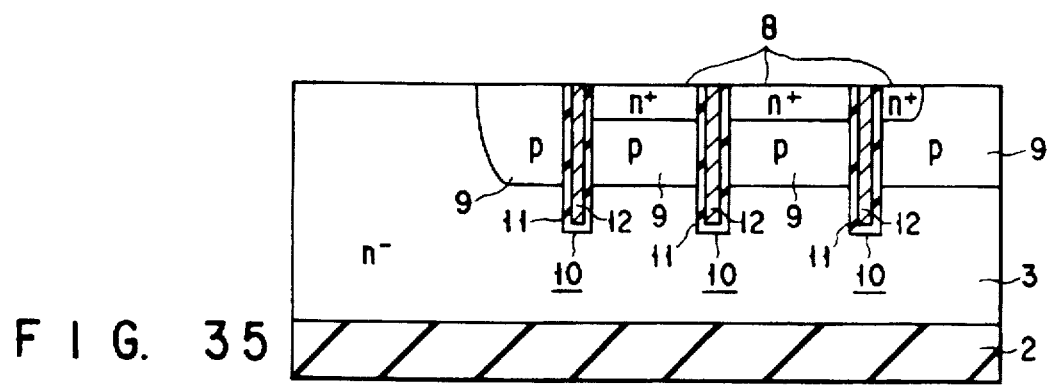
FIG. 35 is a cross-sectional view of the lateral-type IGBT, taken along line 35—35 in FIG. 33.
Figure 36:
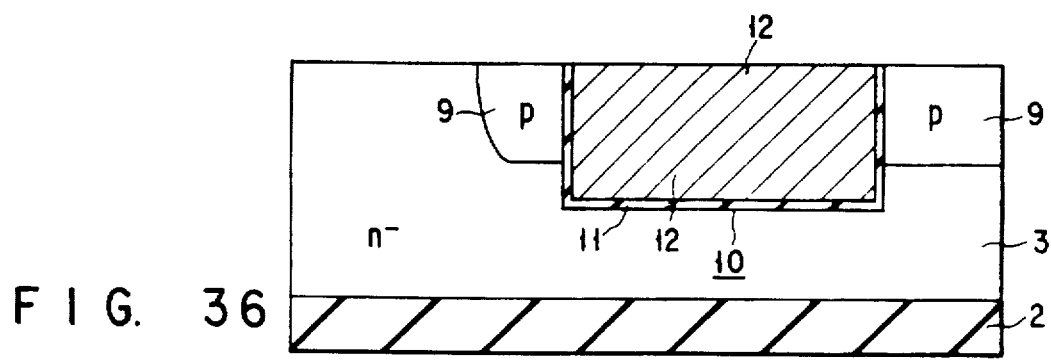
FIG. 36 is a cross-sectional view of the lateral-type IGBT, taken along line 36—36 in FIG. 33.

FIG. 33 is a plan view showing a main part (a source-side device structure) of the device structure of a lateral-type IGBT according to a 14th embodiment of the present invention. FIG. 34 is a cross-sectional view of the lateral-type IGBT, taken along line 34—34 in FIG. 33. FIG. 35 is a cross-sectional view of the lateral-type IGBT, taken along line 35—35 in FIG. 33. FIG. 36 is a cross-sectional view of the lateral-type IGBT, taken along line 36—36 in FIG. 33.

This embodiment is characterized in that the trench gate grooves 10 are formed in a lattice-like structure.

According to this embodiment, the p-type base layers 9 are surrounded by the n-type source layers 8. Thus, channel regions can be formed on all side walls of the trench gate grooves 10 and the channel density can be further increased.

(15th Embodiment)

Figure 37:
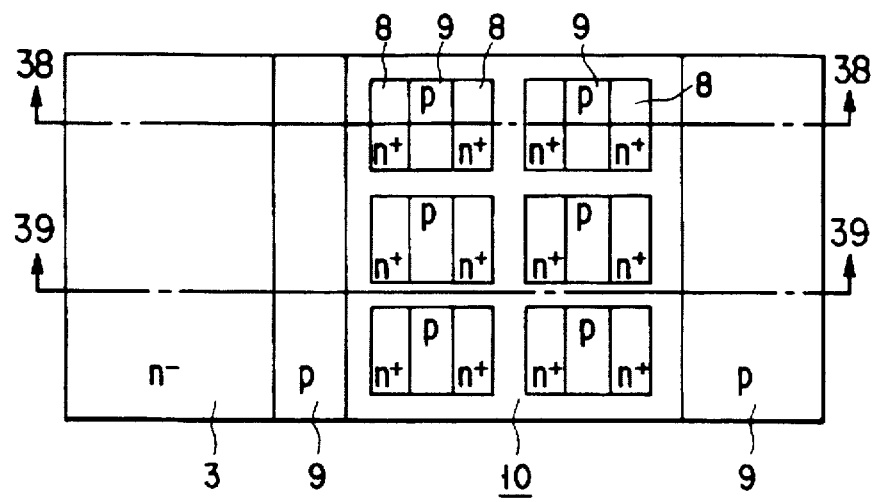
FIG. 37 is a plan view showing a main part (a source-side device structure) of the device structure of a lateral-type IGBT according to a 15th embodiment of the present invention.
Figure 38:
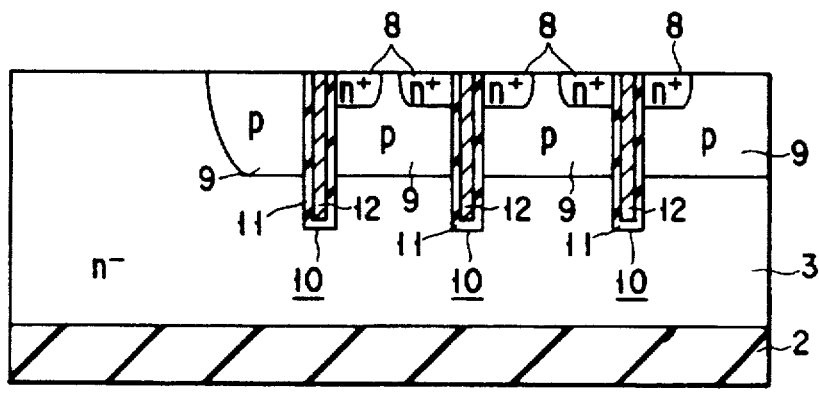
FIG. 38 is a cross-sectional view of the lateral-type IGBT, taken along line 38—38 in FIG. 37.
Figure 39:
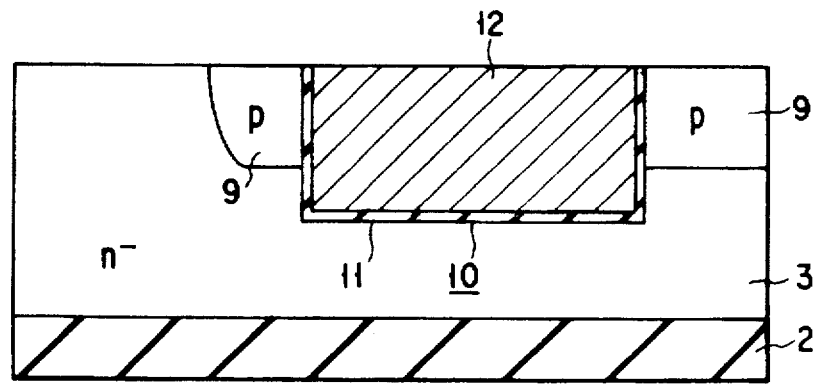
FIG. 39 is a cross-sectional view of the lateral-type IGBT, taken along line 39—39 in FIG. 37.

FIG. 37 is a plan view showing a main part (a source-side device structure) of the device structure of a lateral-type IGBT according to a 15th embodiment of the present invention. FIG. 38 is a cross-sectional view of the lateral-type IGBT, taken along line 38—38 in FIG. 37. FIG. 39 is a cross-sectional view of the lateral-type IGBT, taken along line 39—39 in FIG. 37.

The lateral-type IGBT according to this embodiment differs from that of the 14th embodiment in that parts of the p-type base layer 9 (i.e. two faces parallel to the longitudinal direction of the p-type drain layer) are surrounded by the n-type source layers 8.

According to this embodiment, the distance between the trench gate grooves extending in parallel to the line 38 —38 can be reduced, and the channel density can be increased.

(16th Embodiment)

FIG. 40 is a plan view showing a main part (a source-side device structure) of the device structure of a lateral-type IGBT according to a 16th embodiment of the present invention. FIG. 41 is a cross-sectional view of the lateral-type IGBT, taken along line 41—41 in FIG. 40. FIG. 42 is a cross-sectional view of the lateral-type IGBT, taken along line 42—42 in FIG. 40. FIG. 43 is a cross-sectional view of the lateral-type IGBT, taken along line 43—43 in FIG. 40.

The lateral-type IGBT according to this embodiment differs from that of the 14th embodiment in that parts of the p-type base layer 9 (i.e. two faces perpendicular to the longitudinal direction of the p-type drain layer) are surrounded by the n-type source layers 8.

According to this embodiment, the distance between the trench gate grooves extending perpendicularly to the line 41—41 can be reduced, and the channel density can be increased.

(17th Embodiment)

Figure 44:
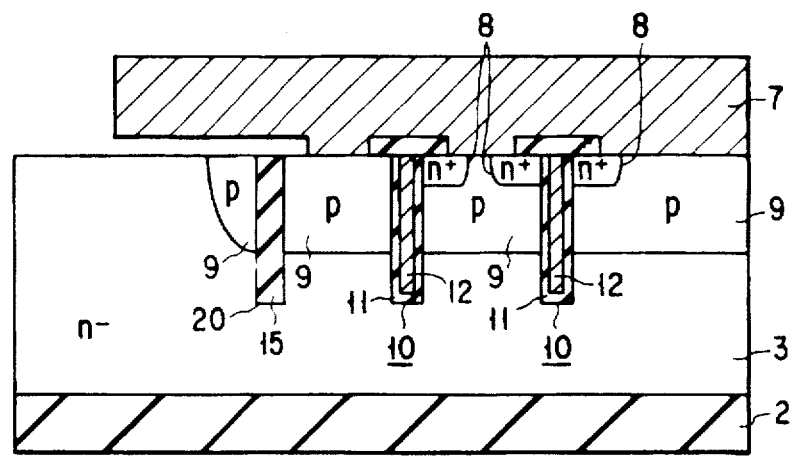
FIG. 44 is a cross-sectional view showing a main part (a source-side device structure) of the device structure of a lateral-type IGBT according to a 17th embodiment of the present invention.

FIG. 44 is a cross-sectional view showing a main part (a source-side device structure) of the device structure of a lateral-type IGBT according to a 17th embodiment of the present invention.

The lateral-type IGBT according to this embodiment differs from that of the sixth embodiment in that the n-type source layer 8 is not formed between the dummy trench groove 20 and the adjacent trench gate groove 10 and a channel region is not formed in this region.

According to this embodiment, the region including no channel region functions as a bypass of holes at the time of turn-off, and the turn-off characteristics are improved. In addition, the dummy trench groove 20 prevents holes from leaking out of the p-type base layer 9 which is closest to the drain at the time of turn-on. Thus, excellent turn-on characteristics can be maintained.

(18th Embodiment)

Figure 45:
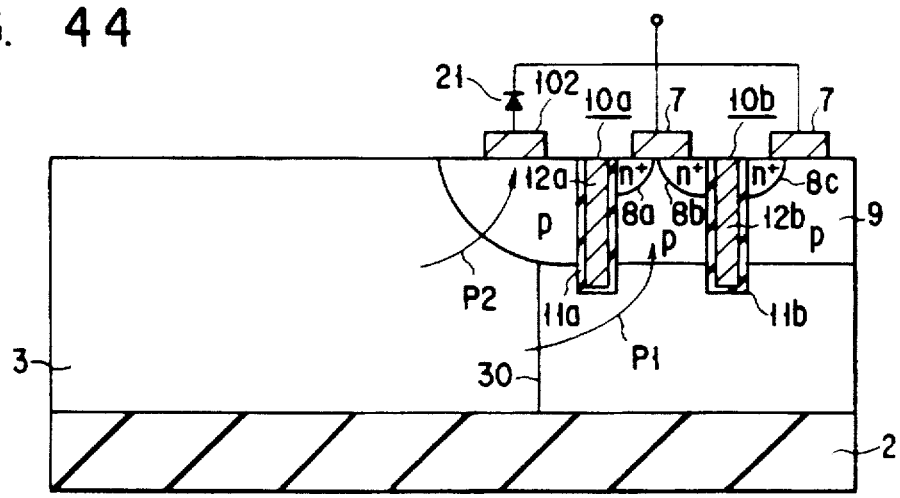
FIG. 45 is a cross-sectional view showing a main part (a source-side device structure) of the device structure of a lateral-type IGBT according to a 18th embodiment of the present invention.

FIG. 45 is a cross-sectional view showing a main part (a source-side device structure) of the device structure of a lateral-type IGBT according to a 18th embodiment of the present invention.

The lateral-type IGBT according to this embodiment differs from that of the first embodiment mainly in that a diode 21 is provided on the p-type base layer 9, which is closest to the drain, via an electrode 102 interposed.

When the IGBT is turned off, a depletion layer 30 is formed below the p-type base layer 9. At this time, a hole discharge path p1 constituted by the depletion layer 30, p-type base layers 9 and source electrodes 7 is restrained by the presence of the trench gate grooves 10, and the turn-off is delayed.

However, since the voltage drop of the diode 21 is less than that of the depletion layer 30, holes in the device are effectively discharged through a hole discharge path p2 constituted by the p-type base layer 9 and the diode 21. Thus, excellent turn-off characteristics are obtained.

On the other hand, while the IGBT is being conductive, the potential of the p-type base layer 9 (closest to the drain) provided with the diode 21 is higher than that of the other p-type base layer 9 by about 0.7V (in the case of silicon), the discharge of holes from the p-type base layer 9 is prevented and excellent turn-on characteristics are obtained.

Instead of providing the diode 21, a Schottky electrode may be substituted for the electrode 102 provided on the p-type base layer 9 closest to the drain.

(19th Embodiment)

Figure 46:
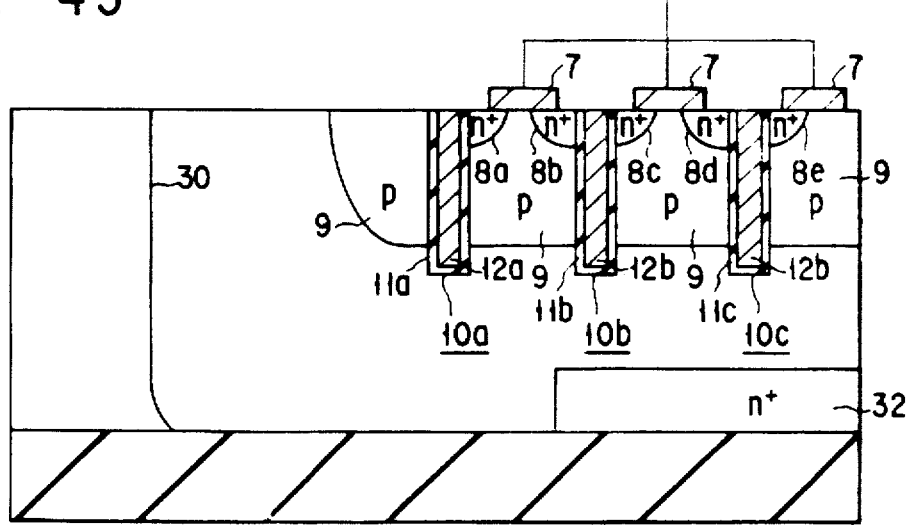
FIG. 46 is a cross-sectional view showing a main part (a source-side device structure) of the device structure of a lateral-type IGBT according to a 19th embodiment of the present invention.

FIG. 46 is a cross-sectional view showing a main part (a source-side device structure) of the device structure of a lateral-type IGBT according to a 19th embodiment of the present invention.

This embodiment is characterized in that an n-type semiconductor layer 32 with a high impurity concentration is provided in a bottom portion of the n-type silicon active layer 3 below the p-type base layer 9.

According to this embodiment, electrons injected in the n-type silicon active layer 3 from the n-type source layer 8 via the channel region flow in the device via the n-type semiconductor layer 32, the resistance of the electron current can be reduced.

Thus, even if a number of trench gate grooves 10a, 10b and 10c are arranged, the n-type MOS transistor contributes to effective injection of electrons. Therefore, a decrease in turn-on voltage, which corresponds to the number of trench gate grooves 10a, 10b and 10c, can be expected.

Furthermore, by virtue of the depletion layer 30 formed just below the p-type base layer 9, the n-type semiconductor layer 32 is set in the floating state and an increase in potential is prevented. Therefore, the breakdown voltage is not decreased.

(20th Embodiment)

Figure 47:
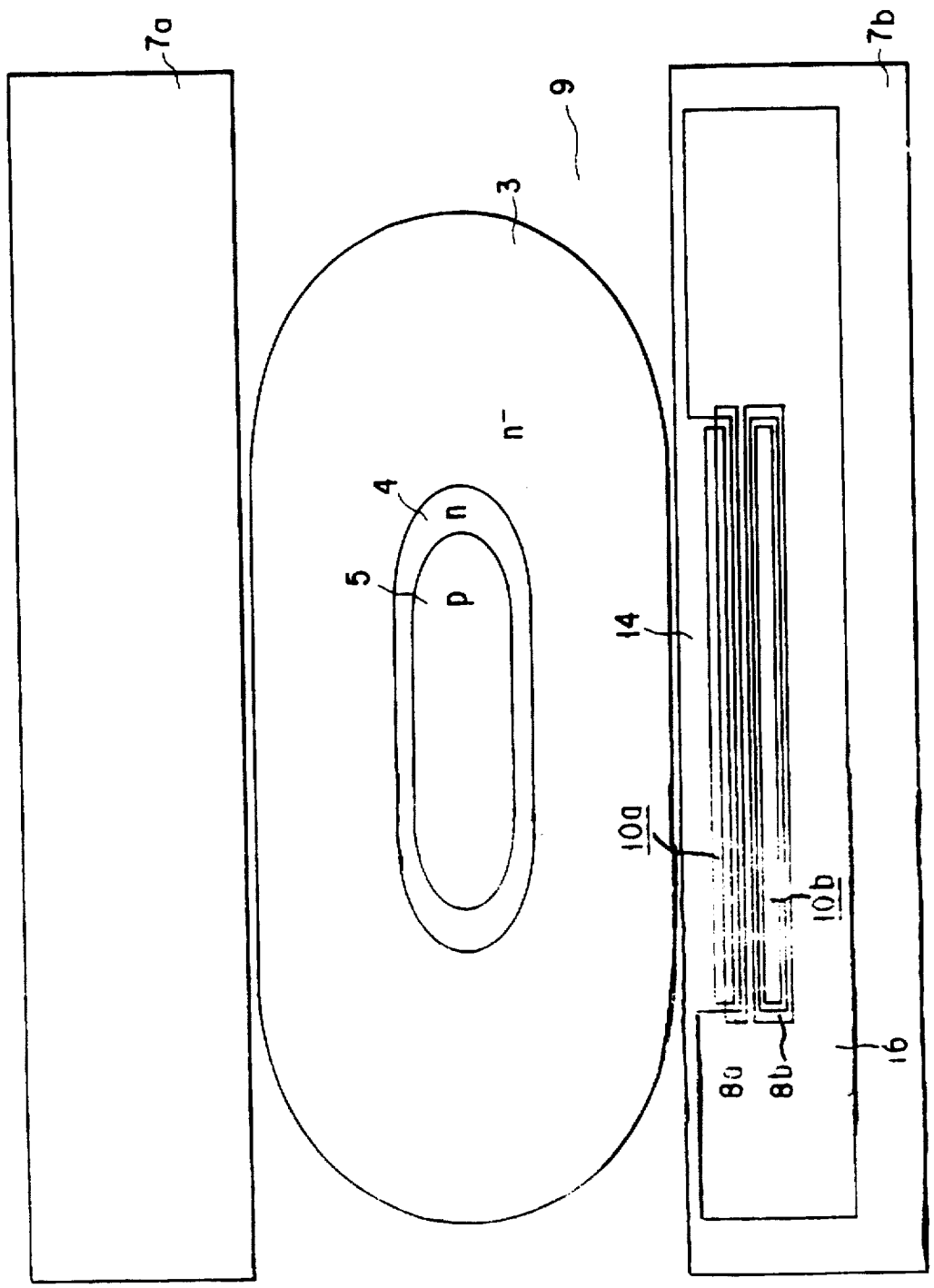
FIG. 47 is a plan view showing the device structure of a lateral-type IGBT according to a 20th embodiment of the present invention.

FIG. 47 is a plan view showing the device structure of a lateral-type IGBT according to a 20th embodiment of the present invention. In FIG. 47, a source electrode 7a has the same internal structure as a source electrode 7b. Thus, the internal structure of the upper-side source electrode 7a is not shown. Reference numeral 16 shows a contact hole between the source electrode 7b and the underlying structure.

The lateral-type IGBT of this embodiment is of the type wherein each layer is formed concentrically. A p-type base region 14 positioned under the source electrode 7b is not put in direct contact with the source electrode 7b. Since holes do not directly flow into the region 14, electrons are accumulated below the trench gate grooves 10a and 10b and electrons can be injected also from an inner one of a plurality of trench gates.

(21st Embodiment)

Figure 48:
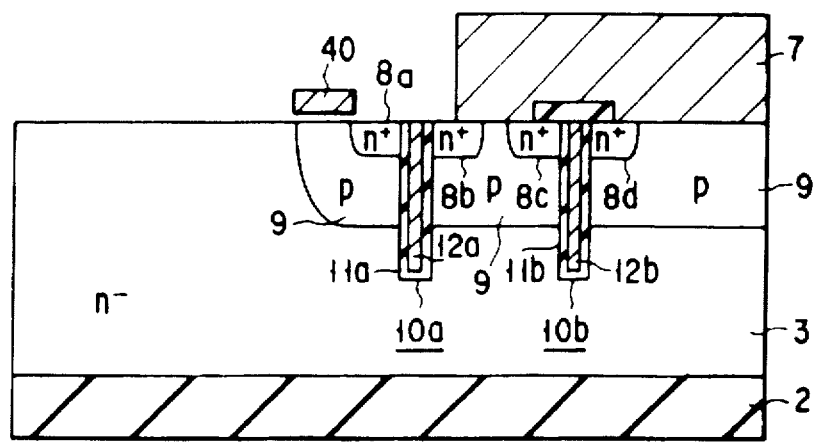
FIG. 48 is a cross-sectional view showing a main part (a source-side device structure) of the device structure of a lateral-type IGBT according to a 21st embodiment of the present invention.

FIG. 48 is a cross-sectional view showing a main part (a source-side device structure) of the device structure of a lateral-type IGBT according to a 21st embodiment of the present invention.

This embodiment is characterized in that a gate electrode 40 is provided on the p-type base layer 9 between the n-type source layer 8a (closest to the drain) and the n-type silicon active layer 3, with a gate insulating film (not shown) interposed.

Specifically, the trench-gate MOS transistor is combined with the surface-gate MOS transistor.

In this embodiment, too, the turn-on characteristics are improved by the presence of the MOS transistor of the trench gate, as compared to the conventional lateral-type IGBT with the surface-gate MOS transistor alone.

(22nd Embodiment)

Figure 49:
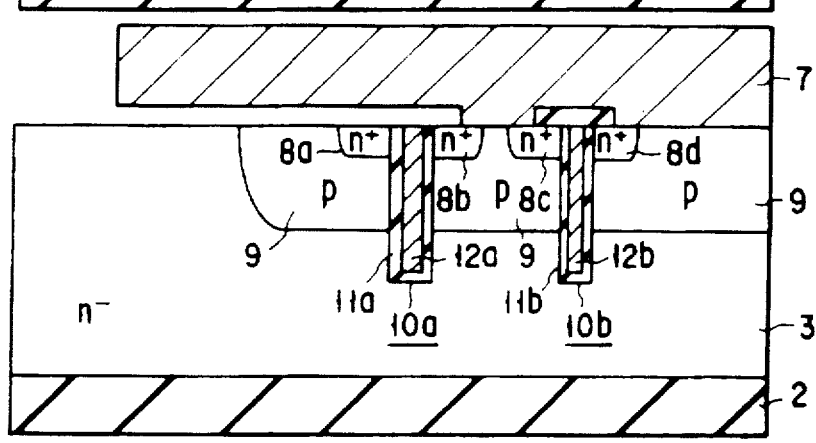
FIG. 49 is a cross-sectional view showing a main part (a source-side device structure) of the device structure of a lateral-type IGBT according to a 22nd embodiment of the present invention.

FIG. 49 is a cross-sectional view showing a main part (a source-side device structure) of the device structure of a lateral-type IGBT according to a 22nd embodiment of the present invention.

This embodiment is characterized in that the gate oxide film 11a in the trench gate groove 10 closest to the drain is thickest of all the gate oxide films.

Thereby, it is possible to effectively prevent a channel from being formed on the trench gate side surface which is closest to the drain.

(23rd Embodiment)

Figure 50:
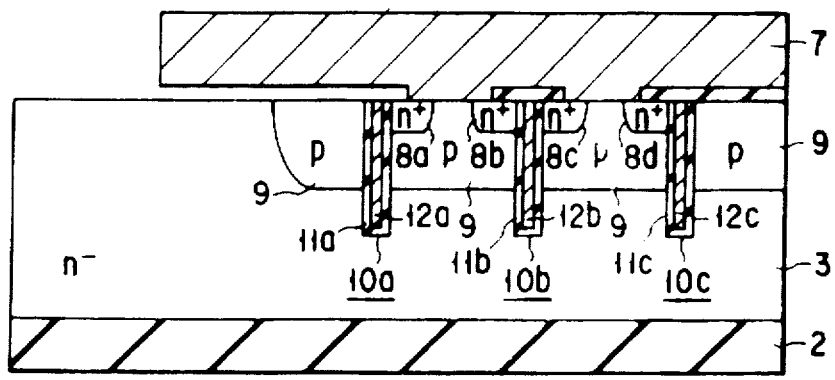
FIG. 50 is a cross-sectional view showing a main part (a source-side device structure) of the device structure of a lateral-type IGBT according to a 23rd embodiment of the present invention.

FIG. 50 is a cross-sectional view showing a main part (a source-side device structure) of the device structure of a lateral-type IGBT according to a 23rd embodiment of the present invention.

This embodiment is characterized in that the source electrode 7 is not put in contact with that portion of the p-type base source layer in which the trench gate groove 10c farthest from the drain is formed but the n-type source layer is not formed.

According to this embodiment, it is possible to prevent holes from being discharged to the source electrode 7 from the p-type base layer where the n-type source layers 8a, 8b, 8c and 8d are formed.

(24th Embodiment)

Figure 51:
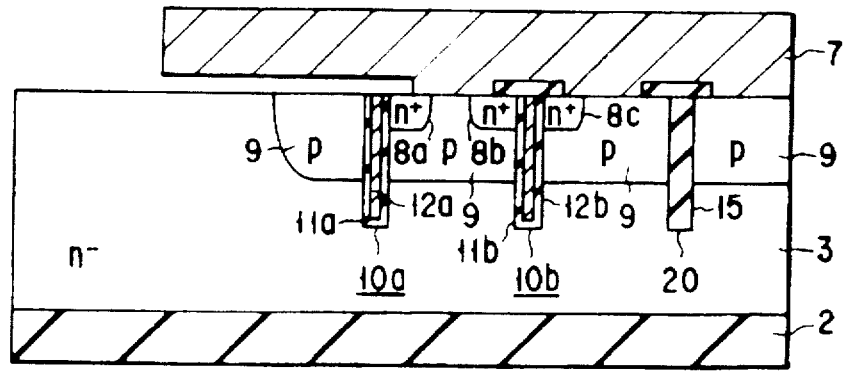
FIG. 51 is a cross-sectional view showing a main part (a source-side device structure) of the device structure of a lateral-type IGBT according to a 24th embodiment of the present invention.

FIG. 51 is a cross-sectional view showing a main part (a source-side device structure) of the device structure of a lateral-type IGBT according to a 24th embodiment of the present invention.

This embodiment is characterized in that a dummy trench groove 20 is formed on the source side of the trench gate groove 10b which is farthest from the drain.

According to this embodiment, carriers (electrons) can be effectively accumulated in the region where the trench gate grooves 10a and 10b are formed, by virtue of the presence of the dummy trench groove 20. Therefore, excellent turn-on characteristics can be obtained.

(25th Embodiment)

Figure 52:
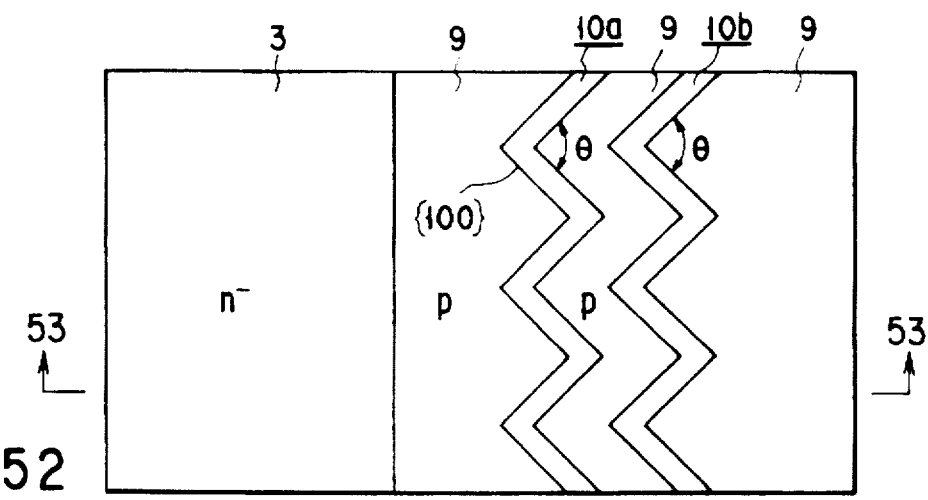
FIG. 52 is a plan view showing the device structure of a lateral-type IGBT according to a 25th embodiment of the present invention.
Figure 53:
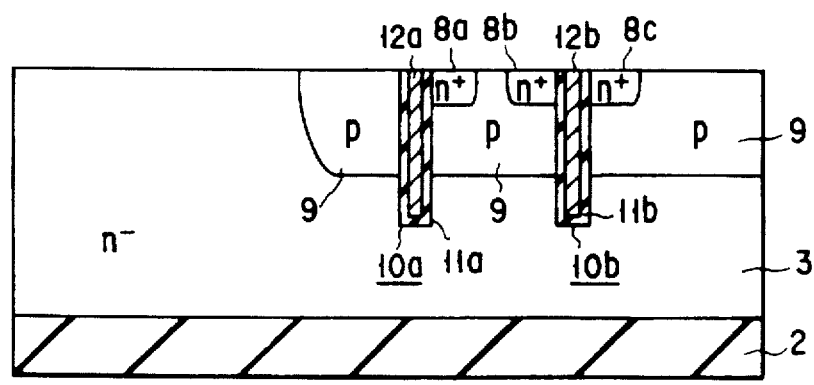
FIG. 53 is a cross-sectional view of the lateral-type IGBT, taken along line 53—53 in FIG. 52.

FIG. 52 is a plan view showing a main part (a source-side device structure) of the device structure of a lateral-type IGBT according to a 25th embodiment of the present invention. FIG. 53 is a cross-sectional view of the lateral-type IGBT, taken along line 53—53 in FIG. 52.

This embodiment is characterized in that trench gate grooves 10 with a sawtooth planar pattern are formed. It is desirable that the face orientation of each side wall of all trench gate grooves 10a and 10b be {100}. In this case, the angle of each tooth edge is 90.

According to this embodiment, the area of each trench gate groove 10a, 10b is greater than in the case of using stripe-shaped trench gate grooves. Thus, the channel area increases and therefore the turn-on resistance can be further decreased.

(26th Embodiment)

Figure 54:
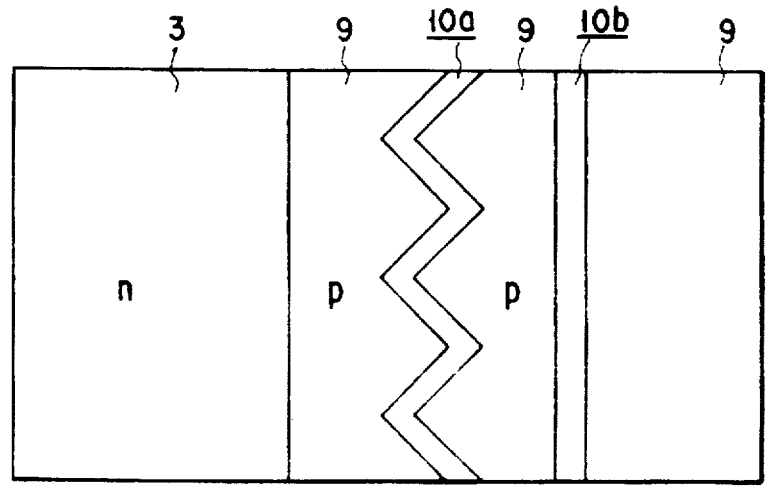
FIG. 54 is a plan view showing the device structure of a lateral-type IGBT according to a 26th embodiment of the present invention.

FIG. 54 is a plan view showing a main part (a source-side device structure) of the device structure of a lateral-type IGBT according to a 26th embodiment of the present invention.

The lateral-type IGBT according to this embodiment differs from that of the 25th embodiment in that only the trench gate groove 10a closest to the drain is formed in a sawtooth pattern. The other trench gate groove 10b is formed in a stripe pattern. The effect of the trench gate groove decreases gradually away from the drain. In order to effectively decrease the turn-on resistance, it is important to increase the channel area formed by the trench gate groove 10a closest to the drain. In this embodiment, the area of the side wall of the trench gate groove becomes greater than in the case of using only stripe-shaped trench gate grooves. Thus, the channel area increases and therefore the turn-on resistance can be further decreased.

(27th Embodiment)

Figure 55:
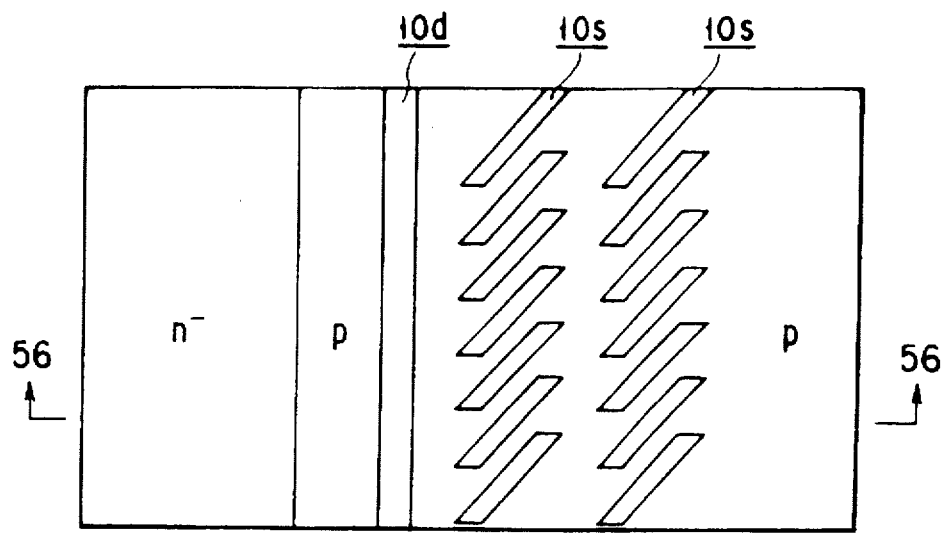
FIG. 55 is a plan view showing the device structure of a lateral-type IGBT according to a 27th embodiment of the present invention.
Figure 56:
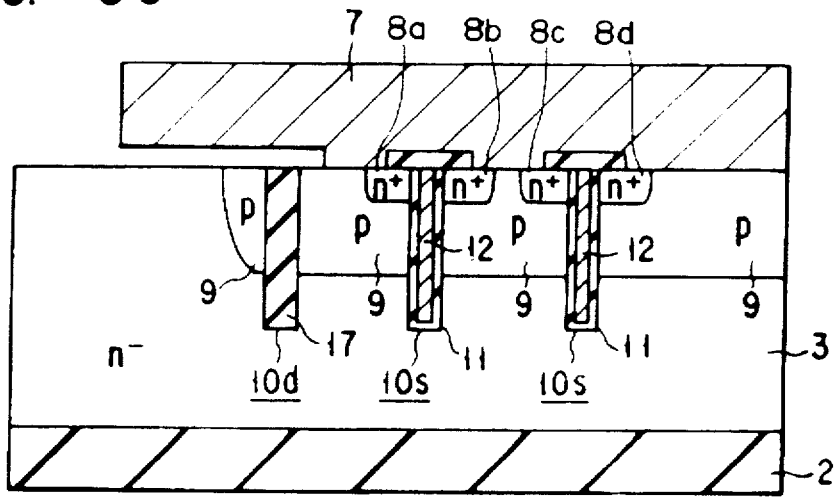
FIG. 56 is a cross-sectional view of the lateral-type IGBT, taken along line 56—56 in FIG. 55.

FIG. 55 is a plan view showing a main part (a source-side device structure) of the device structure of a lateral-type IGBT according to a 27th embodiment of the present invention. FIG. 56 is a cross-sectional view of the lateral-type IGBT, taken along line 56—56 in FIG. 55.

This embodiment is characterized in that short trench gates 10s are arranged diagonally along the drain. Thereby, the channel area is increased.

A stripe-shaped dummy trench groove 10d in which an oxide film 17 is buried is formed in a drift region located on the drain side of the trench gate grooves 10s. Thereby, it is possible to reduce a Hall current emitted from the source electrode 7 (in particular, the region put in contact with the p-type base layer 9 and n-type source layer 8 of the trench gate groove closest to the drain). Therefore, carriers can be effectively accumulated in the n-type silicon active layer below the discontinuously arranged trench gate grooves 10s, and excellent turn-on characteristics can be obtained.

Furthermore, in this embodiment, a pair of trench gate grooves 10s are provided with two pairs of n-type source layers 8a, 8b, 8c and 8d. Thus, two trench gate grooves 10s are provided with four channels.

Thus, the channel density increases, as compared to the case of FIG. 3. Even if the amount of discharged Hall current is slightly increased to improve the turn-off characteristics, the turn-on characteristics are not degraded. Therefore, according to the present embodiment, both turn-on characteristics and turn-off characteristics can easily be improved.

(28th Embodiment)

Figure 57:
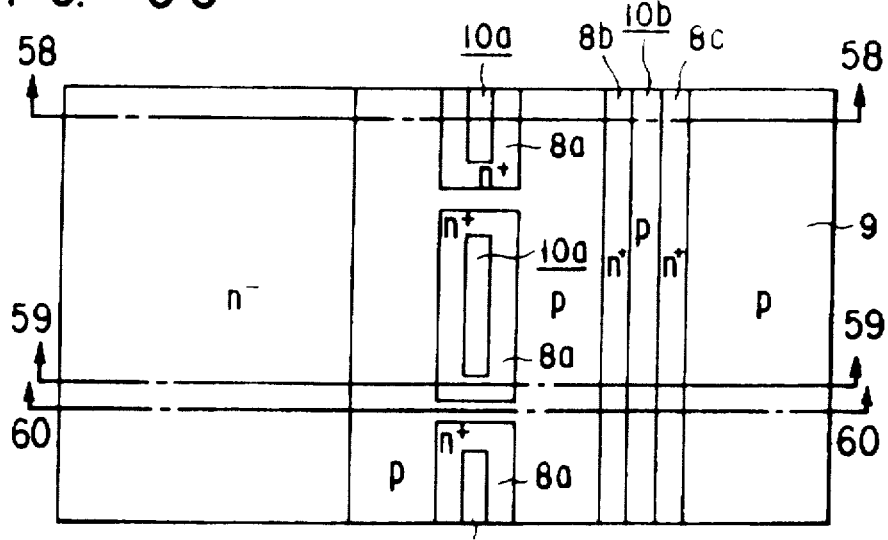
FIG. 57 is a plan view showing the device structure of a lateral-type IGBT according to a 28th embodiment of the present invention.
Figure 58:
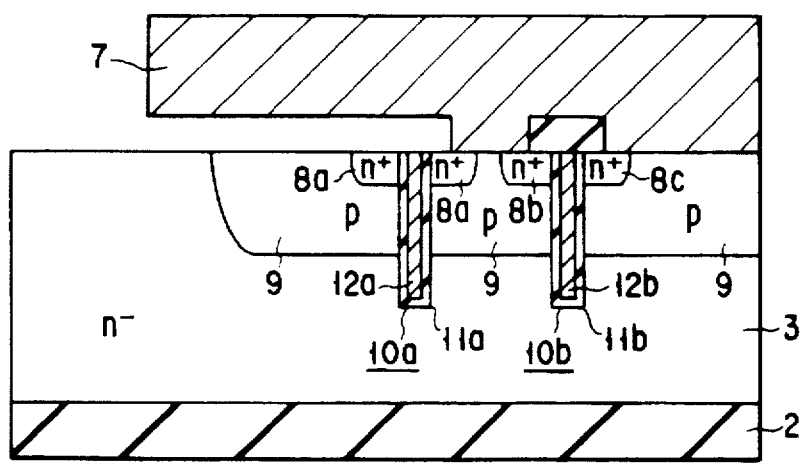
FIG. 58 is a cross-sectional view of the lateral-type IGBT, taken along line 58—58 in FIG. 57.
Figure 59:
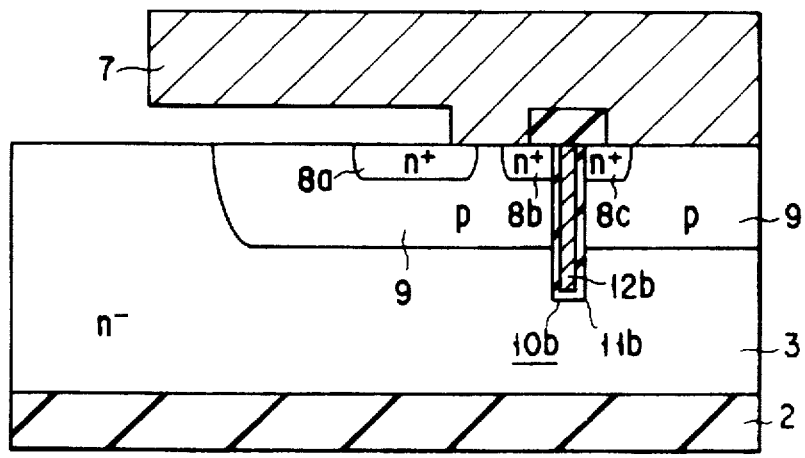
FIG. 59 is a cross-sectional view taken along line 59—59 in FIG. 57.

FIG. 57 is a plan view showing a main part (a source-side device structure) of the device structure of a lateral-type IGBT according to a 28th embodiment of the present invention. FIG. 58 is a cross-sectional view of the lateral-type IGBT, taken along line 58—58 in FIG. 57. FIG. 59 is a cross-sectional view taken along line 59—59 in FIG. 57, and FIG. 60 is a cross-sectional view taken along line 60—60 in FIG. 57.

The lateral-type IGBT according to this embodiment differs from that of the 27th embodiment in that the discharge of a Hall current is restrained without using the dummy trench groove.

Specifically, in this embodiment, as shown in FIG. 58, the source electrode 7 is formed so as to come in contact with the p-type base layer 9 and n-type source layer 8 adjacent to the trench gate groove 10a closest to the drain. Thereby, a Hall current is prevented from leaking out of the source electrode 7.

Figure 60:
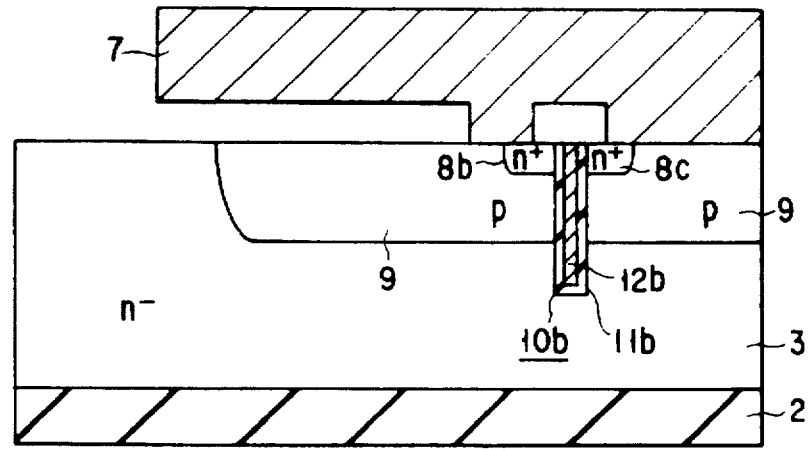
FIG. 60 is a cross-sectional view taken along line 60—60 in FIG. 57.

As is shown in FIGS. 59 and 60, the p-type base layer 9 and n-type source layer 8 in this region is put in contact with the source electrode 7 in a region where the trench gate groove 10a closest to the drain is not formed.

In this embodiment, too, the discharge of the Hall current is prevented and the channel density is increased. Therefore, like the embodiment shown in FIG. 27, the turn-on characteristics can be improved.

(29th Embodiment)

FIG. 61 is a plan view showing the device structure of a lateral-type IGBT according to a 29th embodiment of the present invention. FIG. 62 is a cross-sectional view of the lateral-type IGBT, taken along line 62—62 in FIG. 61.

The lateral-type IGBT according to this embodiment differs from that of the 28th embodiment in that a dummy trench groove 20 is added. According to this embodiment, the discharge of the Hall current is more difficult than in the 28th embodiment and therefore the turn-on characteristics can be further improved.

(30th Embodiment)

Figure 63:
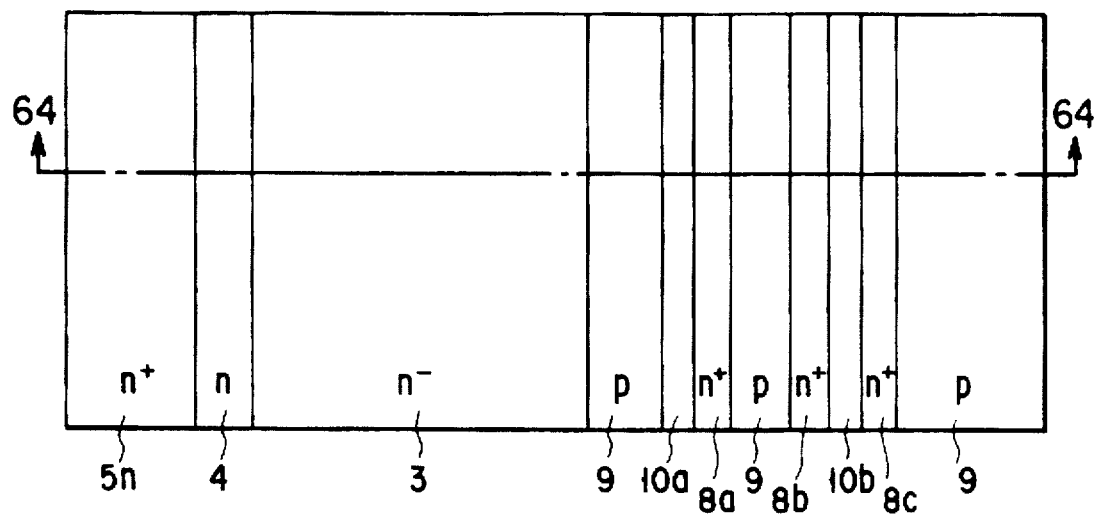
FIG. 63 is a plan view showing the device structure of a lateral-type power MOSFET according to a 30th embodiment of the present invention.
Figure 64:
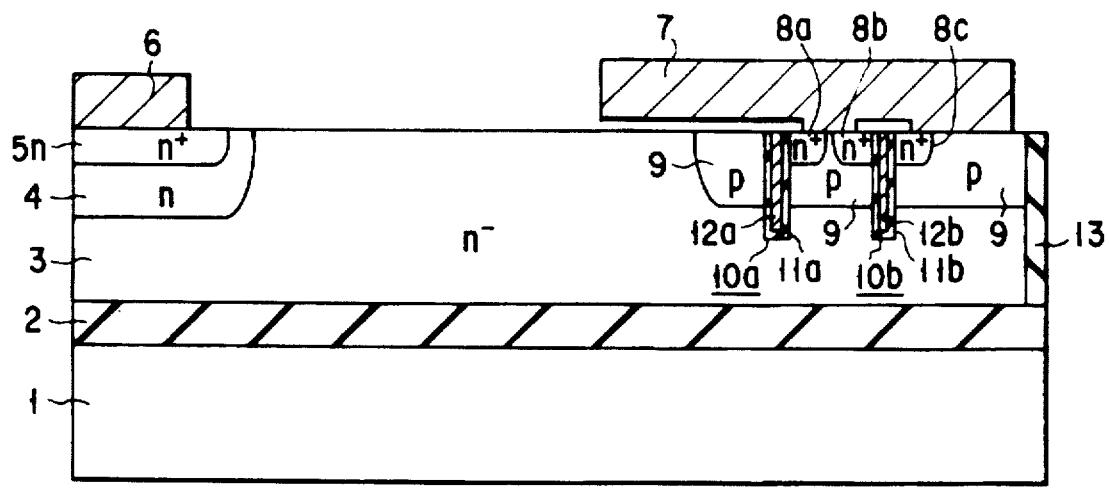
FIG. 64 is a cross-sectional view of the lateral-type power MOSFET, taken along line 64—64 in FIG. 63.

FIG. 63 is a plan view showing the device structure of a lateral-type power MOSFET according to a 30th embodiment of the present invention. FIG. 64 is a cross-sectional view of the lateral-type power MOSFET, taken along line 64—64 in FIG. 63.

The lateral-type power MOSFET of this embodiment is constructed such that the p-type drain layer 5 with a high impurity concentration in the lateral-type IGBT shown in FIG. 3 is replaced with an n-type drain layer 5n with a high impurity concentration.

In this embodiment, too, the turn-on characteristics and turn-off characteristics are improved by the same operational effect as in the first embodiment. According to this embodiment, there is provided a lateral-type power MOSFET having more excellent turn-on characteristics and turn-off characteristics than in the prior art.

Even if the p-type drain layer 5 of the lateral-type IGBT of each of the other embodiments is replaced with an n-type drain layer 5n with a high impurity concentration, a lateral-type power MOSFET with more excellent characteristics than in the prior art can be obtained.

Figure 65A:
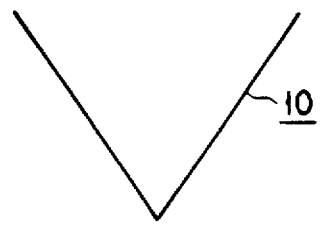
FIGS. 65A to 65D show cross-sectional shapes of the groove.
Figure 65B:
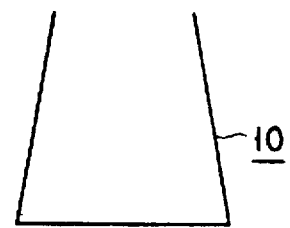
Figure 65C:
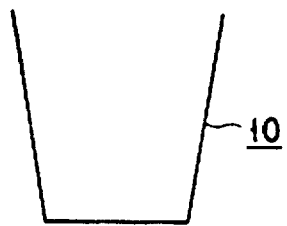
Figure 65D:
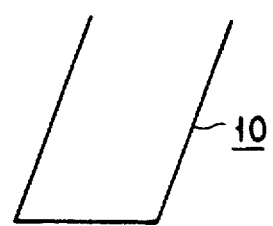

The present invention is not limited to the above embodiments. For example, in the above-described embodiments, the trench gate groove (dummy trench groove) has a rectangular cross-sectional shape. However, the groove may have a triangular cross-sectional shape (FIG. 65A), a forwardly tapered cross-sectional shape (FIG. 65B), a reversely tapered cross-sectional shape (FIG. 65C) or a parallelogrammatic cross-sectional shape (FIG. 65D).

In the above embodiments, the trench gate grooves (dummy trench grooves) have planar patterns which are mainly in parallel to the longitudinal direction of the p-type drain layer 4. However, the planar pattern of the groove may be inclined to the longitudinal direction of the p-type drain layer 4, as shown in FIG. 66A, or may be substantially in parallel to the longitudinal direction of the p-type drain layer 4, as shown in FIGS. 66B and 66C.

The pattern of FIG. 66B has already been described in connection with the 25th embodiment. In the case of the pattern shown in FIG. 66C, it is preferable to provide a dummy trench groove, like the embodiment of FIG. 55.

Figure 66A:
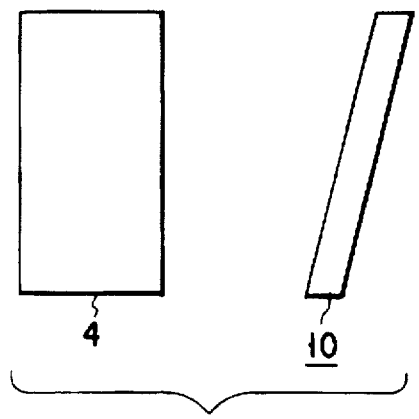
FIGS. 66A to 66C show planar patterns of the groove.
Figure 66B:
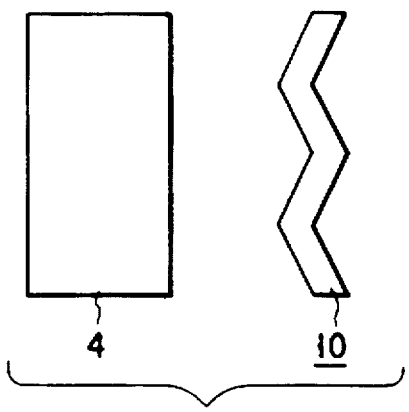
Figure 66C:
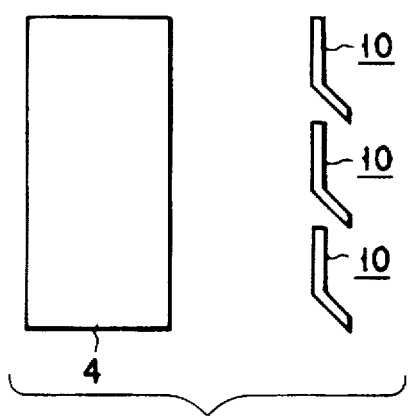

The shape of the entire groove may be a freely chosen combination of the cross-sectional shapes shown in FIGS. 65A to 65D and those in the preceding embodiments with the planar patterns shown in FIGS. 66A to 66C and those in the preceding embodiments. The number of grooves is not limited to the values mentioned in the preceding embodiments.

The channel-forming trench gate grooves and the dummy trench grooves may be designed differently or similarly.

Even if the polarity of each layer of the above embodiments is reversed, the same advantages can be obtained.

Various modifications may be made to the above embodiments without departing from the spirit of the present invention.

As has been described above in detail, the high breakdown voltage semiconductor devices with excellent turn-on characteristics can be obtained.

(31st Embodiment)

FIG. 67 is a plan view showing a lateral-type IGBT according to a 31st embodiment of the present invention.

Figure 70:
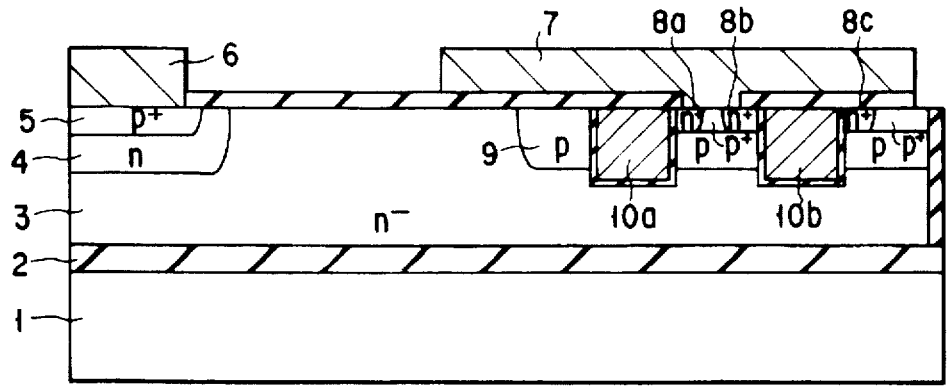
FIG. 70 is a cross-sectional view of the lateral-type IGBT, taken along line 70—70 in FIG. 67.

FIG. 68 is a cross-sectional view of the lateral-type IGBT, taken along line 68—68 in FIG. 67. FIG. 69 is a cross-sectional view of the lateral-type IGBT, taken along line 69—69 in FIG. 67. FIG. 70 is a cross-sectional view of the lateral-type IGBT, taken along line 70—70 in FIG. 67.

The lateral-type IGBT according to this embodiment differs from that of the first embodiment in that sub-trench grooves 10a' and 10b', extended from the main trench grooves 10a and 10b are provided. The sub-trench grooves 10a' and 10b' extend in parallel to, and are connected to, the main trench grooves 10a and 10b. Each of the sub-trench grooves 10a' and 10b' comprises a plurality of discontinuous parts. The distance between the main trench groove 10a, 10b and the sub-trench groove 10a', 10b' is preferably 4 μm or less, and more preferably 2 μm or less.

As is shown in FIG. 69, the portions 8d and 8e of the n-type region interposed between the main trench grooves 10a and 10b and the sub-trench groove 10a' and 10b' are electrically connected to source regions 8a and 8c in the portions where the sub-trench grooves 10a' and 10b' are separated. It is understood that the source regions 8a and 8c have an equal potential. Specifically, it is understood that channels are formed in the n-type regions 8d and 8e interposed between the main trench grooves 10a and 10b and sub-trench grooves 10a' and 10b'.

Since the n-type regions 8d and 8e have no contact with the source electrode 7, the distance between the trench grooves can be reduced accordingly. As the trench groove is closer to the drain region, the current density can be increased. More excellent turn-on voltage characteristics can be obtained in the case where the sub-trench grooves 10a' and 10b' are additionally provided than in the case where the main trench grooves 10a and 10b alone are provided.

(32nd Embodiment)

Figure 71:
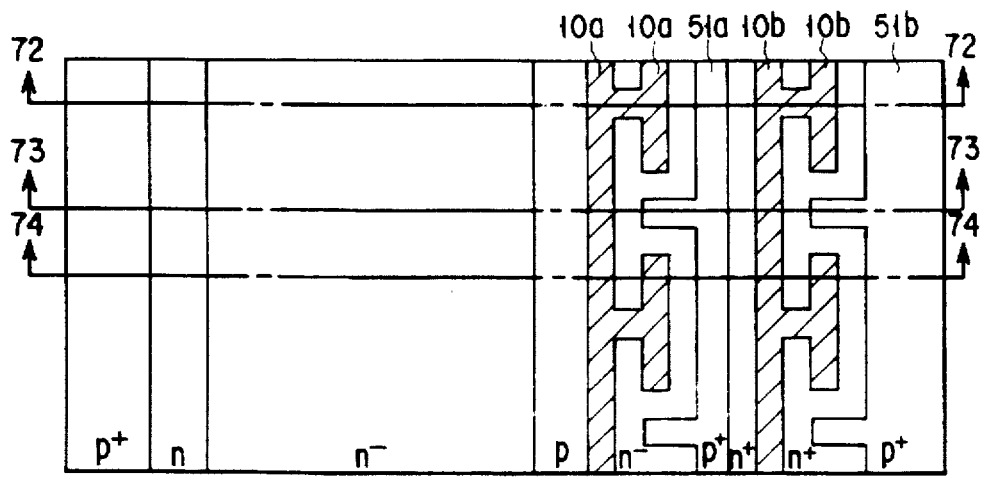
FIG. 71 is a plan view showing a lateral-type IGBT according to a 32nd embodiment of the present invention.
Figure 72:
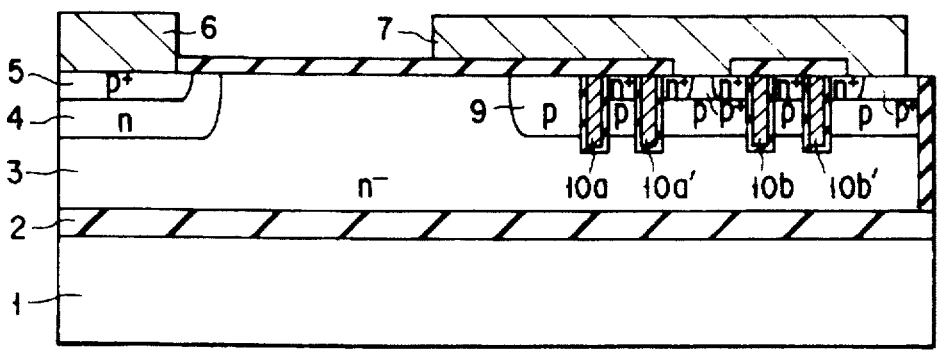
FIG. 72 is a cross-sectional view of the lateral-type IGBT, taken along line 72—72 in FIG. 71.
Figure 73:
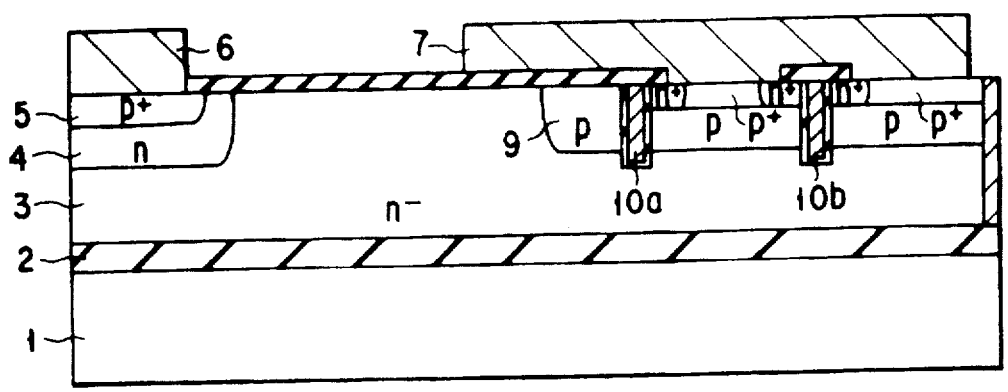
FIG. 73 is a cross-sectional view of the lateral-type IGBT, taken along line 73—73 in FIG. 71.
Figure 74:
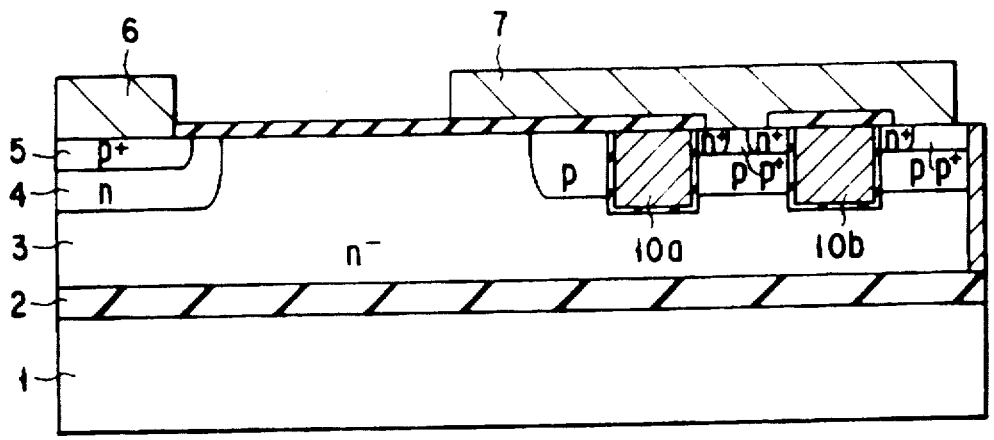
FIG. 74 is a cross-sectional view of the lateral-type IGBT, taken along line 74—74 in FIG. 71.

FIG. 71 is a plan view showing a lateral-type IGBT according to a 32nd embodiment of the present invention. FIG. 72 is a cross-sectional view of the lateral-type IGBT, taken along line 72—72 in FIG. 71. FIG. 73 is a cross-sectional view of the lateral-type IGBT, taken along line 73—73 in FIG. 71. FIG. 74 is a cross-sectional view of the lateral-type IGBT, taken along line 74—74 in FIG. 71.

This 32nd embodiment is a modification of the 31st embodiment. The lateral-type IGBT according to this embodiment differs from that of the 31st embodiment in that p$^+$ contact regions 101a and 101b are provided in regions where the sub-trench grooves 10a' and 10b' are separated. Thus, non-contact portions between the channel regions and source electrode are eliminated. Thereby, the anti-latch-up amount can be increased.

(33rd Embodiment)

Figure 75:
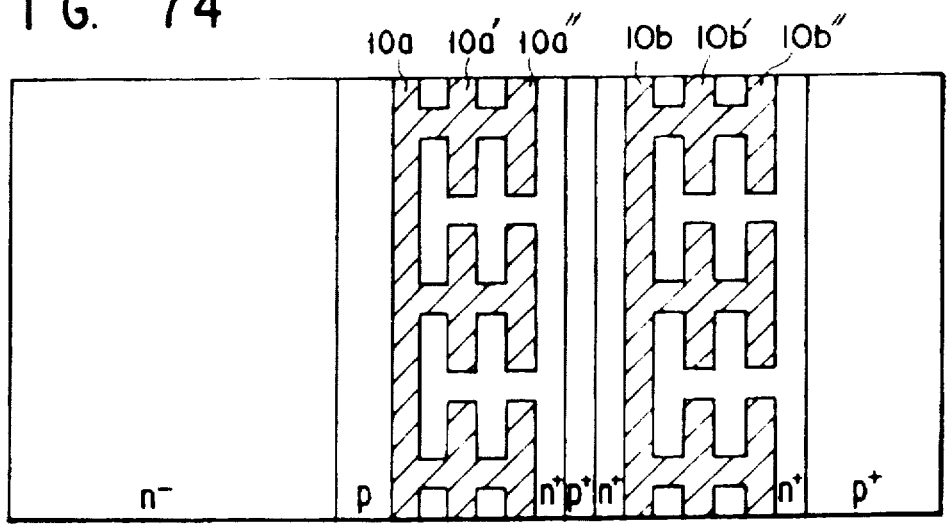
FIG. 75 is a plan view showing a lateral-type IGBT according to a 33rd embodiment of the present invention.

FIG. 75 is a plan view showing a lateral-type IGBT according to a 33rd embodiment of the present invention. This embodiment is a modification of the 31st embodiment. The lateral-type IGBT according to this embodiment differs from that of the 31st embodiment in that two sub-trench grooves are extended from each of the main trench grooves 10a and 10b. Specifically, the sub-trench grooves 10a', 10a", 10b' and 10b" are extended in parallel to, and connected to, the main trench grooves.

The channel density can be enhanced by increasing the number of sub-trench grooves having no contact with the source electrode 7, and the turn-on resistance can be further decreased.

(34th Embodiment)

FIG. 76 is a plan view showing a lateral-type IGBT according to a 34th embodiment of the present invention. FIG. 77 is a cross-sectional view of the lateral-type IGBT shown in FIG. 76. The lateral-type IGBT according to this embodiment differs from that of the first embodiment in that the time for diffusion for forming the p-type base layer 9 is reduced, thereby decreasing the length of diffusion of the p-type base layer 9.

By decreasing the length of diffusion of the p-type base layer 9, the length of the channel formed by the p-type base layer 9 and n$^+$ source layer can be reduced. As a result, the voltage drop in the channel portion can be reduced and the turn-on resistance of the entire device can be decreased, i.e. the current density can be increased.

Figures 78, 79A, 79B, 79C:
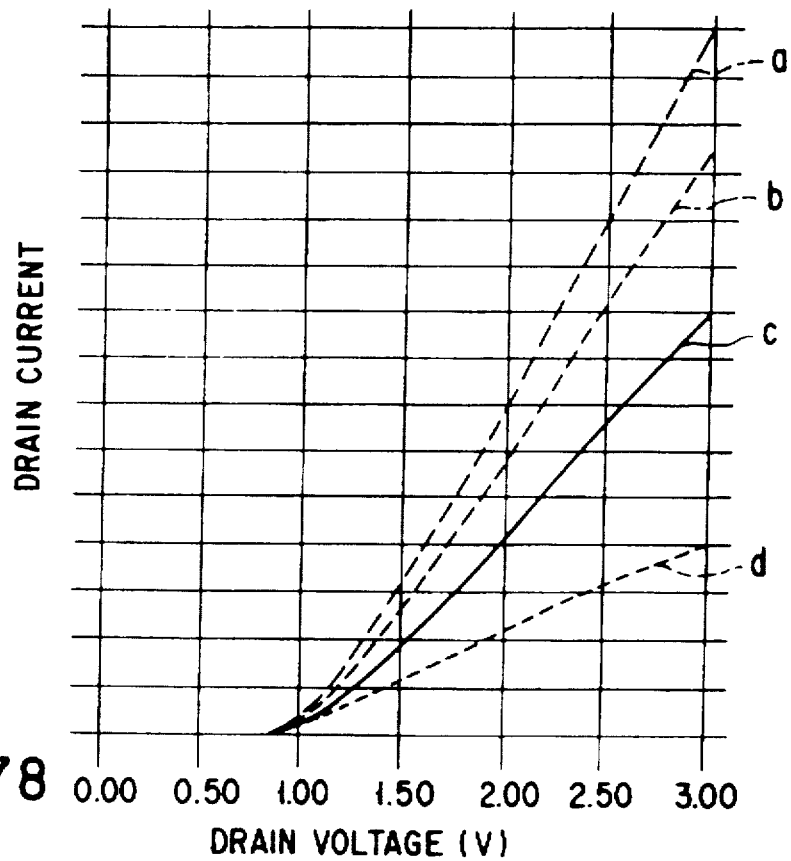
FIG. 78 is a graph showing current/voltage characteristics of IGBTs with various channel lengths.
FIGS. 79A to 79C illustrate the flow of a thermal step for a p-type base layer.

FIG. 78 is a graph showing current/voltage characteristics of IGBTs with various channel lengths at the time a gate voltage of 12 V was applied. In FIG. 78, a curve a indicates the characteristics of the IGBT of the present invention with the channel length of 0.5 μm, a curve b indicates the characteristics of the IGBT of the present invention with the channel length of 1.0 μm, a curve c indicates the characteristics of the IGBT of the present invention with the channel length of 3.0 μm, and a curve d indicates the characteristics of the conventional IGBT with the channel length of 3.0 μm. The IGBTs according to the present invention have the structure as shown in FIG. 3 or FIG. 76.

It is understood, from FIG. 78, that as the channel length decreases, the drain current increases and also the current density increases. Even if the channel length is equal, the IGBT of this invention has more excellent characteristics than the conventional IGBT.

FIGS. 79A to 79C illustrate the flow of a thermal step for the p-type base layer. In a regular step of manufacturing the IGBT, as illustrated in FIG. 79A, ion implantation for forming the p-type base layer is performed simultaneously with the formation of the n-type buffer layer, following which base diffusion is performed. By contrast, in the present embodiment, ion implantation for forming the p-type base layer is performed during the base diffusion, as illustrated in FIG. 79B, or the ion implantation for forming the p-type base layer is performed after the base diffusion, as illustrated in FIG. 79C.

By performing the ion implantation for forming the p-type base layer in this manner, only the length of diffusion of the p-type base layer can be reduced without changing the thermal step, i.e. without influencing the other diffusion layers.

(35th Embodiment)

FIG. 80 is a plan view showing a lateral-type IGBT according to a 35th embodiment of the present invention. FIG. 81 is a cross-sectional view of the lateral-type IGBT shown in FIG. 80. The lateral-type IGBT according to this embodiment differs from that of the first embodiment in that a depression is formed in a contact portion between the source electrode 7 and p$^+$ layers 101a and 101b and the source electrode 7 is buried in the depression.

With this structure, the source electrode can be made deeper, without modifying the channel region or the path for electrons. Thus, the anti-latch-up amount can be increased.

FIG. 82 shows a modification of the lateral-type IGBT shown in FIG. 81. In this modification, the depression in which the source electrode is buried is formed by LOCOS (Local Oxidation of Silicon). With this structure, the depression can be formed by a simpler process, while maintaining excellent latch-up characteristics.

Figure 83:
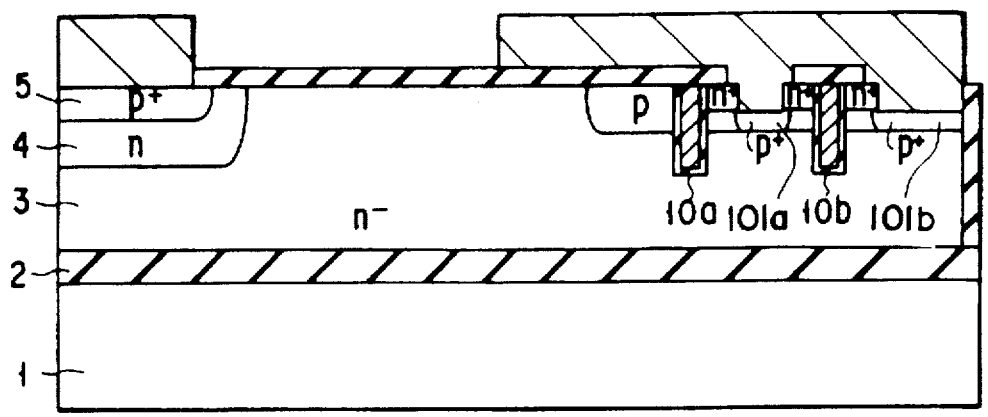
FIG. 83 is a cross-sectional view showing another modification of the lateral-type IGBT shown in FIG. 81.

FIG. 83 shows a modification of the lateral-type IGBT shown in FIG. 81. In this modification, a depression is formed in a contact portion between the source electrode 7 and p$^+$ layers 101a and 101b and the source electrode 7 is buried in the depression. In addition, the length of diffusion of the p-type base layer 9 is decreased, thereby reducing the channel length.

With this structure, the advantages of both the IGBT shown in FIG. 77 and the IGBT shown in FIG. 81 can be obtained, and an IGBT with a low turn-on resistance and a high anti-latch-up amount can be obtained.

(36th Embodiment)

Figure 84:
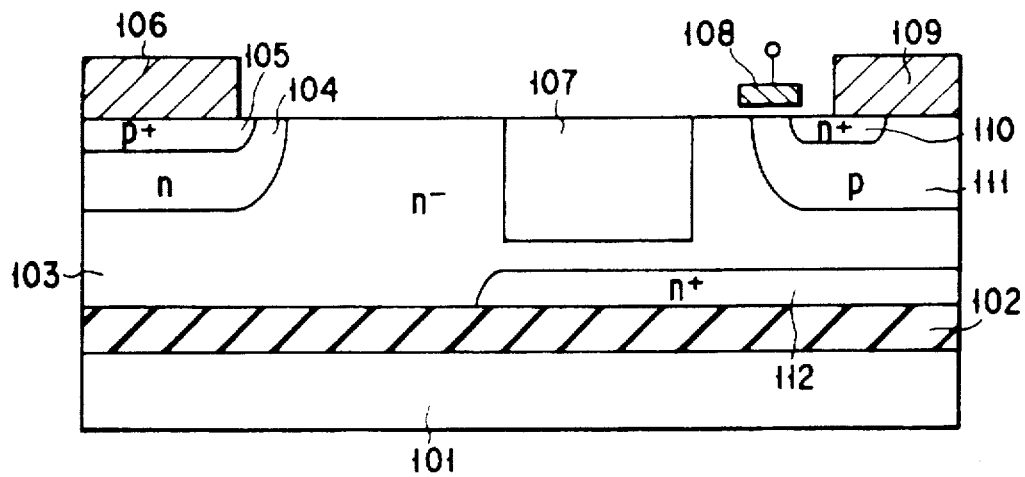
FIG. 84 is a cross-sectional view showing the device structure of a lateral-type IGBT according to a 36th embodiment of the present invention.

FIG. 84 is a cross-sectional view showing the device structure of a lateral-type IGBT according to a 36th embodiment of the present invention.

In FIG. 84, reference numeral 101 denotes a silicon substrate. A silicon oxide film 102 is formed on the silicon substrate 101 as an SOI insulating film. An n-type silicon active layer 103 with a low impurity concentration (high resistance) is provided on the silicon oxide film 102 as an SOI semiconductor layer. Specifically, the silicon oxide film 102 and n-type silicon active layer 103 constitute an SOI substrate.

It is preferable that the thickness of the silicon oxide film 102 be about 1 to 5 μm.

The thickness of the n-type silicon active layer 103 should preferably be 20 μm or less, and more preferably 10 μm or less. The impurity dose of the n-type silicon active layer 103 should preferably be $1.0 \times 10^{10}$ cm$^{-2}$ to $3.0 \times 10^{12}$ cm$^{-2}$, and more preferably 0.5 to $1.8 \times 10^{12}$ cm$^{-2}$.

A p-type base layer 111 is selectively formed in a surface portion of the n-type silicon active layer 103, and an n-type source layer 110 is selectively formed in a surface portion of the p-type base layer 111.

A gate electrode 108 is provided on the p-type base layer 111 sandwiched between the n-type source layer 110 and n-type silicon active layer 103, with a gate insulating film (not shown) about 60 nm thick interposed. In addition, a source electrode 109 is provided so as to come in contact with the n-type source layer 110 and p-type base layer 111.

An n-type buffer layer 104 is selectively formed in a surface portion of the n-type silicon active layer 103 at a predetermined distance from the p-type base layer 111. A p-type drain layer 105 provided with a drain electrode 106 and having a high impurity concentration (low resistance) is selectively formed in a surface portion of the n-type buffer layer 104.

A trench groove 107 is formed in the n-type silicon layer between the n-type buffer layer 104 and p-type base layer 111 from the surface of the n-type silicon layer. An n-type bypass layer 112 with a high impurity concentration (low resistance) is formed in the n-type silicon active layer 103 below the trench groove 107. The n-type bypass layer 112 is put in contact with the silicon oxide layer 102.

According to this embodiment, a hole current flowing into the source electrode 109 can be reduced by the trench groove 107 formed in the n-type silicon active layer 103. A polysilicon, etc. is buried in the trench groove.

Although the electron current is influenced by the trench groove 107, it can flow in the device through the low-resistance n-type bypass layer 112 below the trench groove 107. Thus, the reduction in electron current due to the trench groove 107 can be limited to a low degree.

Accordingly, the ratio of the electron current to the entire current increases and the accumulation of the source-side electron current increases. Thus, the turn-on voltage of the device can be decreased.

Figure 85:
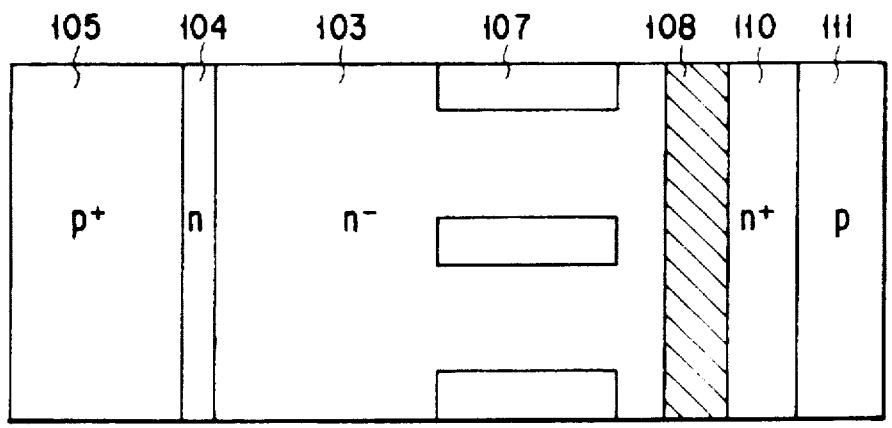
FIG. 85 is a plan view showing a trench groove pattern.

FIG. 85 is a plan view showing a pattern (trench groove pattern of the trench groove 107. Specifically, FIG. 85 shows a strip-like trench groove patterns. If this trench groove pattern is used, broadening of the depletion layer is not prevented at the time of application of reverse bias, a high breakdown voltage lateral-type IGBT can be achieved. In addition, if this trench groove pattern is used, a high breakdown voltage lateral-type IGBT can be obtained even in the case where the trench groove 107 reaches the n-type bypass layer 112.

FIG. 86 is a plan view showing another trench groove pattern. According to this pattern, a plurality of rectangular trench grooves 107 are formed such that the n-type silicon active layer 103 remains in each trench groove 107. With this trench groove pattern, the hole current flowing to the source electrode 109 can be effectively reduced and the turn-on voltage can be further reduced.

FIG. 87 is a plan view showing still another trench groove pattern. In this pattern, a rectangular trench groove 107 is formed over the entire surface of the n-type silicon active layer 103. This trench groove pattern can most effectively reduce the hole current of all the above-described trench groove patterns. In this case, however, in order to obtain a high breakdown voltage, it is necessary to thicken the n-type silicon active layer 103 between the trench groove 107 and n-type bypass layer 112.

(37th Embodiment)

FIG. 88 is a cross-sectional view showing the device structure of a lateral-type IGBT according to a 37th embodiment of the present invention. The lateral-type IGBT according to this embodiment differs from that of the first embodiment in that the size of the n-type bypass layer 112 is reduced. Specifically, the n-type bypass layer 112 is formed only in the region below the trench groove 107, and does not extend to a point below the p-type base layer 111. In this embodiment, too, the n-type bypass layer 112 is formed in a region where the n-type bypass layer 112 is needed (i.e. a region below the trench groove 107). Thus, the same advantage as in the above embodiments can be obtained.

(38th Embodiment)

Figure 89:
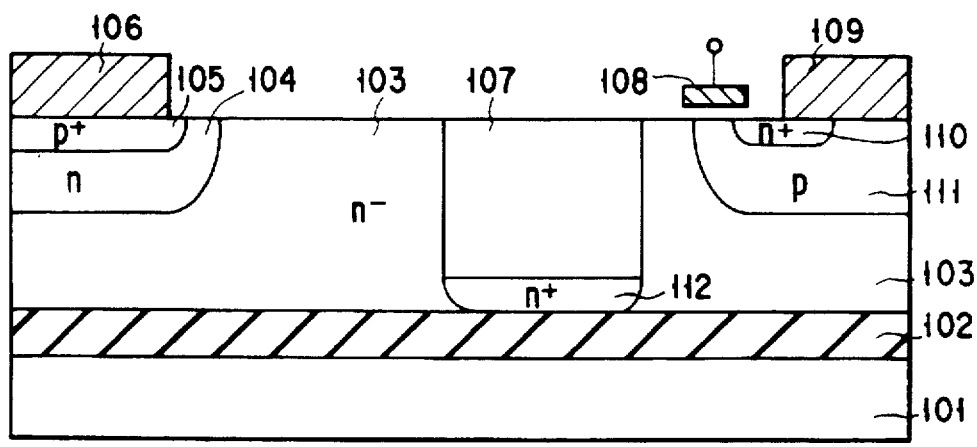
FIG. 89 is a cross-sectional view showing the device structure of a lateral-type IGBT according to a 38th embodiment of the present invention.

FIG. 89 is a cross-sectional view showing the device structure of a lateral-type IGBT according to a 38th embodiment of the present invention. The lateral-type IGBT according to this embodiment differs from that of the first embodiment in that the trench groove 107 reaches the n-type bypass layer 112. In this embodiment, too, the same advantage as in the 37th embodiment can be obtained.

Furthermore, in this embodiment, the n-type bypass layer 112 can be formed by ion-implanting n-type impurities after forming the trench groove 107. Thus, when the SOI substrate is formed by an attachment method, the alignment between the formation of the trench groove 107 from the upper surface of the n-type silicon active layer 103 and the formation of the n-type bypass layer 112 from the lower surface of the n-type silicon active layer 103 is not needed. Therefore, the process can be simplified.

(39th Embodiment)

Figure 90:
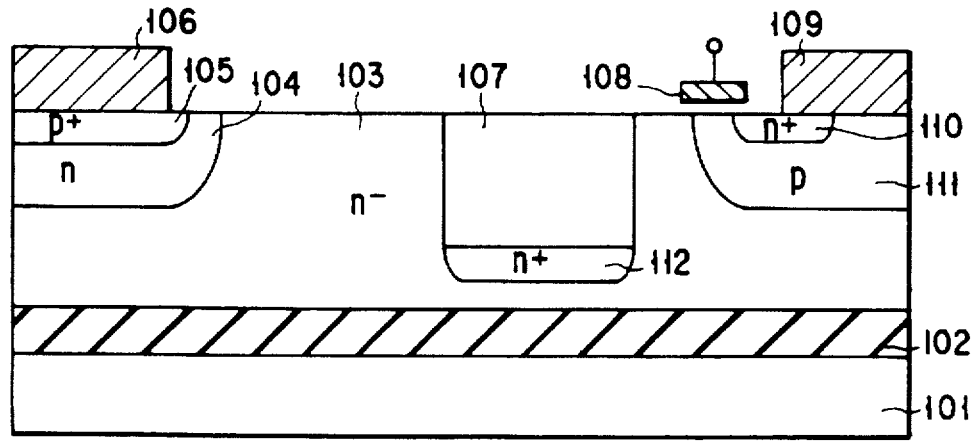
FIG. 90 is a cross-sectional view showing the device structure of a lateral-type IGBT according to a 39th embodiment of the present invention.

FIG. 90 is a cross-sectional view showing the device structure of a lateral-type IGBT according to a 39th embodiment of the present invention.

The lateral-type IGBT according to this embodiment differs from that of the 38th embodiment in that the n-type bypass layer 112 is separated from the silicon oxide film 102. In this embodiment, too, the same advantage as in the 38th embodiment can be obtained.

(40th Embodiment)

Figure 91:
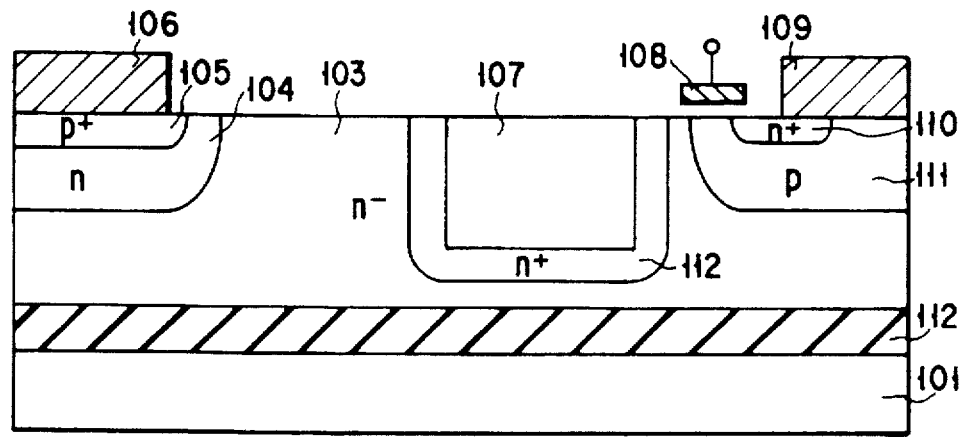
FIG. 91 is a cross-sectional view showing the device structure of a lateral-type IGBT according to a 40th embodiment of the present invention.

FIG. 91 is a cross-sectional view showing the device structure of a lateral-type IGBT according to a 40th embodiment of the present invention.

The lateral-type IGBT according to this embodiment differs from that of the 39th embodiment in that the n-type bypass layer 112 is formed not only on the bottom of the trench groove 107 but also on the sides of the trench groove 107. That is, the trench groove 107 is surrounded by the n-type bypass layer 112. According to this embodiment, electrons can reach the channel region with an effectively reduced resistance.

In the 37th to 40th embodiments, any one of the trench groove patterns shown in FIG. 85 to 87 may be used as the pattern of the trench groove 107.

(41st Embodiment)

Figure 92:
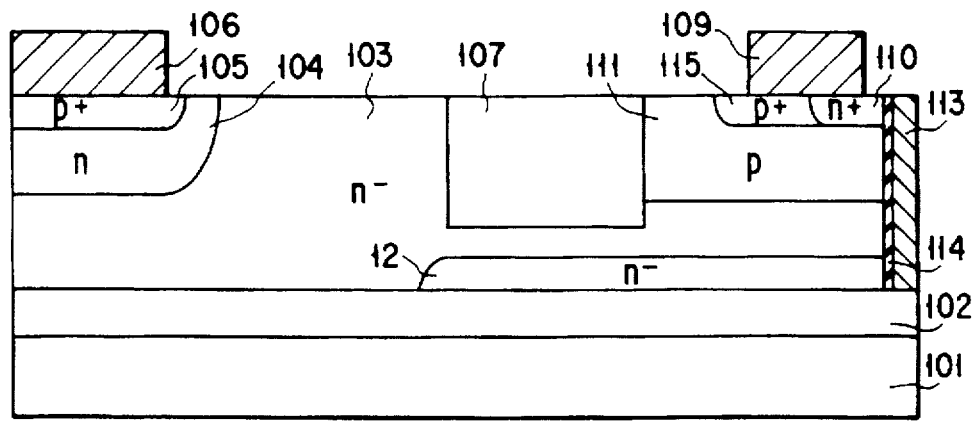
FIG. 92 is a cross-sectional view showing the device structure of a lateral-type IGBT according to a 41st embodiment of the present invention.

FIG. 92 is a cross-sectional view showing the device structure of a lateral-type IGBT according to a 41st embodiment of the present invention.

The lateral-type IGBT according to this embodiment differs from that of the 36th embodiment in that a trench gate is used.

Specifically, a trench groove reaching the silicon oxide film 102 is formed, and a gate insulating film 114 is formed on the side wall of the trench groove. Subsequently, a gate electrode 113 is buried in the trench groove.

In this case, a high-concentration p-type diffusion layer 115 is formed in a surface portion of the p-type base layer 111, which portion is located on the drain side of the n-type source layer 110. Thereby, a hole current flows into the source electrode 109 without passing below the n-type source layer 110. Thus, occurrence of latch-up of a parasitic thyristor can be prevented.

Figure 93:
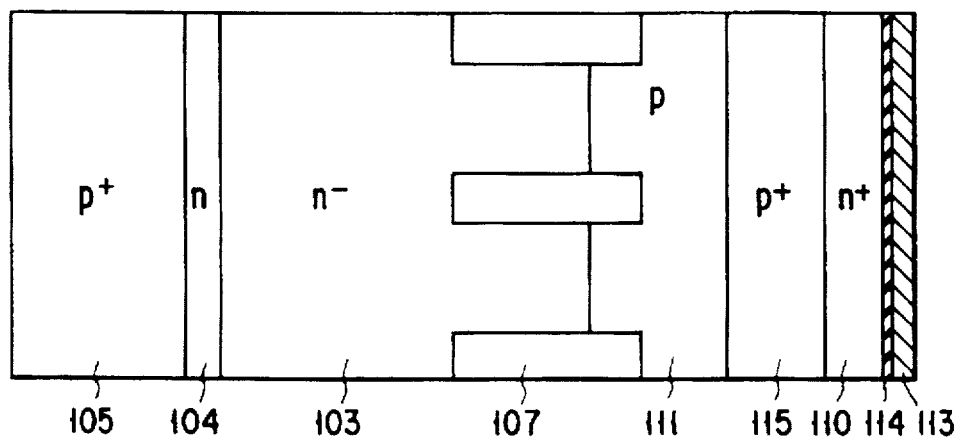
FIG. 93 is a plan view showing a trench groove pattern.
Figure 94:
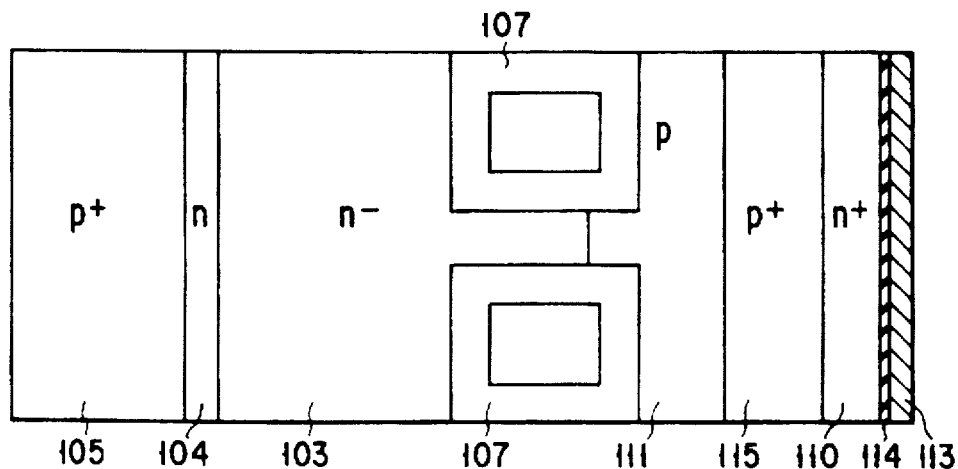
FIG. 94 is a plan view showing another trench groove pattern.

FIGS. 93 to 95 are plan views showing specific patterns of the trench groove in the lateral-type IGBT according to this embodiment. FIGS. 93 to 95 correspond to FIGS. 85 to 87, and the same advantages as with the trench groove patterns shown in FIGS. 85 to 87 can be obtained.

(42nd Embodiment)

FIG. 96 is a cross-sectional view showing the device structure of a lateral-type IGBT according to a 42nd embodiment of the present invention.

The lateral-type IGBT according to this embodiment differs from that of the 41st embodiment in that the size of the n-type bypass layer 112 is reduced. Specifically, the n-type bypass layer 112 is formed only in a region below the trench groove 107 and does not extend to a point below the p-type base layer 111. In this embodiment, too, the n-type bypass layer 112 is formed in a region where the n-type bypass layer 112 is needed (i.e. a region below the trench groove 107). Thus, the same advantage as in the 41st embodiment can be obtained.

(43rd Embodiment)

FIG. 97 is a cross-sectional view showing the device structure of a lateral-type IGBT according to a 43rd embodiment of the present invention.

The lateral-type IGBT according to this embodiment differs from that of the 42nd embodiment in that the trench groove 107 reaches the n-type bypass layer 112. In this embodiment, too, the same advantage as in the 42nd embodiment can be obtained.

Furthermore, in the present embodiment, like the lateral-type IGBT of the 38th embodiment, the alignment between the trench groove 107 and n-type bypass layer 112 is not needed. Therefore, the process can be simplified.

(44th Embodiment)

Figure 98:
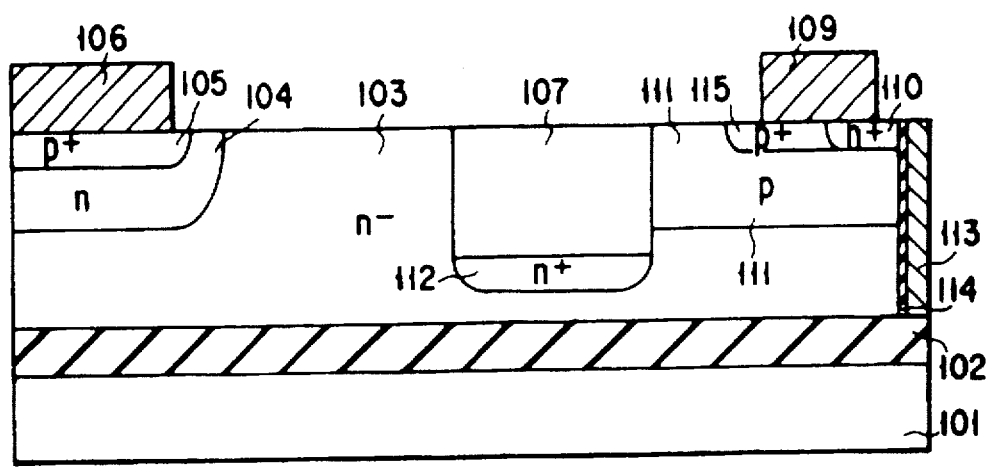
FIG. 98 is a cross-sectional view showing the device structure of a lateral-type IGBT according to a 44th embodiment of the present invention.

FIG. 98 is a cross-sectional view showing the device structure of a lateral-type IGBT according to a 44th embodiment of the present invention.

The lateral-type IGBT according to this embodiment differs from that of the 43rd embodiment in that the n-type bypass layer 112 is separated from the silicon oxide film 102. In this embodiment, too, the same advantage as in the 43rd embodiment can be obtained.

According to the 36th to 44th embodiments, the ratio, to the total current, of the carrier current of the second type having a polarity opposite to the polarity of the second conductivity type drain layer increases by the presence of the groove formed in the first conductivity type active layer and the first conductivity type bypass layer formed below the groove, and the source-side accumulation of the carrier current of the second type increases. Thus, the turn-on voltage of the device decreases.

(45th Embodiment)

Figure 99:
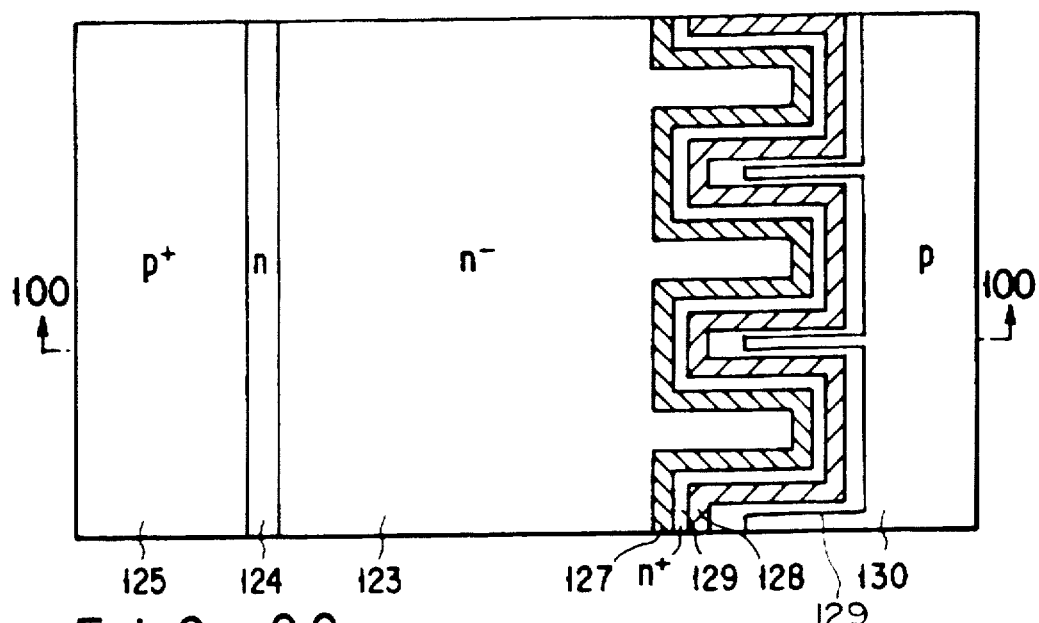
FIG. 99 is a cross-sectional view showing the device structure of a lateral-type IGBT according to a 45th embodiment of the present invention.
Figure 100:
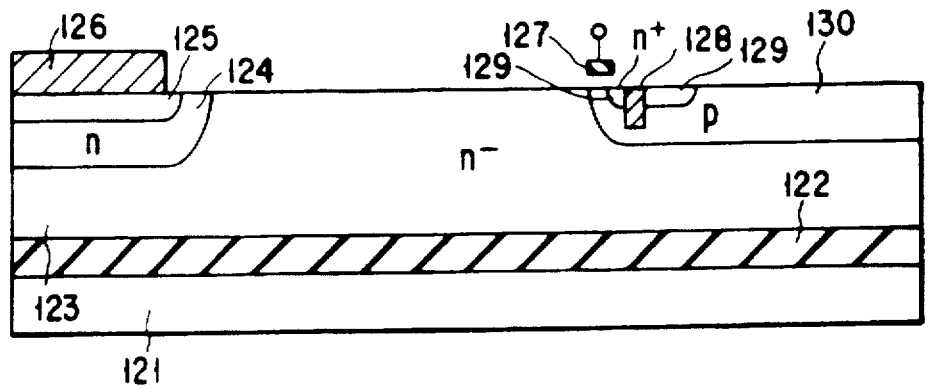
FIG. 100 is a cross-sectional view of the lateral-type IGBT, taken along line 100—100 in FIG. 99.

FIG. 99 is a cross-sectional view showing the device structure of a lateral-type IGBT according to a 45th embodiment of the present invention. FIG. 100 is a cross-sectional view of the lateral-type IGBT, taken along line 100—100 in FIG. 99.

In FIG. 100, reference numeral 121 denotes a silicon substrate. A high-concentration (low resistance) n-type silicon active layer 123 functioning as an SOI semiconductor layer is provided on the silicon substrate 121 with a silicon oxide film 122 functioning as an SOI insulating film interposed.

It is preferable that the silicon oxide film 122 is about 1 to 5 μm thick.

The thickness of the n-type silicon active layer 123 should preferably be 20 μm or less, and more preferably 10 μm or less. The impurity dose of the n-type silicon active layer 123 should preferably be $1.0 \times 10^{10}$ cm$^{-2}$ to $2.0 \times 10^{12}$ cm$^{-2}$, and more preferably 0.5 to $1.8 \times 10^{12}$ cm$^{-2}$.

A p-type base layer 130 is selectively formed in a surface portion of the n-type silicon active layer 123, and an n-type source layer 129 is selectively formed in a surface portion of the p-type base layer 130.

The p-type base layer 130 is formed, for example, by ion implantation of boron. By controlling the time of diffusion and the dosage, the diffusion of boron in the horizontal direction is curbed and the p-type base layer is made shallow. The n-type source layer 129 is formed by ion implantation of an element which is difficult to diffuse in the horizontal direction, for example, arsenic.

As a result, there is provided a channel region where the length (channel length) of the p-type base layer 130 between the n-type silicon active layer 123 and the n-type source layer 129 is less than a normal value (about 3 μm).

A comb-shaped gate electrode 127 is provided on the on the p-type base layer 130 in the aforementioned channel region, with a gate insulating film (not shown) about 60 nm thick interposed.

A source electrode 128 is buried from the surface of the n-type source layer 129 so as to reach an internal point within the p-type base layer 130. The source electrode 128 is patterned to engage the comb-shaped gate electrode 127.

An n-type buffer layer 124 is selectively formed in a surface portion of the n-type silicon active layer 123 at a predetermined distance from the p-type base layer 130. A p-type drain layer 125 provided with a drain electrode 126 and having a high impurity concentration (low resistance) is selectively formed in a surface portion of the n-type buffer layer 124.

According to this embodiment, since the gate electrode 127 and source electrode 128 have intermeshing comb-like shapes, the area of the channel region per unit area of the surface of the p-type base layer can be made greater than in the case where the gate electrode and source electrode are formed in stripe shape. Thus, the turn-on voltage can be decreased.

According to this embodiment, since the channel length is small, the voltage drop in the channel region decreases and the current density of the IGBT increases.

In general, as the channel length decreases, the voltage drop decreases and the current density increases. According to the study by the inventor, it was found that the increase in current density in the lateral-type IGBT was normally greater than was expected.

FIG. 101 is a graph showing the channel length dependency of current/voltage characteristics of the IGBT. The graph of FIG. 101 represents the above finding by the inventor.

In FIG. 101, a curve a indicates current/voltage characteristics of the IGBT with the conventional normal channel length. A curve b indicates current/voltage characteristics of the IGBT with a channel length 33% of than the normal channel length. A curve c indicates current/voltage characteristics with a channel length 47% of the normal channel length.

It is understood, from FIG. 101, that the current/voltage characteristics are greatly improved and the current density is remarkably increased by decreasing the channel length.

Figure 102:
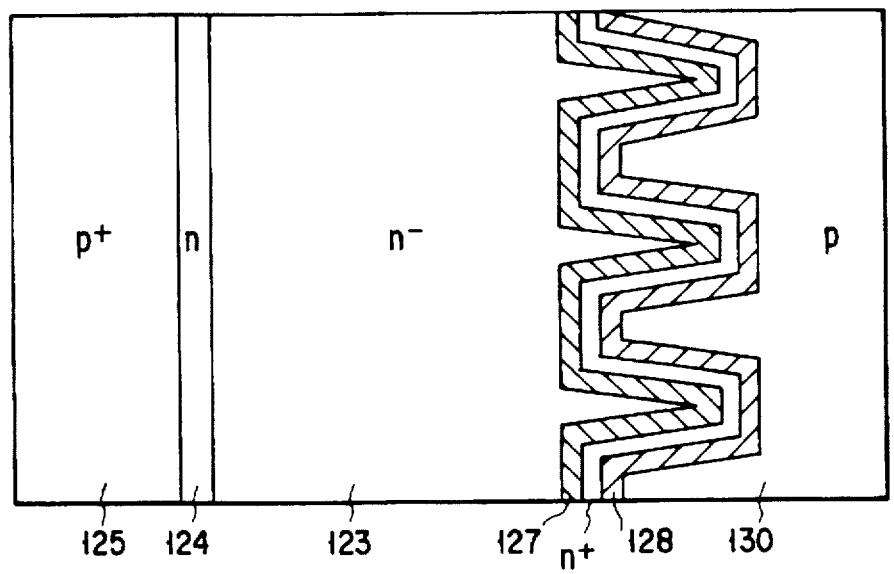
FIG. 102 is a plan view showing patterns of the gate electrode and source electrode.
Figure 103:
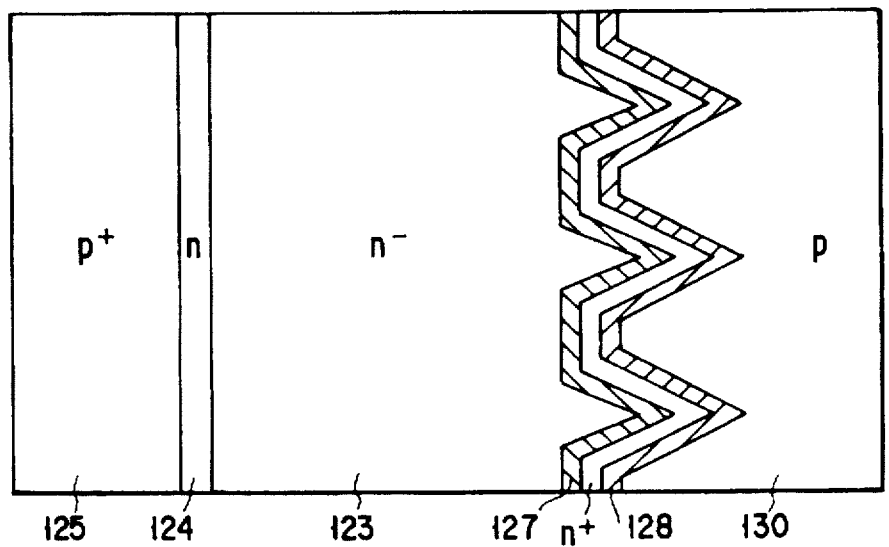
FIG. 103 is a plan view showing other patterns of the gate electrode and source electrode.

FIGS. 102 and 103 are plan views showing other patterns of the gate electrode 127 and source electrode 128.

In FIG. 102, the tooth-like portion of the gate electrode 127 is triangular, and the tooth-like portion of the source electrode 128 is trapezoidal.

In FIG. 103, the tooth-like portions of both the gate electrode 127 and source electrode 128 are triangular.

(46th Embodiment)

Figure 104:
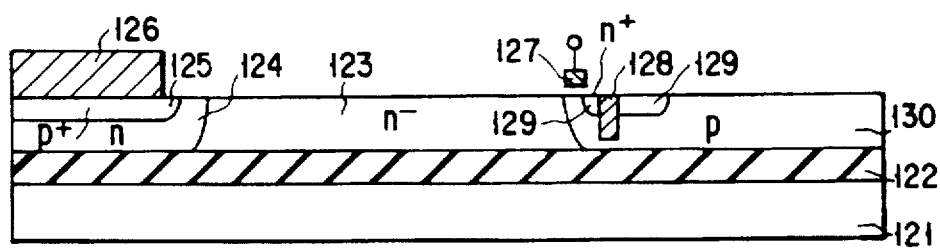
FIG. 104 is a cross-sectional view showing the device structure of a lateral-type IGBT according to a 46th embodiment of the present invention.

FIG. 104 is a cross-sectional view showing the device structure of a lateral-type IGBT according to a 46th embodiment of the present invention.

The lateral-type IGBT according to this embodiment differs from that of the 45th embodiment in that the n-type silicon active layer 123 is thin and the n-type buffer layer 124 and p-type base layer 130 reach the silicon oxide film 122. In this embodiment, too, the same advantage as in the 45th embodiment can be obtained. The pattern of the gate electrode 127 and source electrode 128 may be any one of the patterns shown in FIGS. 99, 102 and 103.

(47th Embodiment)

FIG. 105 is a cross-sectional view showing the device structure of a lateral-type IGBT according to a 47th embodiment of the present invention.

The lateral-type IGBT according to this embodiment differs from that of the 45th embodiment in that the source electrode 128 is not buried. However, since the channel length is small, the current density is high, like the 45th embodiment.

In this embodiment, the gate electrode 127 is extended to the region of the n-type silicon active layer 123 with an insulating film (not shown) interposed. Thereby, the gate electrode 127 can be provided with a function of a field plate and the breakdown voltage can be improved.

(48th Embodiment)

FIG. 106 is a cross-sectional view showing the device structure of a lateral-type IGBT according to a 48th embodiment of the present invention.

The lateral-type IGBT according to this embodiment differs from that of the 47th embodiment in that the distance between the gate electrode 127 and source electrode 128 is decreased. Thereby, the horizontal length of the n-type source layer 129 decreases and the latch-up current can be increased.

(49th Embodiment)

FIG. 107 is a cross-sectional view showing the device structure of a lateral-type IGBT according to a 49th embodiment of the present invention.

The lateral-type IGBT according to this embodiment differs from that of the 47th embodiment in that the horizontal length of the n-type source layer 129 is extremely reduced. In this case, the contact area between the n-type source layer 129 and source electrode 128 decreases and failure of contact may occur. Thus, as shown in FIG. 107, horizontally extending portions 129a for contact with the source electrode 128 are provided at predetermined intervals.

(50th Embodiment)

Figure 108:
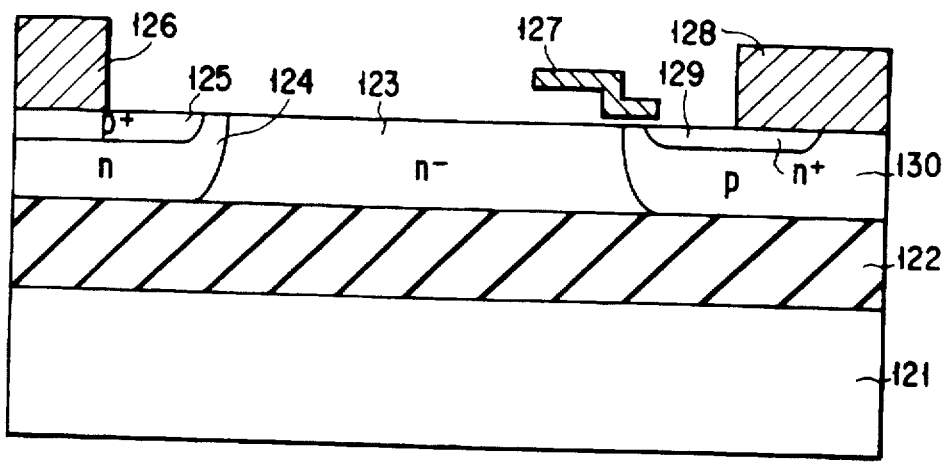
FIG. 108 is a cross-sectional view showing the device structure of a lateral-type IGBT according to a 50th embodiment of the present invention.

FIG. 108 is a cross-sectional view showing the device structure of a lateral-type IGBT according to a 50th embodiment of the present invention.

The lateral-type IGBT according to this embodiment differs from that of the 47th embodiment in that the n-type silicon active layer 123 is thin and the n-type buffer layer 124 and p-type base layer 130 reach the silicon oxide film 122. In this embodiment, too, the same advantage as in the 47th embodiment can be obtained.

(51st Embodiment)

Figure 109:
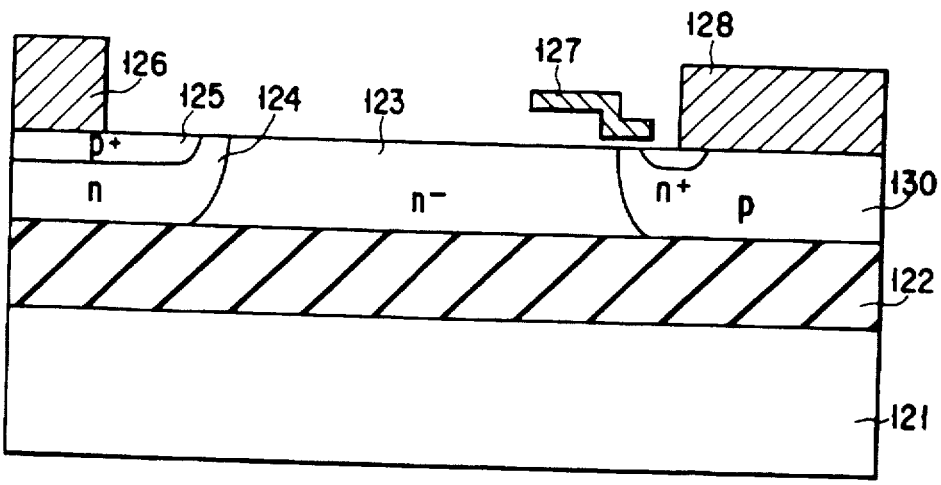
FIG. 109 is a cross-sectional view showing the device structure of a lateral-type IGBT according to a 51st embodiment of the present invention.

FIG. 109 is a cross-sectional view showing the device structure of a lateral-type IGBT according to a 51st embodiment of the present invention.

The lateral-type IGBT according to this embodiment differs from that of the 48th embodiment in that the n-type silicon active layer 123 is thin and the n-type buffer layer 124 and p-type base layer 130 reach the silicon oxide film 122. In this embodiment, too, the same advantage as in the 48th embodiment can be obtained.

In the lateral-type IGBTs of the 45th to 51st embodiments, the comb-shaped source electrode is buried. However, the same advantage can be obtained even if the source electrode is formed on the n-type source layer and p-type base layer.

In the lateral-type IGBTs of the 45th to 46th embodiments, the gate electrode and source electrode are formed in intermeshing comb-like shapes. Thus, the area of the channel region per unit area of the surface of the second conductivity type base layer below the gate electrode can be increased. Thus, the turn-on voltage can be decreased.

Figure 110:
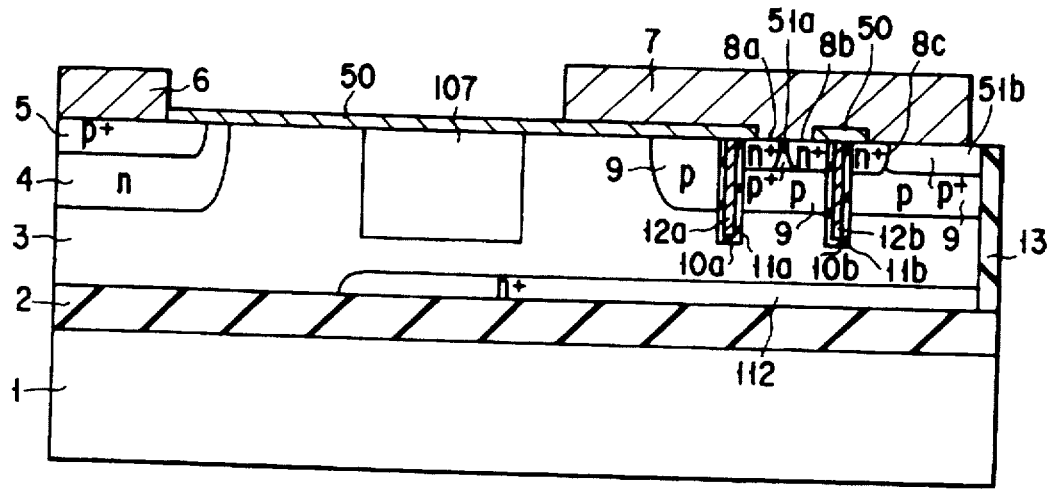
FIG. 110 is a cross-sectional view showing an example in which the IGBT according to the first embodiment is combined with the groove formed in the first conductivity type active layer and the first conductivity type bypass layer under the groove in the 36th embodiment.

FIG. 110 is a cross-sectional view showing an example in which the IGBT according to the first embodiment is combined with the groove formed below the first conductivity type active layer and the first conductivity type bypass layer below the groove in the 36th embodiment. With this structure, the device having the advantages of both the first and 36th embodiments can be obtained.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A high breakdown voltage semiconductor device comprising:

a semiconductor substrate;

an insulating film formed on said semiconductor substrate;

a first conductivity type active region formed on said insulating film;

a drain region formed in a surface portion of said active region;

a second conductivity type base region formed in a surface portion of said active region at a distance from said drain region;

first conductivity type first and second source regions formed in a surface portion of said base region;

a first gate insulating film formed on an inner surface of a first groove penetrating said base region so as to come in contact with said first source region and reaching said active region;

a first gate electrode buried in said first groove, on the inner surface of which said first gate insulating film is formed;

a second gate insulating film formed on an inner surface of a second groove penetrating said base region so as to come in contact with said second source region in a position located apart from said first groove and reaching said active region;

a second gate electrode buried in said second groove, on the inner surface of which said second gate insulating film is formed;

a source electrode put in electrical contact with said first and second source regions and said base region; and a drain electrode put in electrical contact with said drain region, wherein two or more channel regions are formed in a MOS structure constructed by said first and second gate insulating films, said first and second gate electrodes, said first and second source regions, said base region and said active region, and a conditional formula $(1 \times d/w > 3.45 \times 10^{-6}$ cm, is satisfied, where 1 is a distance between a bottom portion of one of the first and second grooves and a bottom portion of said active region w is the distance between said grooves, and d is a depth of a portion of said one of the grooves which is in contact with said active region.

2. The high breakdown voltage semiconductor device according to claim 1, wherein said first and second grooves extend substantially in parallel to said drain region.

3. The high breakdown voltage semiconductor device according to claim 1, wherein said first and second grooves are connected in a lattice shape.

4. The high breakdown voltage semiconductor device according to claim 1, wherein at least one of said first and second grooves is formed in a zigzag shape.

5. The high breakdown voltage semiconductor device according to claim 1, wherein each of said first and second grooves comprises a plurality of short grooves arranged diagonal to a direction in which said drain region extends.

6. The high breakdown voltage semiconductor device according to claim 1, wherein said first groove is situated on the drain region side, and said first source region is not present on the drain region side of said first groove.

7. The high breakdown voltage semiconductor device according to claim 1, wherein a face orientation of side walls of said first and second grooves are substantially {100}.

8. The high breakdown voltage semiconductor device according to claim 1, wherein said first groove is situated on the drain region side, one channel region is formed in the base region on a side opposite to the drain region side of said first groove, and two channel regions are formed in the base region around said second groove.

9. The high breakdown voltage semiconductor device according to claim 1, wherein said drain region is of the second conductivity type.

10. The high breakdown voltage semiconductor device according to claim 1, wherein said drain region is of the first conductivity type.

11. The high breakdown voltage semiconductor device according to claim 1, wherein a dummy groove in which an insulating film is buried is formed on the drain region side of one of said first and second grooves.

12. The high breakdown voltage semiconductor device according to claim 1, wherein said first and second grooves have a plurality of separately divided sub-grooves to which said first and second grooves are connected, sub-gate insulating films are formed on inner surfaces of said sub-grooves, and sub-gate electrodes are buried in said sub-grooves.

13. The high breakdown voltage semiconductor device according to claim 1, wherein a depression is formed in a surface portion of said base region, and said source electrode is buried in said depression.

14. The high breakdown voltage semiconductor device according to claim 1, wherein a depression in which one of an insulator and a semiconductor is buried is formed in said active region between said base region and said drain region, and a bypass region of the first conductivity type is formed below said depression.

15. The high breakdown voltage semiconductor device according to claim 1, further comprising a first conductivity type buffer region formed in a surface portion of said active region, said drain region being formed in a surface portion of said buffer region.

16. A semiconductor device comprising:

a semiconductor substrate;

an insulating film formed on said semiconductor substrate;

a first conductivity type active region formed on said insulating film;

a second conductivity type drain region formed in a surface portion of said active region;

a second conductivity type base region formed in a surface portion of said active region at a distance from said drain region;

a first conductivity type source region formed in a surface portion of said base region;

a gate insulating film formed on said base region between said source region and said active region;

a gate electrode formed on said gate insulating film;

a carrier blocking region for blocking first carriers formed by burying one of an insulator and a semiconductor in a groove formed in said active region between said drain region and said base region; and a first conductivity type bypass region, formed in said active region below said carrier blocking region, for passing second carriers.

17. The semiconductor device according to claim 16, wherein said carrier blocking region is put in contact with said bypass region.

18. The semiconductor device according to claim 16, wherein said bypass region covers a side face and a bottom portion of said carrier blocking region.

19. The semiconductor device according to claim 16, wherein said semiconductor device is a lateral-type insulated gate bipolar transistor.

20. A high breakdown voltage semiconductor device comprising:

a semiconductor substrate;

an insulating film formed on said semiconductor substrate;

a first conductivity type active region formed on said insulating film;

a drain region formed in a surface portion of said active region;

a second conductivity type base region formed in a surface portion of said active region at a distance from said drain region and constituted by a plurality of portions;

first conductivity type first and second source regions formed in a surface portion of said base region;

a first gate insulating film formed on an inner surface of a first groove being in contact with said base region and said first source region and reaching said active region;

a first gate electrode buried in said first groove, on the inner surface of which said first gate insulating film is formed;

a second gate insulating film formed on an inner surface of a second groove being in contact with said base region and said second source region in a position located apart from said first groove and reaching said active region;

a second gate electrode buried in said second groove, on the inner surface of which said second gate insulating film is formed;

a source electrode put in electrical contact with said first and second source regions and said base region; and a drain electrode put in electrical contact with said drain region, wherein two or more channel regions are formed in a MOS structure constructed by said first and second gate insulating films, said first and second gate electrodes, said first and second source regions, said base region and said active region, and a conditional formula, $(1 \times d/w) > 3.45 \times 10^{-6}$ cm, is satisfied, wherein 1 is a distance between a bottom portion of one of the first and second grooves and a bottom portion of said active region, w is a distance between said grooves, and d is a depth of a portion of said one of the grooves which is in contact with said active region.

21. The high breakdown voltage semiconductor device according to claim 20, further comprising a first conductivity type buffer region formed in a surface portion of said active region, said drain region being formed in a surface portion of said buffer region.

22. The high breakdown voltage semiconductor device according to claim 20, wherein w is a distance between a contact portion of the first gate insulating film with the base region and a contact portion of the second gate insulating film with the base region.

23. A high breakdown voltage semiconductor device comprising:

a semiconductor substrate;

an insulating film formed on said semiconductor substrate;

a first conductivity type active region formed on said insulating film;

a drain region formed in a surface portion of said active region;

a second conductivity type base region formed in a surface portion of said active region at a distance from said drain region and constituted by a plurality of portions;

first conductivity type first and second source regions formed in a surface portion of said base region;

a first gate insulating film formed on an inner surface of a first groove being in contact with said base region and said first source region and reaching said active region;

a first gate electrode buried in said first groove, on the inner surface of which said first gate insulating film is formed;

a second gate insulating film formed on an inner surface of a second groove being in contact with said base region and said second source region in a position located apart from said first groove and reaching said active region;

a second gate electrode buried in said second groove, on the inner surface of which said second gate insulating film is formed;

a source electrode put in electrical contact with said first and second source regions and said base region; and a drain electrode put in electrical contact with said drain region, wherein two or more channel regions are formed in a MOS structure constructed by said first and second gate insulating films, said first and second gate electrodes, said first and second source regions, said base region and said active region, each of said portions of the base region being isolated from each other by said first and second grooves, and a conditional formula $(1 \times d/w) > 3.45 \times 10^{-6}$ cm, is satisfied, where 1 is a distance between a bottom portion of one of the first and second grooves and a bottom portion of said active region, w is the distance between said grooves, and d is a depth of a portion of said one of the grooves which is in contact with said active region.

24. The high breakdown voltage semiconductor device according to claim 23, further comprising a first conductivity type buffer region formed in a surface portion of said active region, said drain region being formed in a surface portion of said buffer region.

25. The high breakdown voltage semiconductor device according to claim 23, wherein w is a distance between a contact portion of the first gate insulating film with the base region and a contact portion of the second gate insulating film with the base region.

* * * * *